United States Patent
Tanabe et al.

(10) Patent No.: US 11,069,707 B2
(45) Date of Patent: Jul. 20, 2021

(54) VARIABLE DIE SIZE MEMORY DEVICE AND METHODS OF MANUFACTURING THE SAME

(71) Applicant: SANDISK TECHNOLOGIES LLC, Addison, TX (US)

(72) Inventors: Tomoka Tanabe, Yokkaichi (JP); Hiroyuki Ogawa, Nagoya (JP); Kiyokazu Shishido, Yokkaichi (JP); Takahito Fujita, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/666,522

(22) Filed: Oct. 29, 2019

(65) Prior Publication Data
US 2021/0126008 A1 Apr. 29, 2021

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/02164* (2013.01); *H01L 21/31111* (2013.01); *H01L 21/76802* (2013.01); *H01L 21/76877* (2013.01); *H01L 21/82* (2013.01); *H01L 23/528* (2013.01); *H01L 23/5226* (2013.01); *H01L 24/05* (2013.01); *H01L 25/18* (2013.01); *H01L 25/50* (2013.01); *H01L 27/11519* (2013.01); *H01L 27/11556* (2013.01); *H01L 27/11565* (2013.01); *H01L 29/7883* (2013.01);
(Continued)

(58) Field of Classification Search
None
See application file for complete search history.

(56) References Cited

U.S. PATENT DOCUMENTS 10,115,681 B1 10/2018 Ariyoshi
10,283,493 B1 5/2019 Nishida
(Continued)

FOREIGN PATENT DOCUMENTS

JP 2010-074106 A 4/2010

OTHER PUBLICATIONS

Notification of Transmittal of the International Search Report and Written Opinion of the International Search Authority for International Patent Application No. PCT/US2020/024103, dated Jul. 28, 2020, 10 pages.
(Continued)

*Primary Examiner* — Hsien Ming Lee
(74) *Attorney, Agent, or Firm* — The Marbury Law Group PLLC

(57) ABSTRACT

A semiconductor die includes alternating stacks of insulating layers and electrically conductive layers that are laterally separated from each other by first backside trenches that laterally extend along a first horizontal direction, an array of memory stack structures vertically extending through the alternating sacks, an inner edge seal structure that continuously laterally surrounds the alternating stacks, an outer edge seal structure that continuously laterally surrounds the inner edge seal structure, and additional alternating stacks of insulating layers and electrically conductive layers located between the inner edge seal structure and the outer edge seal structure.

15 Claims, 54 Drawing Sheets

(51) Int. Cl.

| | | |
|---|---|---|
| H01L 23/528 | (2006.01) | |
| H01L 23/522 | (2006.01) | |
| H01L 29/788 | (2006.01) | |
| H01L 23/00 | (2006.01) | |
| H01L 25/18 | (2006.01) | |
| H01L 21/02 | (2006.01) | |
| H01L 25/00 | (2006.01) | |
| H01L 21/768 | (2006.01) | |
| H01L 27/11519 | (2017.01) | |
| H01L 27/11565 | (2017.01) | |
| H01L 21/311 | (2006.01) | |
| H01L 21/82 | (2006.01) | |

(52) U.S. Cl.
CPC .. *H01L 21/02208* (2013.01); *H01L 21/02271* (2013.01); *H01L 2224/0557* (2013.01); *H01L 2924/1431* (2013.01); *H01L 2924/14511* (2013.01)

(56) References Cited

U.S. PATENT DOCUMENTS

| | | | |
|---|---|---|---|
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 10,665,607 | B1 * | 5/2020 | Sugiura ............ H01L 27/10844 |
| 2005/0098893 | A1 | 5/2005 | Tsutsue et al. |
| 2010/0078769 | A1 | 4/2010 | West et al. |
| 2012/0112322 | A1 | 5/2012 | Lin et al. |
| 2014/0035106 | A1 | 2/2014 | Vu et al. |
| 2017/0092654 | A1 * | 3/2017 | Nishikawa ........ H01L 29/66545 |
| 2019/0221557 | A1 | 7/2019 | Kim et al. |
| 2019/0252361 | A1 | 8/2019 | Nishida |

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 16/660,177, filed Oct. 22, 2019, SanDisk Technologies LLC.
U.S. Appl. No. 16/589,404, filed Oct. 1, 2019, SanDisk Technologies LLC.
U.S. Appl. No. 16/552,089, filed Aug. 27, 2019, SanDisk Technologies LLC.
U.S. Appl. No. 16/523,029, filed Jul. 26, 2019, SanDisk Technologies LLC.
U.S. Appl. No. 16/521,849, filed Jul. 25, 2019, SanDisk Technologies LLC.
U.S. Appl. No. 16/440,183, filed Jun. 13, 2019, SanDisk Technologies LLC.
U.S. Appl. No. 16/409,593, filed May 10, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/417,913, filed May 21, 2019, SanDisk Technologies LLC.
U.S. Appl. No. 16/372,908, filed Apr. 2, 2019, SanDisk Technologies LLC.
U.S. Appl. No. 16/295,292, filed Mar. 7, 2019, SanDisk Technologies LLC.
U.S. Appl. No. 16/288,656, filed Feb. 28, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/269,301, filed Feb. 6, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/242,216, filed Jan. 8, 2019, SanDisk Technologies LLC.
U.S. Appl. No. 16/291,577, filed Mar. 4, 2019, SanDisk Technologies LLC.
U.S. Appl. No. 16/291,504, filed Mar. 4, 2019, SanDisk Technologies LLC.
U.S. Appl. No. 16/291,457, filed Mar. 4, 2019, SanDisk Technologies LLC.
U.S. Appl. No. 16/274,687, filed Feb. 13, 2019, SanDisk Technologies LLC.
U.S. Appl. No. 16/231,752, filed Dec. 24, 2018, SanDisk Technologies LLC.
U.S. Appl. No. 16/248,923, filed Jan. 16, 2019, SanDisk Technologies LLC.
U.S. Appl. No. 16/284,502, filed Feb. 25, 2019, SanDisk Technologies LLC.

* cited by examiner

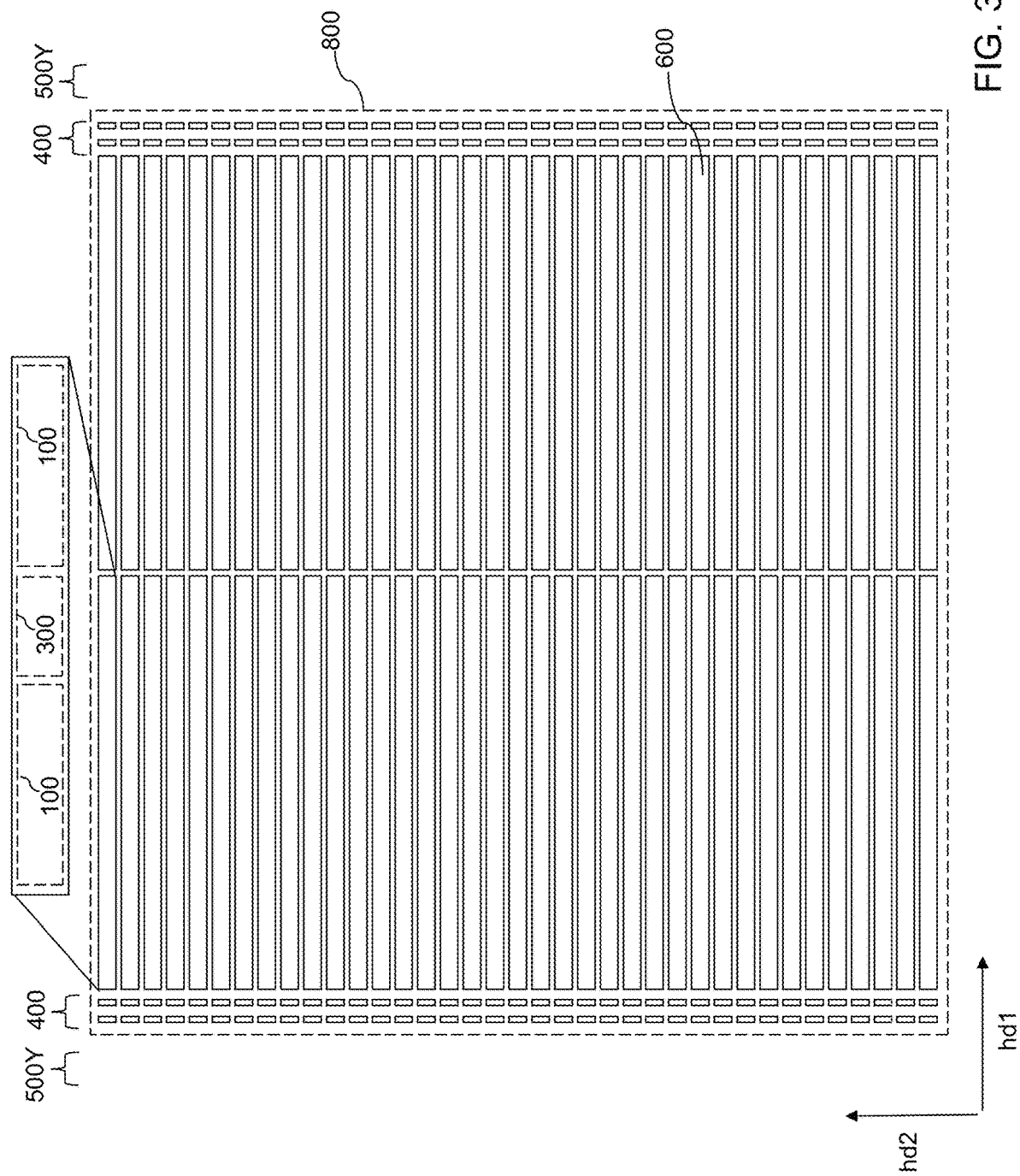

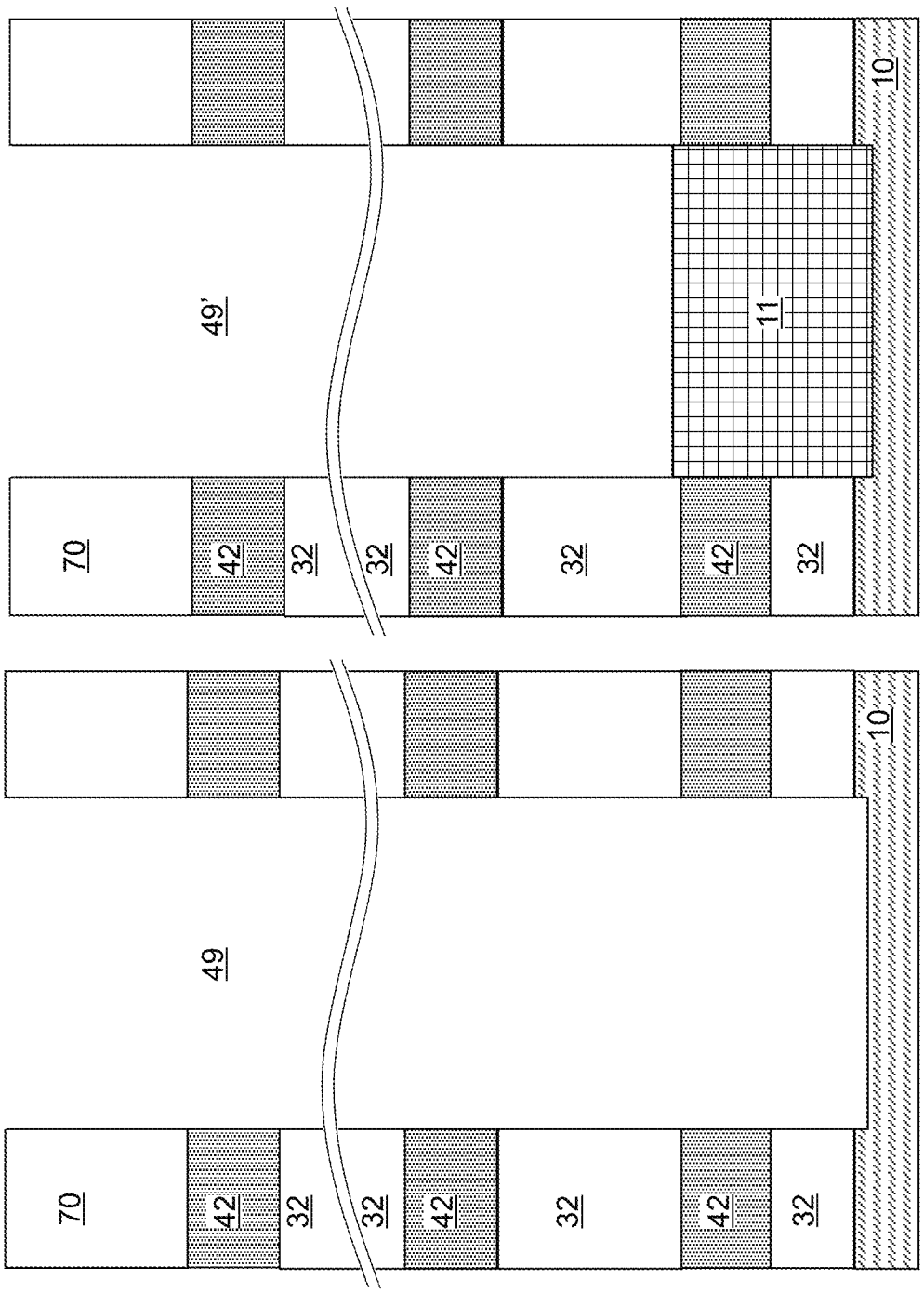

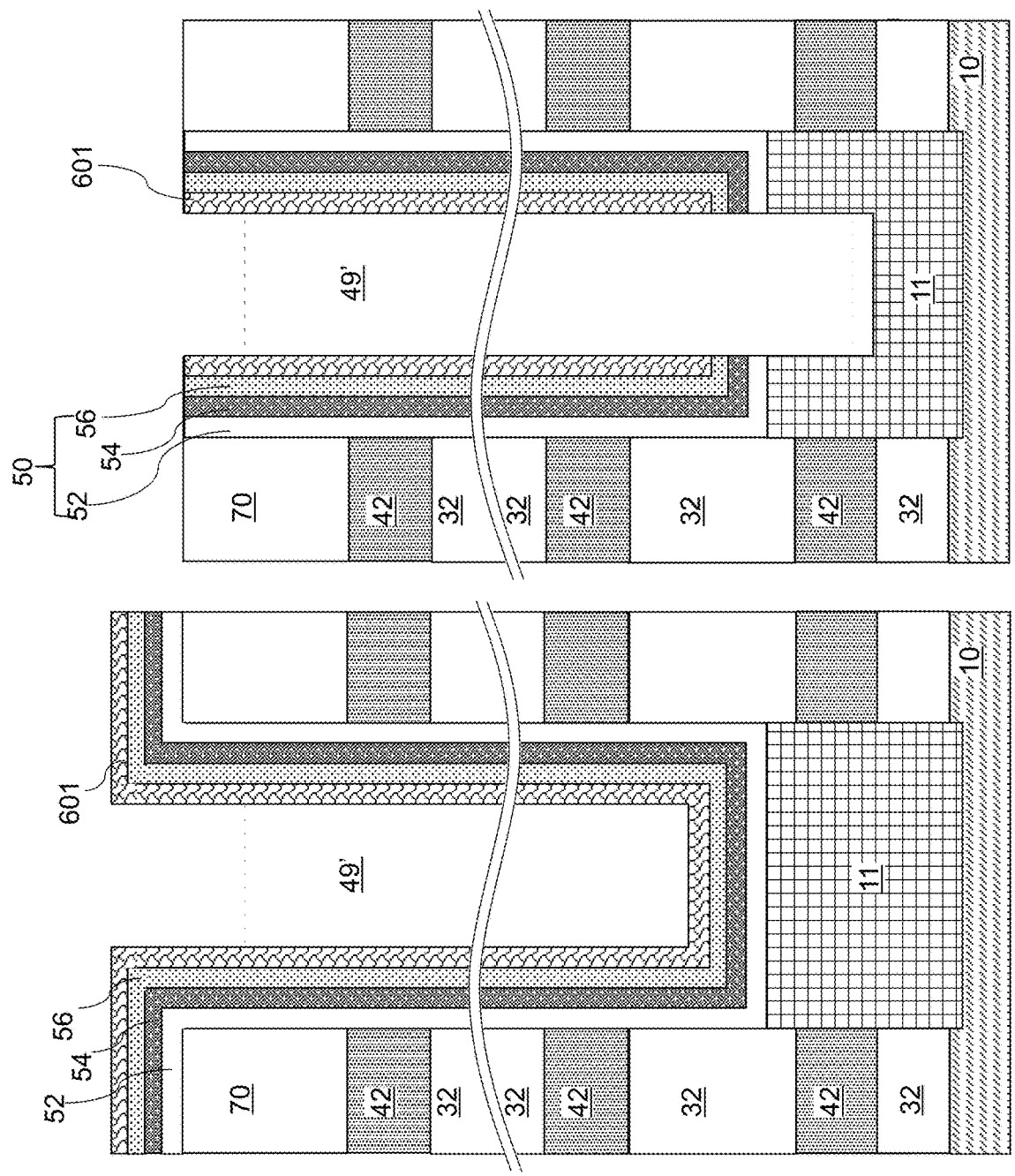

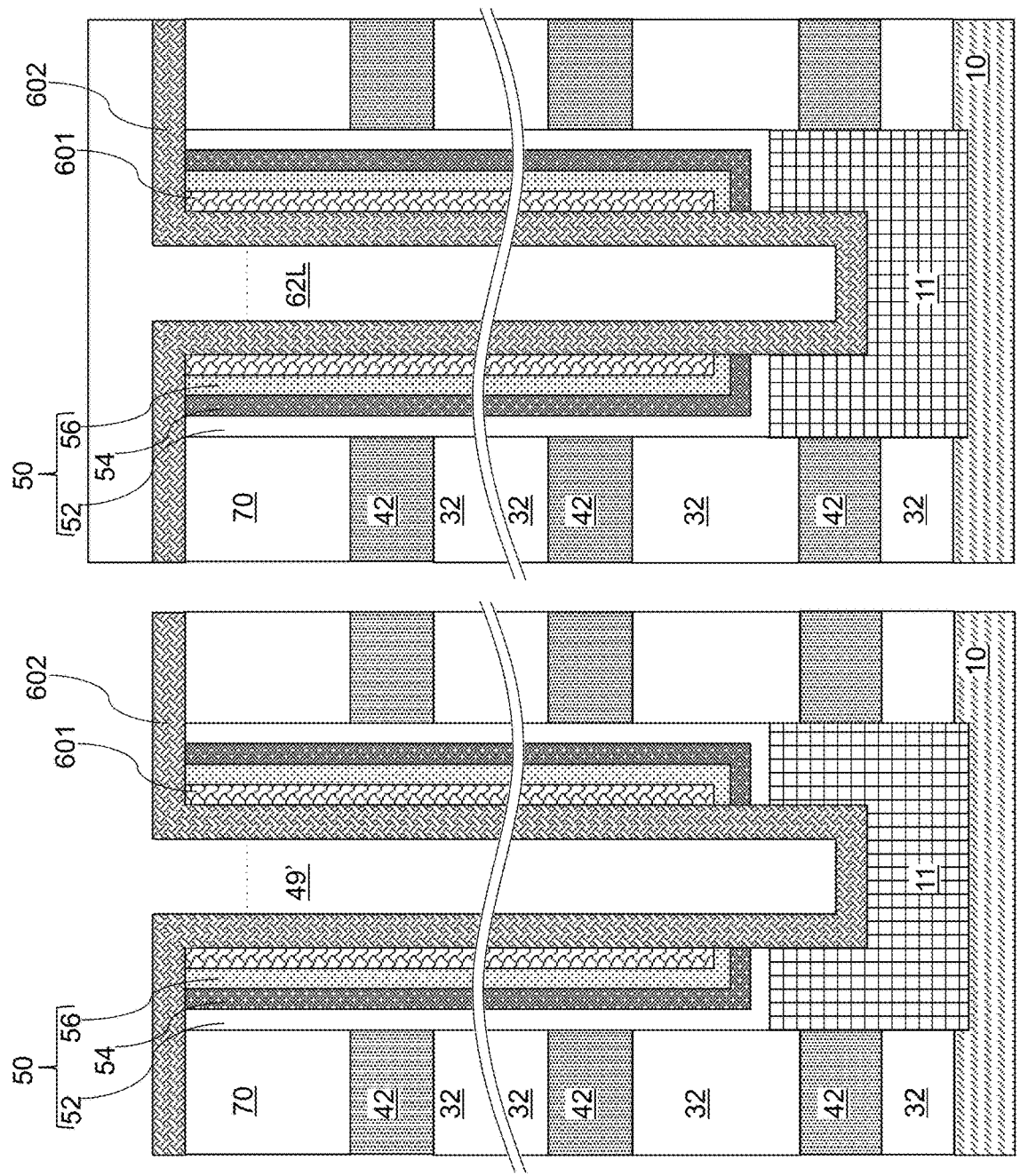

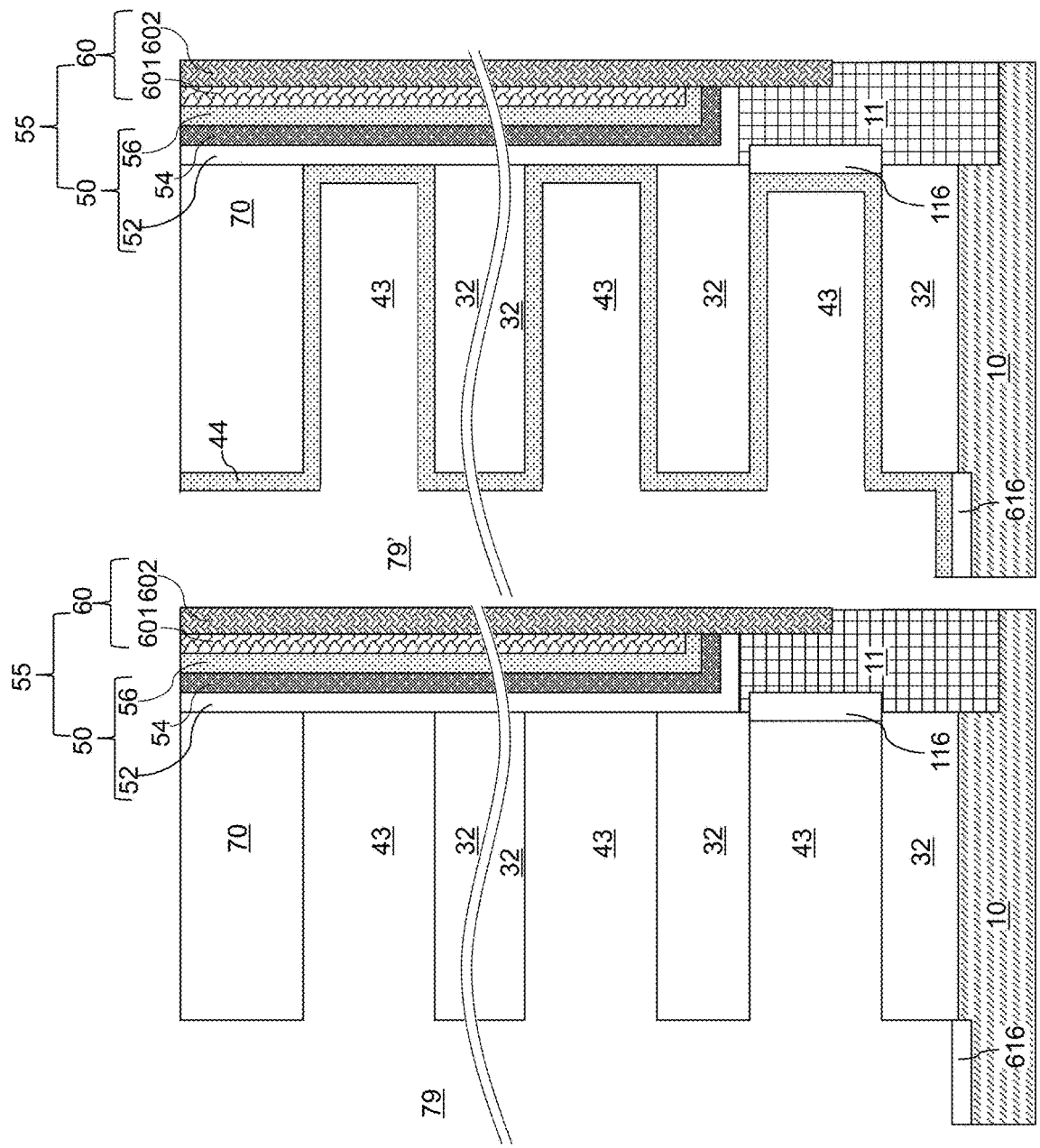

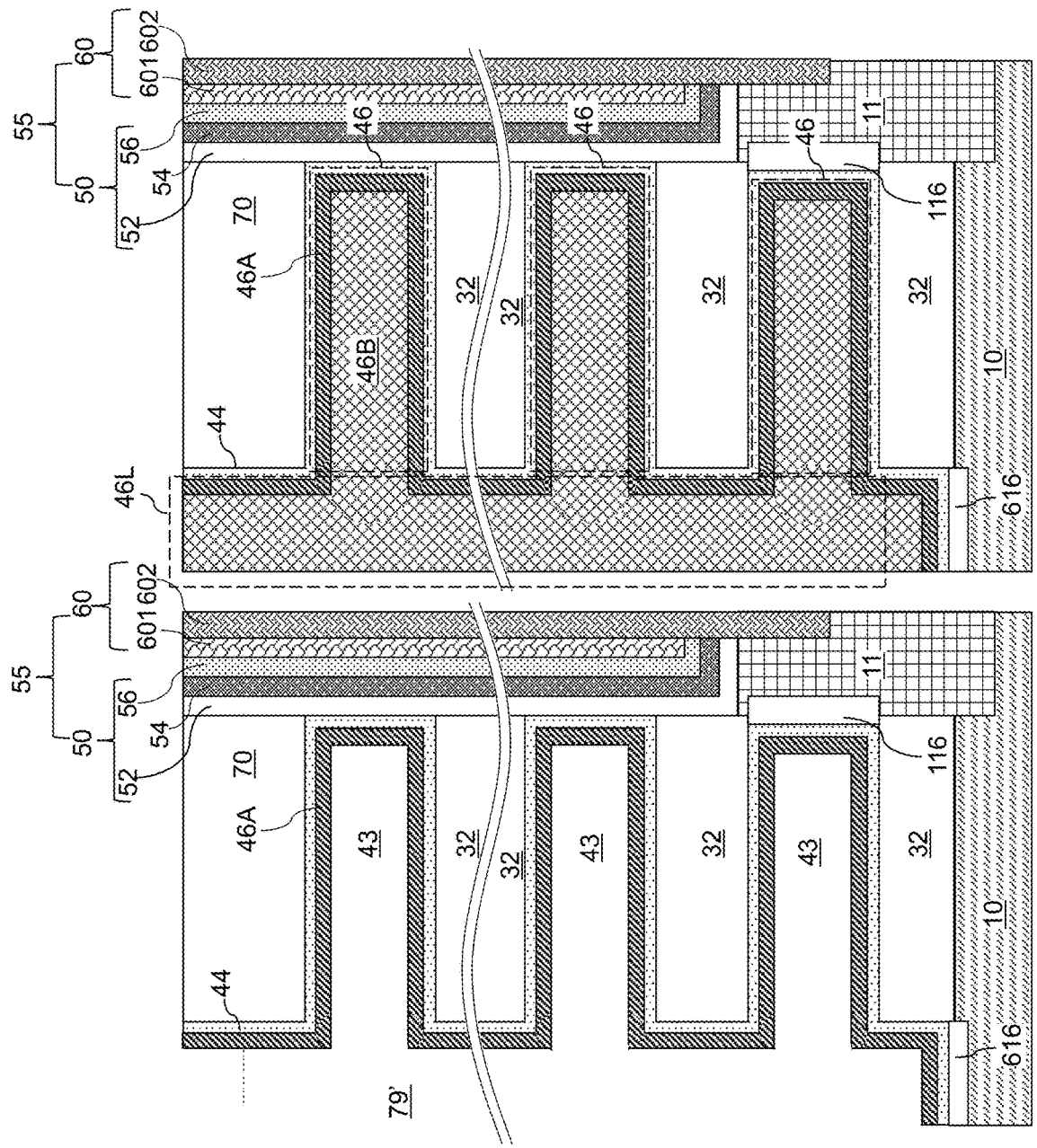

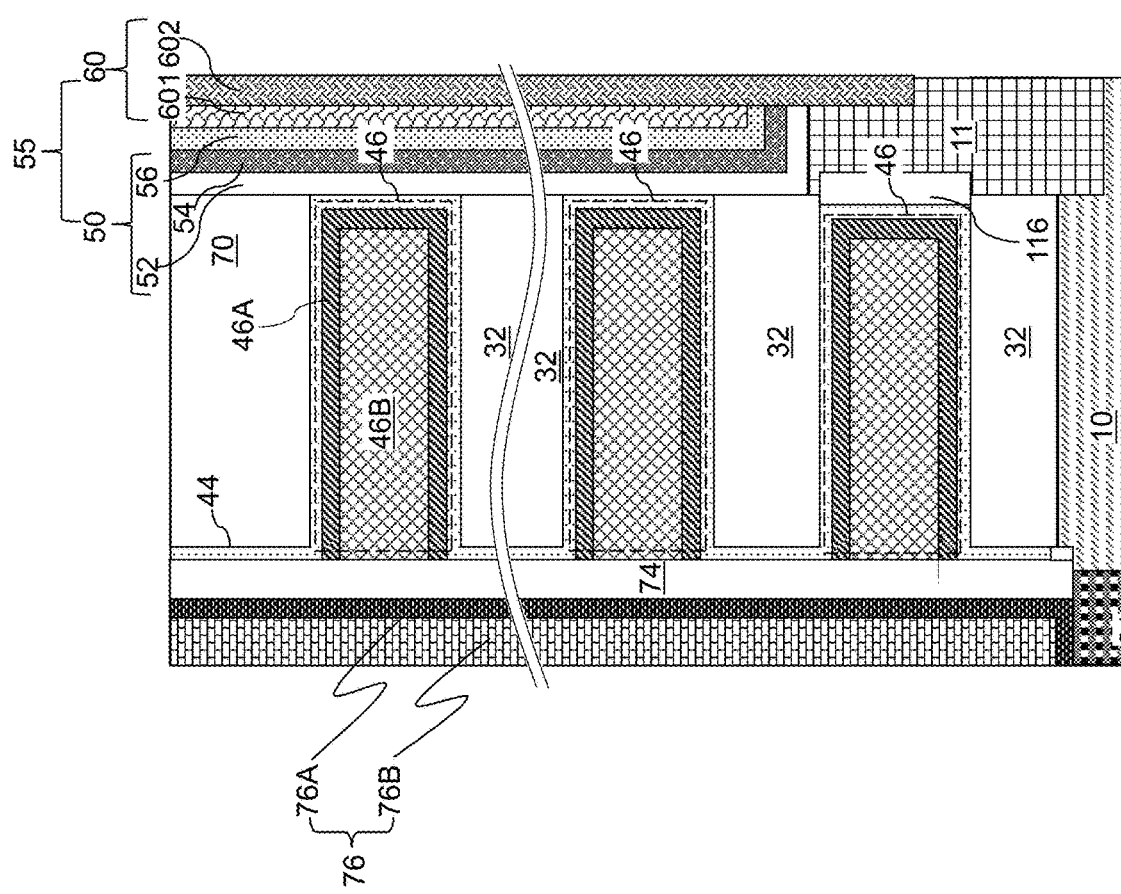

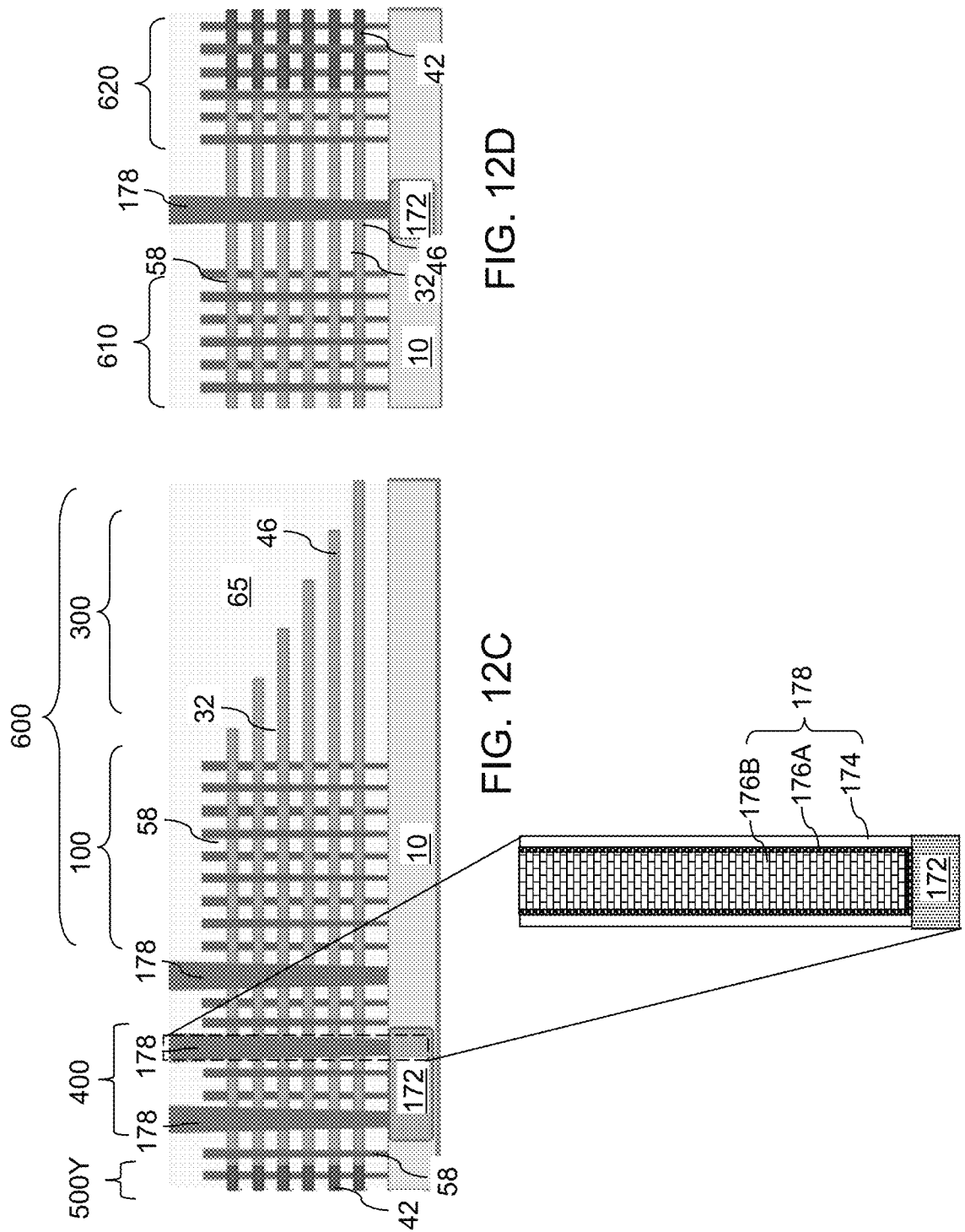

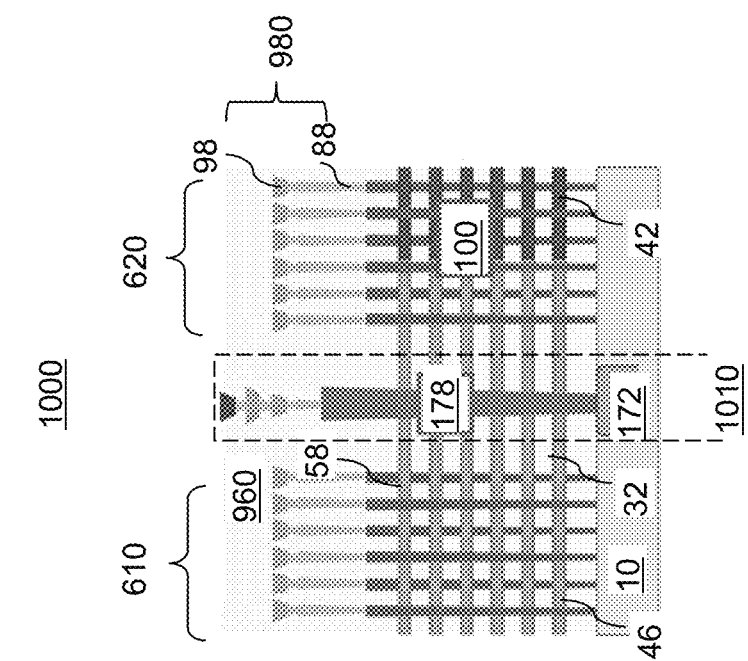
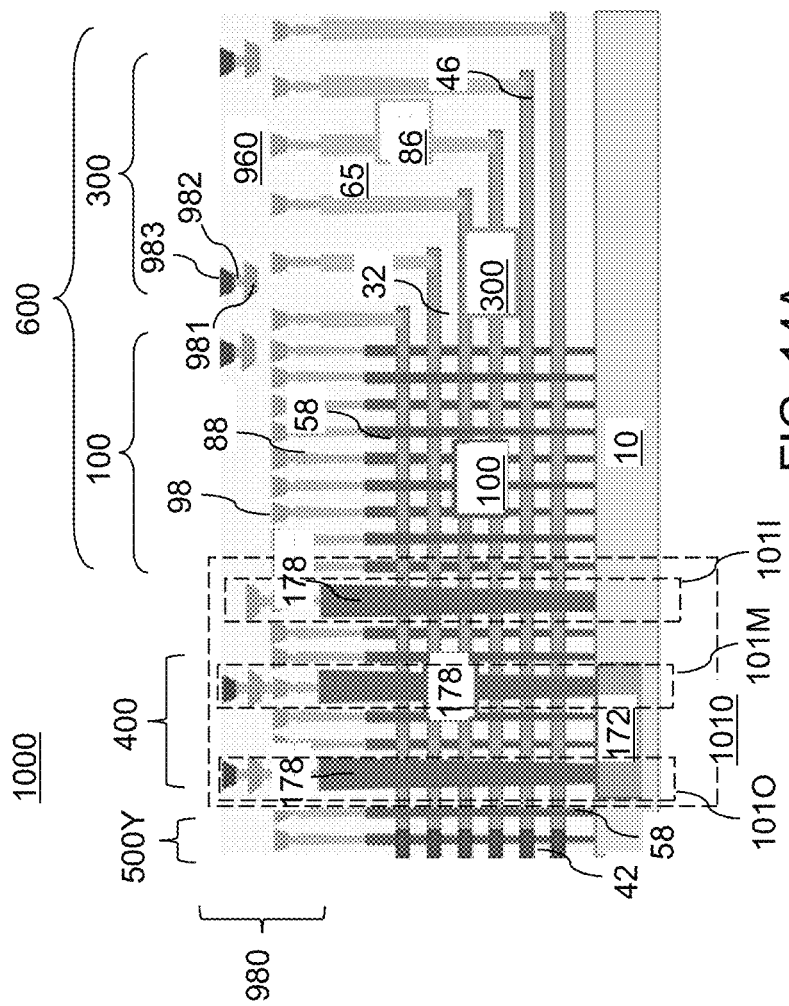
FIG. 14A
FIG. 14B

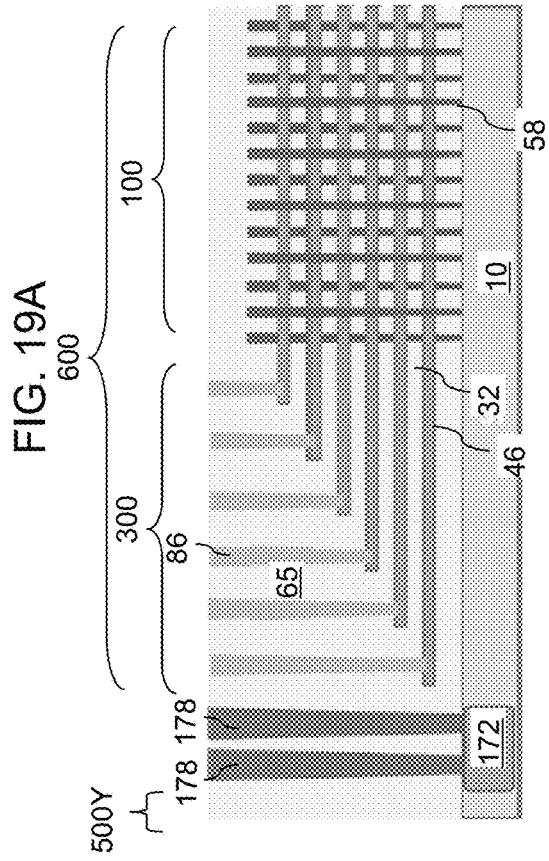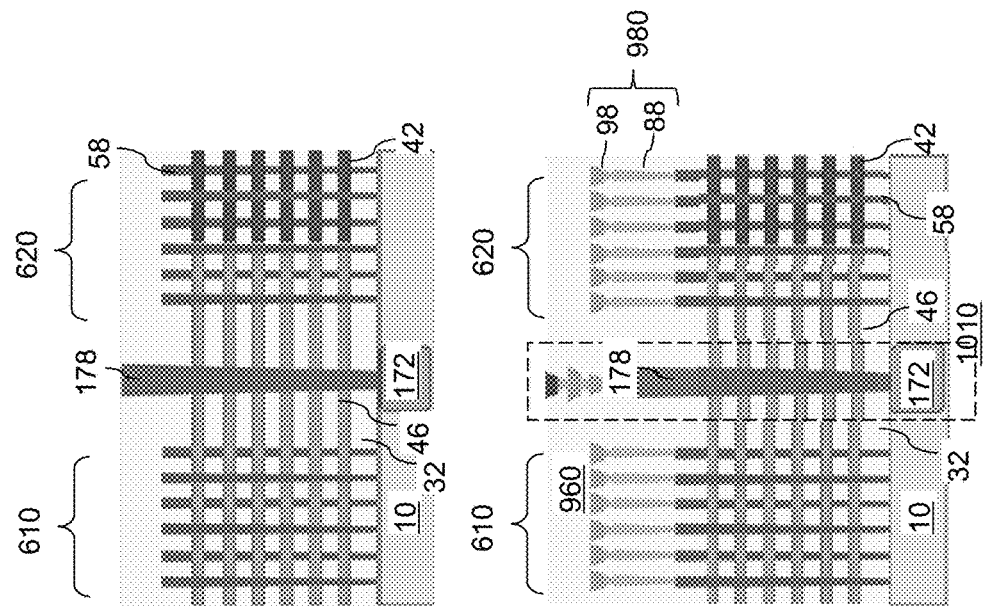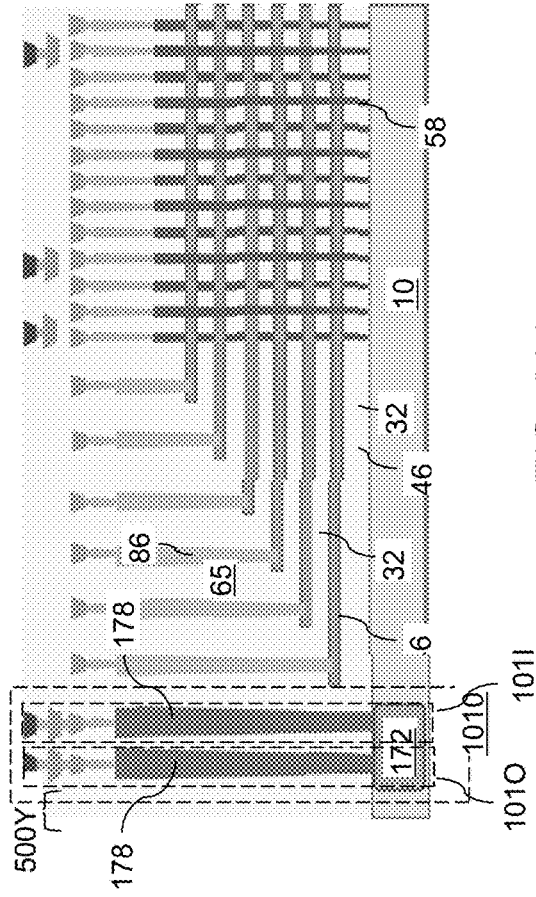

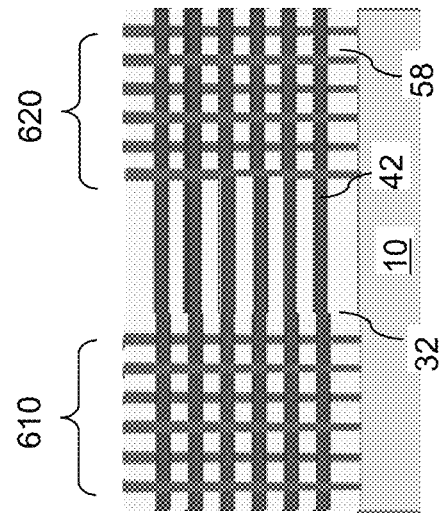
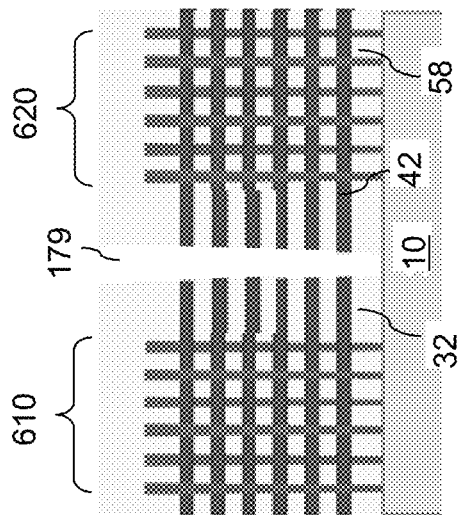
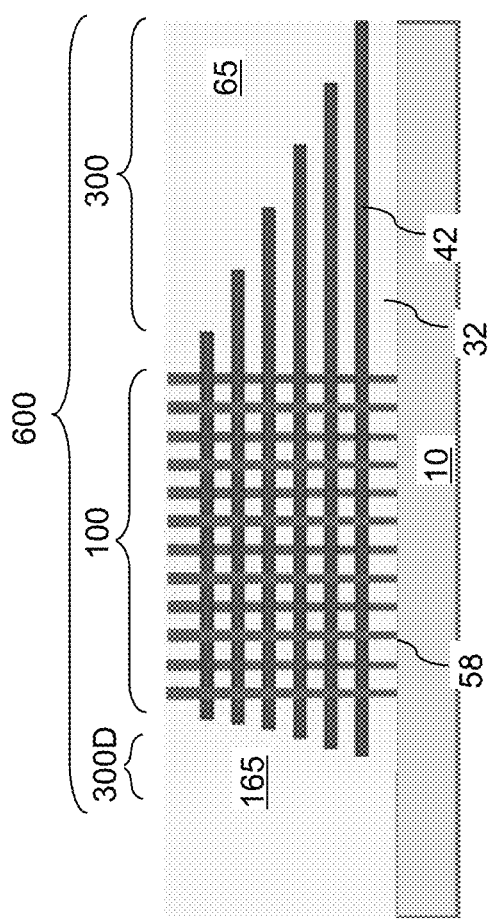
FIG. 21A
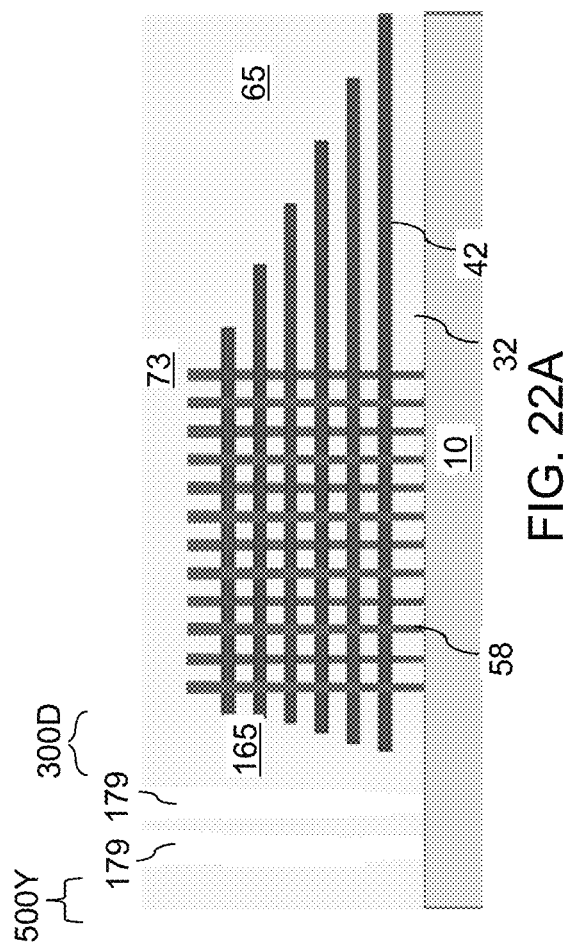
FIG. 22A

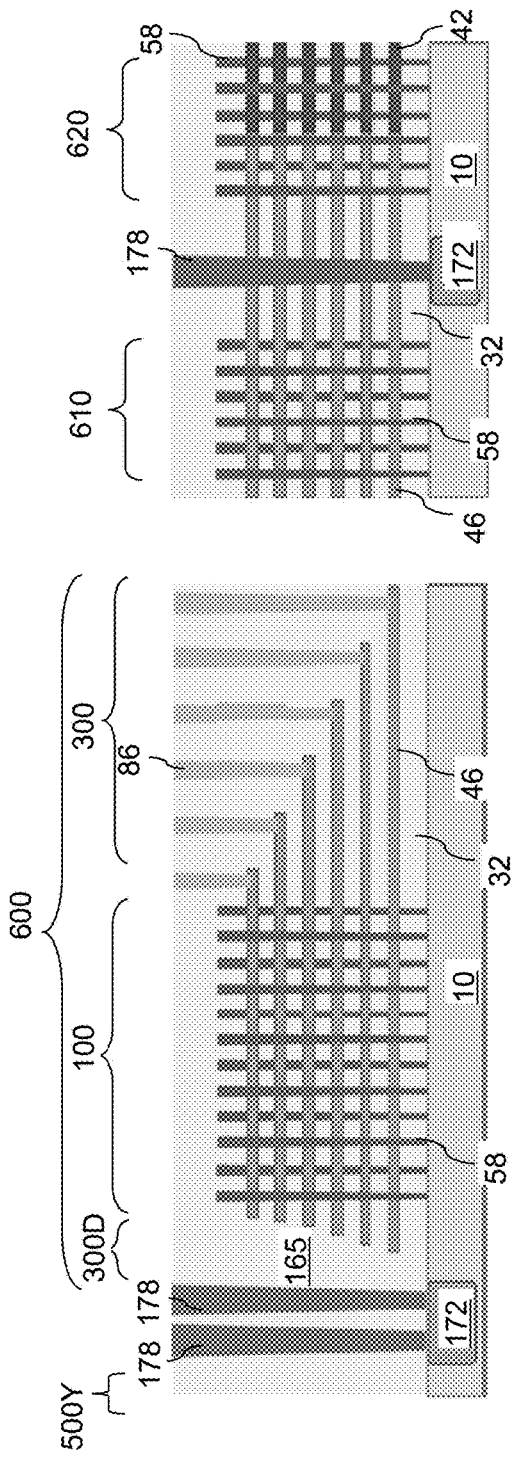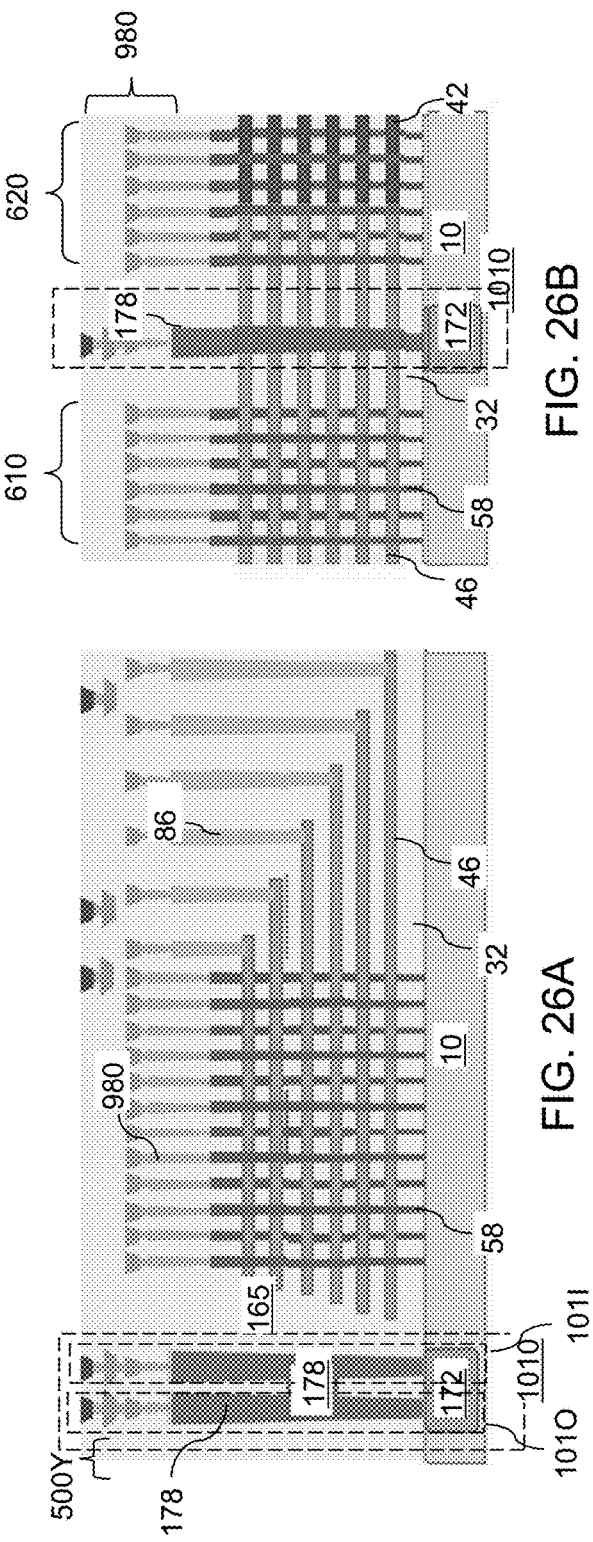

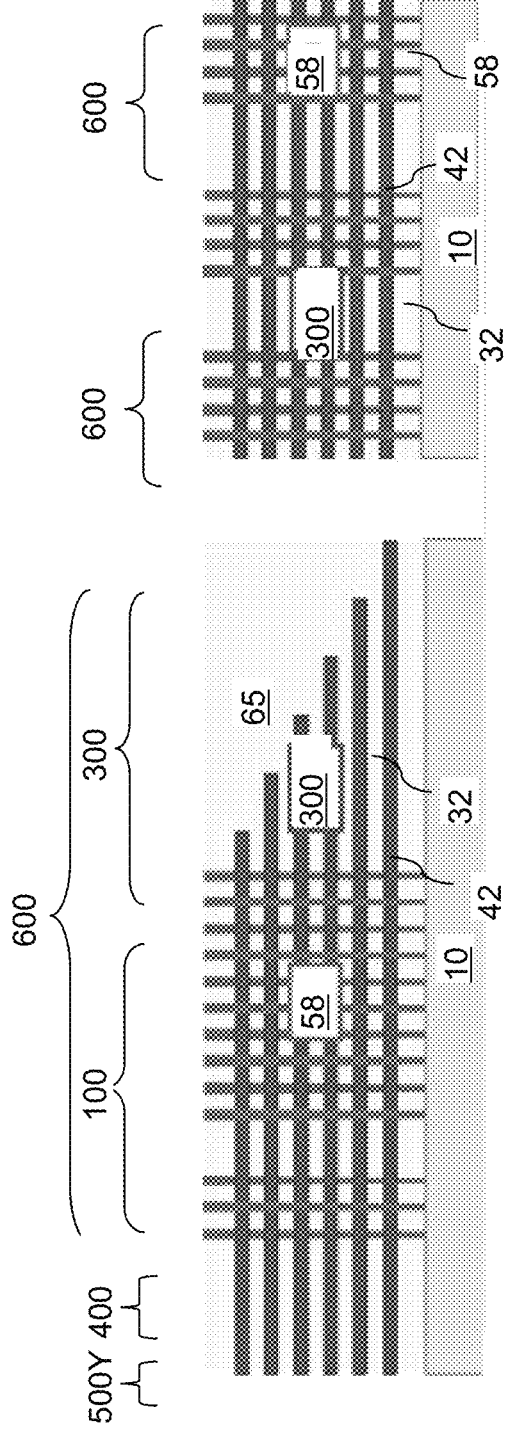
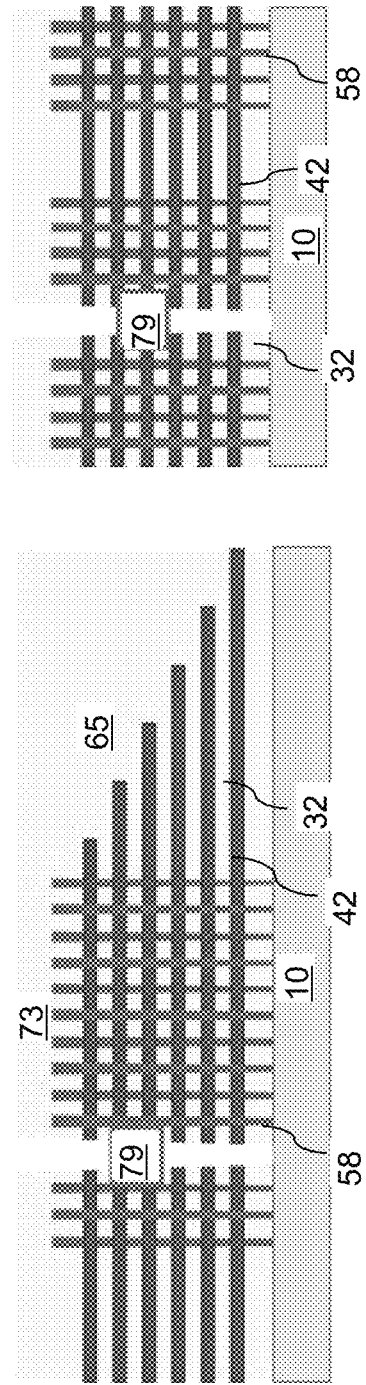
FIG. 34A
FIG. 34B
FIG. 35A
FIG. 35B

# VARIABLE DIE SIZE MEMORY DEVICE AND METHODS OF MANUFACTURING THE SAME

FIELD

The present disclosure relates generally to the field of semiconductor devices, and particularly to a variable die size memory device configured for selection of die size during manufacture and methods for manufacturing the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor die includes alternating stacks of insulating layers and electrically conductive layers that are laterally separated from each other by first backside trenches that laterally extend along a first horizontal direction, an array of memory stack structures vertically extending through the alternating sacks, an inner edge seal structure that continuously laterally surrounds the alternating stacks, an outer edge seal structure that continuously laterally surrounds the inner edge seal structure, and additional alternating stacks of insulating layers and electrically conductive layers located between the inner edge seal structure and the outer edge seal structure.

According to another embodiment of the present disclosure, a method of forming a semiconductor structure is provided, which comprises the steps of: forming a vertically alternating sequence of continuous insulating layers and continuous sacrificial material layers over a substrate; forming clusters of memory opening fill structures through the vertically alternating sequence; forming backside trenches, an inner edge seal trench, and an outer edge seal trench through the vertically alternating sequence, wherein the inner edge seal trench laterally encloses first clusters of the clusters of the memory stack structures, wherein the backside trenches comprise first backside trenches laterally extending along a first horizontal direction between neighboring pairs of the first clusters, wherein the outer edge seal trench laterally surrounds the inner edge seal trench, and wherein a second cluster of memory opening fill structures is present between the inner edge seal trench and the outer edge seal trench; forming electrically conductive layers by replacing remaining portions of the continuous sacrificial material layers with at least one electrically conductive material; and depositing at least one trench fill material in the backside trenches, the inner edge seal trench, and the outer edge seal trench during a same depositions step, wherein an inner edge seal structure comprises portions of the at least one trench fill material deposited in the inner edge seal trench, and an outer edge seal structure comprises portions of the at least one trench fill material deposited in the outer edge seal trench.

According to another embodiment, a method of forming a semiconductor structure comprises providing a plurality of alternating stacks of insulating layers and electrically conductive layers that contain respective staircase regions, and an array of memory stack structures vertically extending through each of the plurality of alternating sacks, forming an insulating material over the staircase region, etching word line contact vias through the insulating material and etching an inner edge seal trench and an outer edge seal trench around the alternating stacks during a same etch step, and depositing at least one fill material in the word line contact vias, the inner edge seal trench and the outer edge seal trench during a same deposition step, to form respective word line contact via structures contacting the electrically conductive layers in the staircase region, an inner edge seal structure that continuously laterally surrounds the plurality of alternating stacks, and an outer edge seal structure that continuously laterally surrounds both the inner edge seal structure and additional alternating stacks of insulating layers and electrically conductive layers located between the inner edge seal structure and the outer edge seal structure.

BRIEF DESCRIPTION OF THE DRAWINGS

FIG. 3B is a top-down view of an exposure field within the first exemplary structure of FIG. 3A.

FIGS. 5A-5H are sequential schematic vertical cross-sectional views of a memory opening within the first exemplary structure during formation of a memory stack structure, an optional dielectric core, and a drain region therein according to an embodiment of the present disclosure.

FIGS. 9A-9D are sequential vertical cross-sectional views of a region of the first exemplary structure during formation of electrically conductive layers according to an embodiment of the present disclosure.

FIG. 12B is a magnified view of a region of the first exemplary structure of FIG. 12A.

FIG. 12C is a vertical cross-sectional view of a region of the first exemplary structure along a vertical plane after the processing steps of FIGS. 12A and 12B.

FIG. 12D is a vertical cross-sectional view of a region of the first exemplary structure along another vertical plane after the processing steps of FIGS. 12A-12C.

FIG. 14A is a vertical cross-sectional view of a region of the first exemplary structure along a vertical plane after formation of edge seal structures according to an embodiment of the present disclosure. FIG. 14B is a vertical cross-sectional view of a region of the first exemplary structure along another vertical plane after the processing steps of FIG. 14A.

FIG. 19A is a vertical cross-sectional view of a second exemplary structure after formation of layer contact via structures according to an embodiment of the present disclosure.

FIG. 19B is another vertical cross-sectional view of the second exemplary structure of FIG. 19A.

FIG. 20A is a vertical cross-sectional view of a second exemplary structure after formation of metal interconnect structures and edge seal structures according to an embodiment of the present disclosure.

FIG. 20B is another vertical cross-sectional view of the second exemplary structure of FIG. 20A.

FIG. 21A is a vertical cross-sectional view of a third exemplary structure after formation of memory opening fill structures according to an embodiment of the present disclosure.

FIG. 21B is another vertical cross-sectional view of the third exemplary structure of FIG. 21A.

FIG. 22A is a vertical cross-sectional view of a third exemplary structure after formation of backside trenches and edge seal trenches according to an embodiment of the present disclosure.

FIG. 22B is another vertical cross-sectional view of the third exemplary structure of FIG. 22A.

FIG. 25A is a vertical cross-sectional view of a third exemplary structure after formation of layer contact via structures according to an embodiment of the present disclosure.

FIG. 25B is another vertical cross-sectional view of the third exemplary structure of FIG. 25A.

FIG. 26A is a vertical cross-sectional view of a third exemplary structure after formation of metal interconnect structures and edge seal structures according to an embodiment of the present disclosure.

FIG. 26B is another vertical cross-sectional view of the third exemplary structure of FIG. 26A.

FIGS. 34A, 34B, 35A, 35B, 36A, 36B, 37A, 37B, 38A, 38B, 39A, 39B, 40A and 40B are vertical cross-sectional views of the steps during a method of making a fifth exemplary structure of the fifth embodiment.

DETAILED DESCRIPTION

Figure 1:
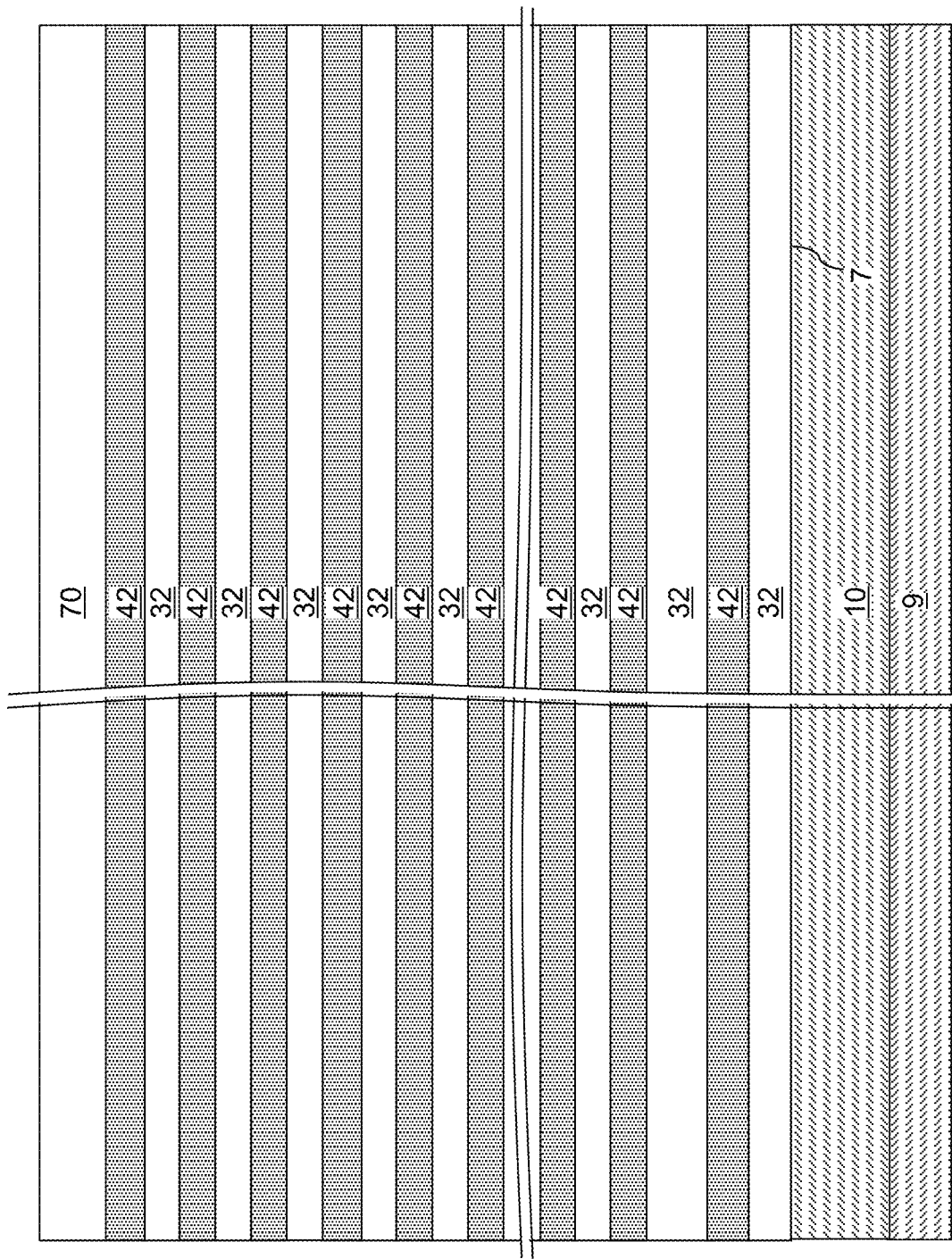
FIG. 1 is a schematic vertical cross-sectional view of a region of a first exemplary structure after formation of a continuous vertically alternating sequence of insulating layers and sacrificial material layers on a substrate according to an embodiment of the present disclosure.

As discussed above, the present disclosure is directed to a variable die size memory device configured for selection of die size during manufacture and methods for forming the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

A stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as a continuous vertically alternating sequence (32, 42). In one embodiment, the continuous vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the continuous vertically alternating sequence (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the continuous vertically alternating sequence (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
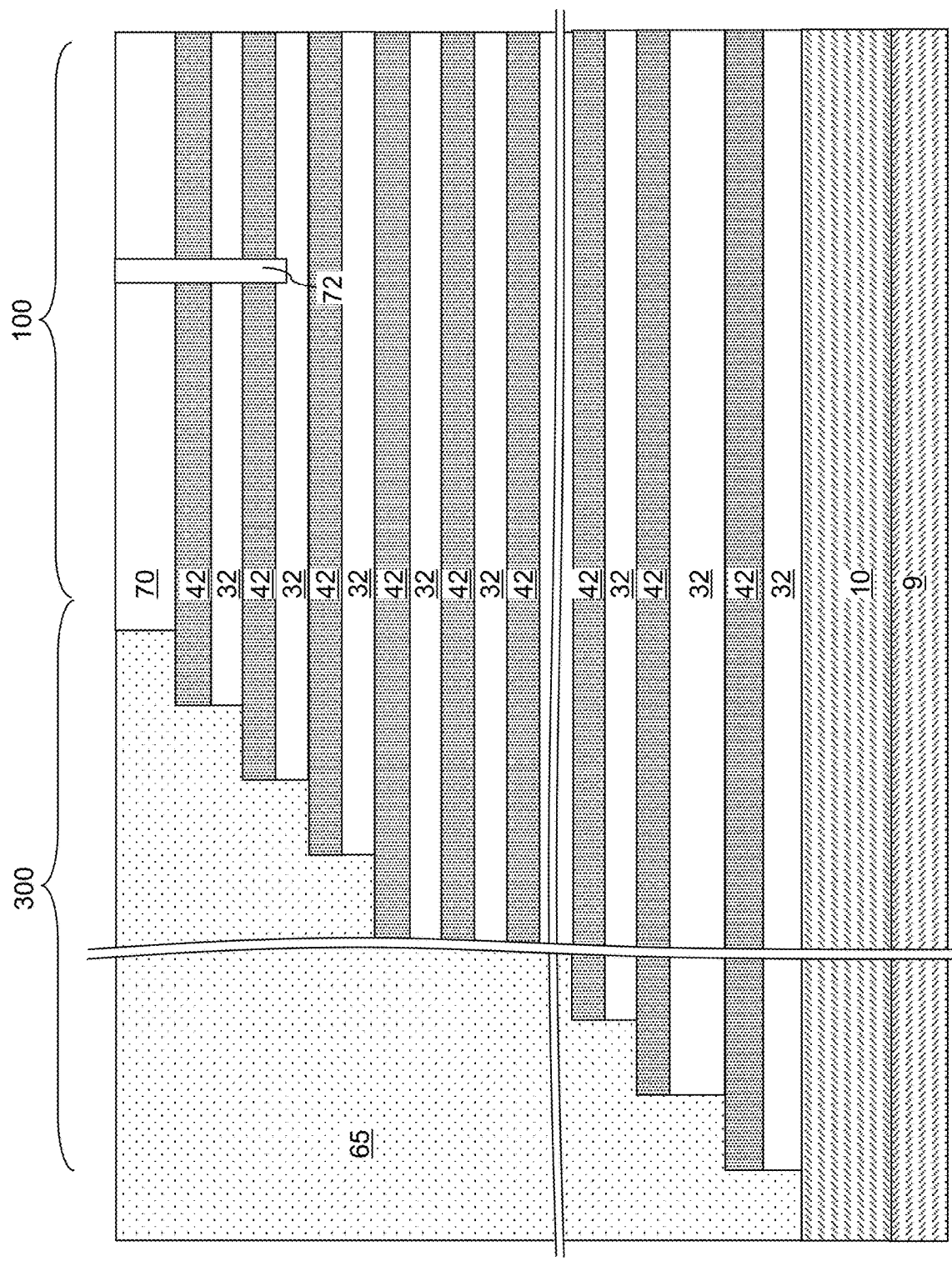
FIG. 2 is a schematic vertical cross-sectional view of a region of the first exemplary structure after formation of stepped terraces and a retro-stepped dielectric material portion according to an embodiment of the present disclosure.
Figure 3A:
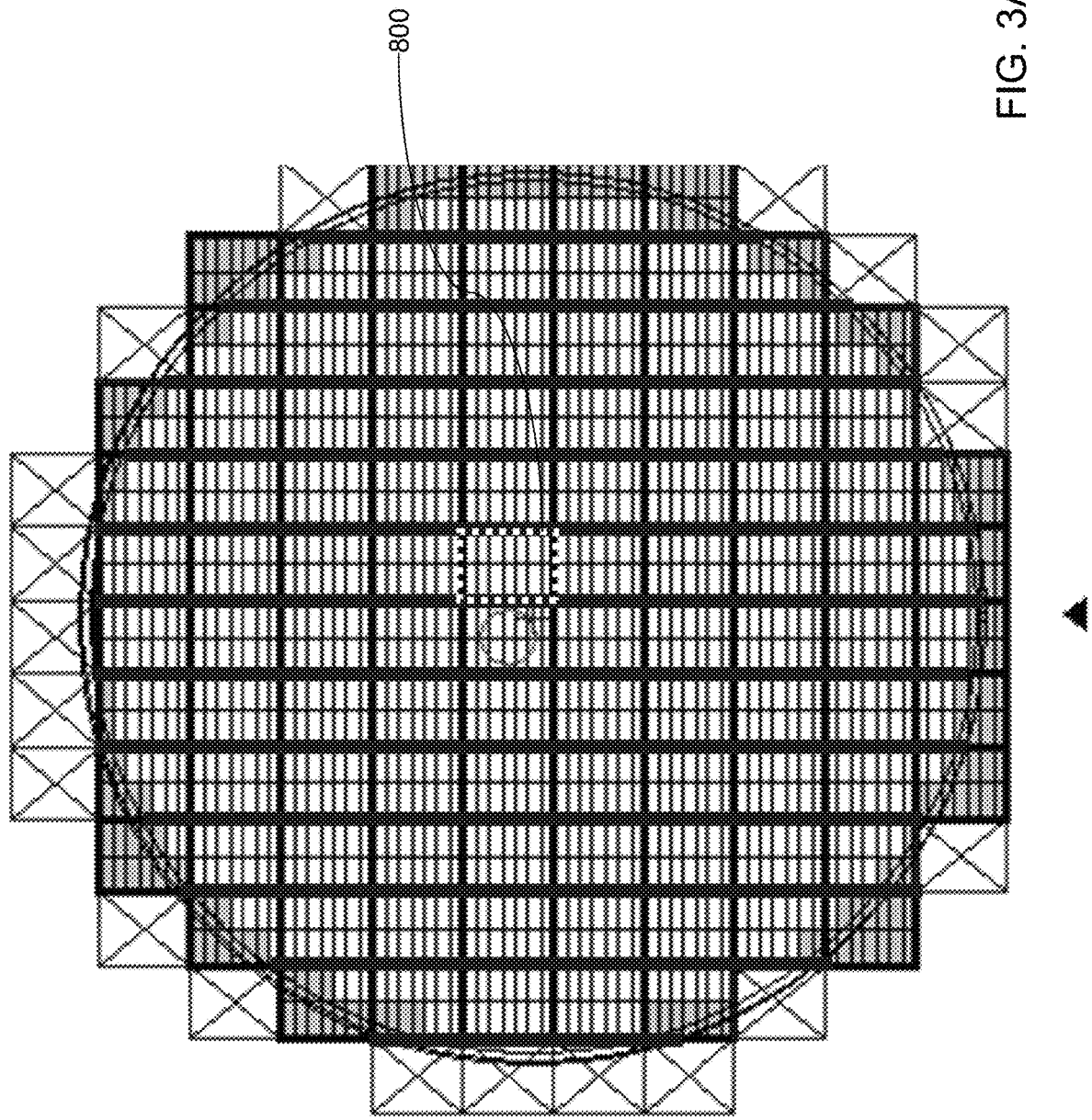
FIG. 3A is a top-down view of the first exemplary structure after the processing steps of FIG. 2.

Referring to FIGS. 2, 3A, and 3B, the first exemplary structure is illustrated after patterning the continuous vertically alternating sequence (32, 42) and forming retro-stepped dielectric material portions 65. In one embodiment, the substrate (9, 10) can include a commercially available semiconductor wafer such as a silicon wafer. In one embodiment, a two-dimensional rectangular array of lithographic exposure fields 800 can be formed on the substrate (9, 10) such that each lithographic exposure field 800 has a same pattern. As used herein, a "lithographic exposure field" refers to an area that is lithographically exposed during a same lithographic exposure step in a lithographic exposure tool. In this case, all lithographic exposure processes can be performed employing a stepper within a lithographic exposure tool, which provides relative movement between the substrate (32, 42) and the optical exposure field of the lithographic tool in steps that are commensurate with the size of the optical exposure field between each successive lithographic exposure of a respective area of a substrate. Each optical exposure field may contain lithographic patterns for a single semiconductor die or for multiple semiconductor dies. While the present disclosure is described employing an embodiment in which an optical exposure field includes the area of a single semiconductor die, embodiments are expressly contemplated herein in which an optical exposure field includes the area of multiple semiconductor dies. FIG. 3A illustrates exemplary alignment of optical exposure fields on the substrate (9, 10) in a lithographic exposure step.

Each lithographic exposure field 800 can include an array of memory blocks 600, which may be arranged as a two-dimensional array or a one-dimensional array. Each memory block 600 includes at least one memory array region 100 and at least one staircase region 300. In the illustrated example, each memory block 600 includes two memory array regions 100 that are laterally spaced apart along a first horizontal direction hd1 (e.g., word line direction) by a staircase region 300. While FIG. 3B illustrates a configuration in which the memory blocks 600 are arranged as two rows of memory blocks 600 that are arranged along a second horizontal direction hd2 (e.g., bit line direction) that is perpendicular to the first horizontal direction hd1, embodiments are expressly contemplated herein in which a single row of memory blocks 600 or more than two rows of memory blocks 600 are arranged along the second horizontal direction hd2 or along the first horizontal direction hd1. The total number of memory blocks 600 within each row of memory blocks 600 in a lithographic exposure field 800 may be in a range from $2^8$ to $2^{14}$, although lesser and greater number of memory blocks 600 may be provided per row of memory blocks 600. Edge seal regions 400 may be located adjacent to end regions of the memory blocks 600. Spaces between semiconductor dies in the first horizontal direction (e.g., in the word line direction which may be the y-direction) constitute scribe regions 500Y, which can be subsequently employed to form dicing channels upon completion of manufacture of semiconductor devices and metal interconnect structures on the substrate (9, 10).

Stepped surfaces are formed in each staircase region 300 of the vertically alternating sequence (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. One set of stepped surfaces can be formed on each side of each staircase region 300. FIG. 2A illustrates only one set of stepped surfaces located at one end of a staircase region 300. A stepped cavity is formed within the volume from which portions of the vertically alternating sequence (32, 42) are removed through formation of the stepped surfaces. A "stepped cavity" refers to a cavity having stepped surfaces.

The terrace region is formed in each staircase region 300. Each stepped cavity can have various stepped surfaces such that the horizontal cross-sectional shape of the stepped cavity changes in steps as a function of the vertical distance from the top surface of the substrate (9, 10). In one embodiment, each stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The continuous vertically alternating sequence (32, 42) can be patterned into a plurality of vertically alternating sequences (32, 42) during formation of the stepped surfaces. For example, all layers of the continuous vertically alternating sequence (32, 42) can be removed at a center portion of each staircase region 300, and each vertically alternating sequence (32, 42) can have stepped surfaces at one end. Each sacrificial material layer 42 other than a topmost sacrificial material layer 42 within the vertically alternating sequence (32, 42) laterally extends farther than any overlying sacrificial material layer 42 within the vertically alternating sequence (32, 42) in the terrace region. Each terrace region includes stepped surfaces of a vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
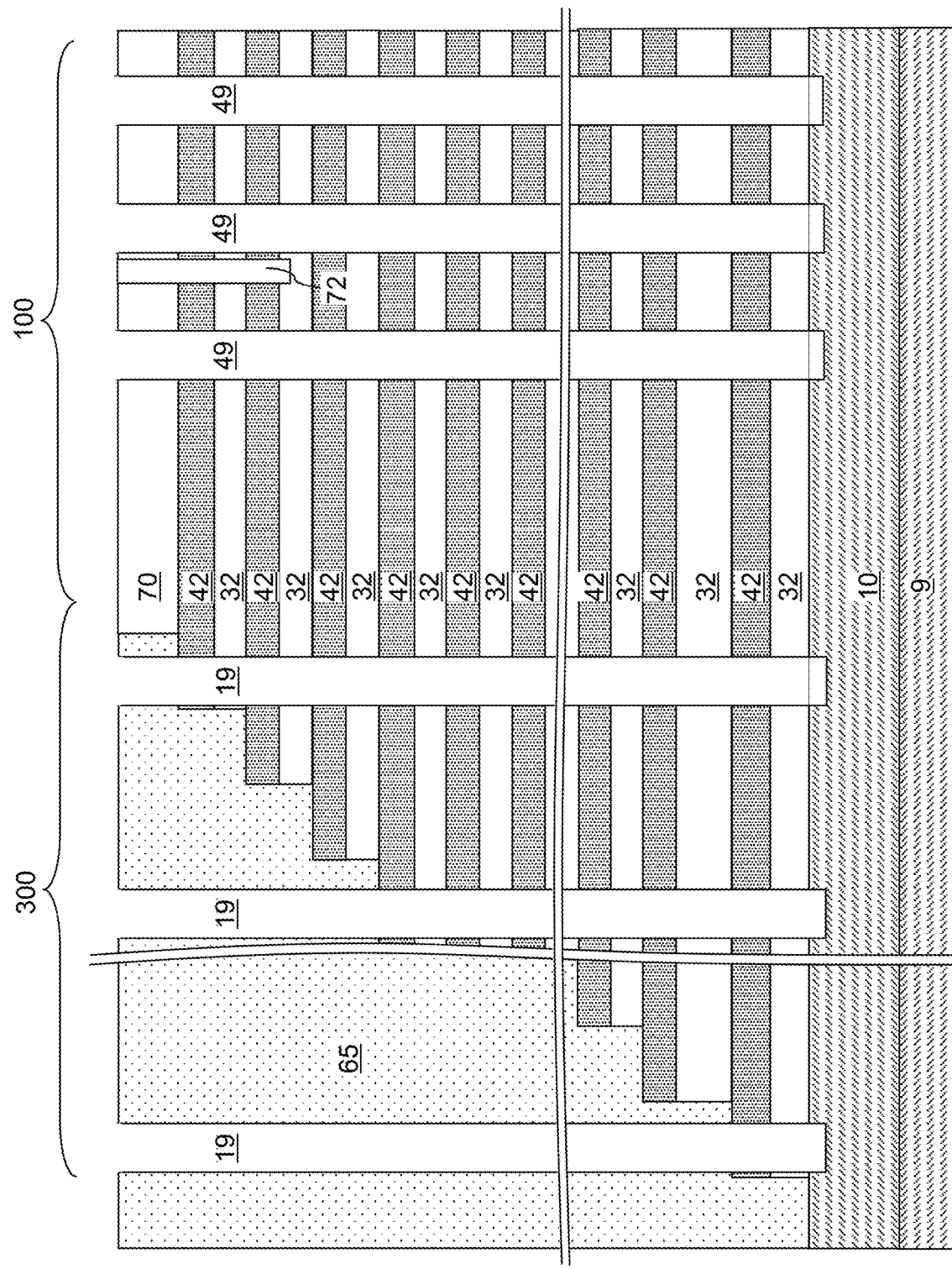
FIG. 4A is a schematic vertical cross-sectional view of a region of the first exemplary structure after formation of memory openings and support openings according to an embodiment of the present disclosure.
Figure 4B:
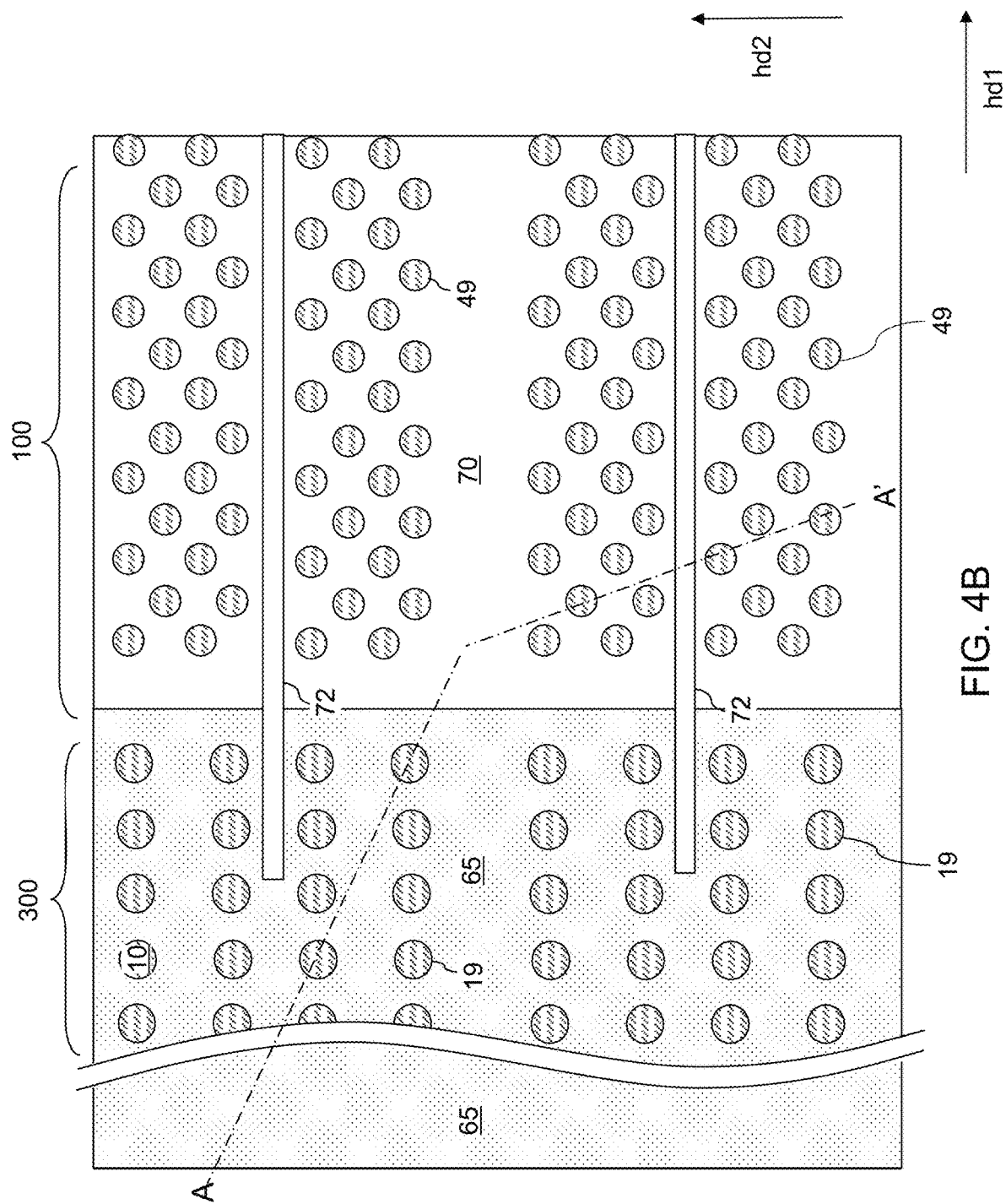
FIG. 4B is a top-down view of the first exemplary structure of FIG. 4A. The vertical plane A-A' is the plane of the cross-section for FIG. 4A.

Referring to FIGS. 4A, and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertically alternating sequence (32, 42) in the memory array region 100. The support openings 19 are formed through the retro-stepped dielectric material portion 65 and the portion of the vertically alternating sequence (32, 42) that underlie the stepped surfaces in the staircase region 300.

The memory openings 49 extend through the entirety of the vertically alternating sequence (32, 42). The support openings 19 extend through a subset of layers within the vertically alternating sequence (32, 42). The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertically alternating sequence (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the vertically alternating sequence (32, 42), and optionally into an upper portion of the semiconductor material layer 10. At this processing step, each support opening 19 can extend through the retro-stepped dielectric material portion 65, a subset of layers in the vertically alternating sequence (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
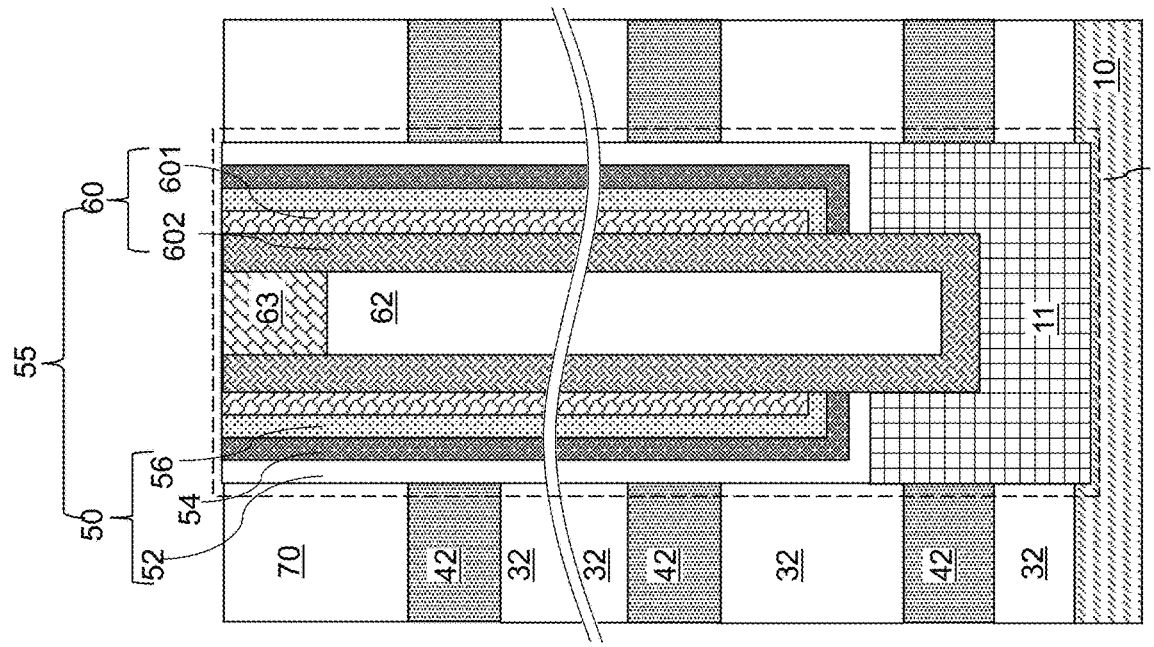
Figure 5G:
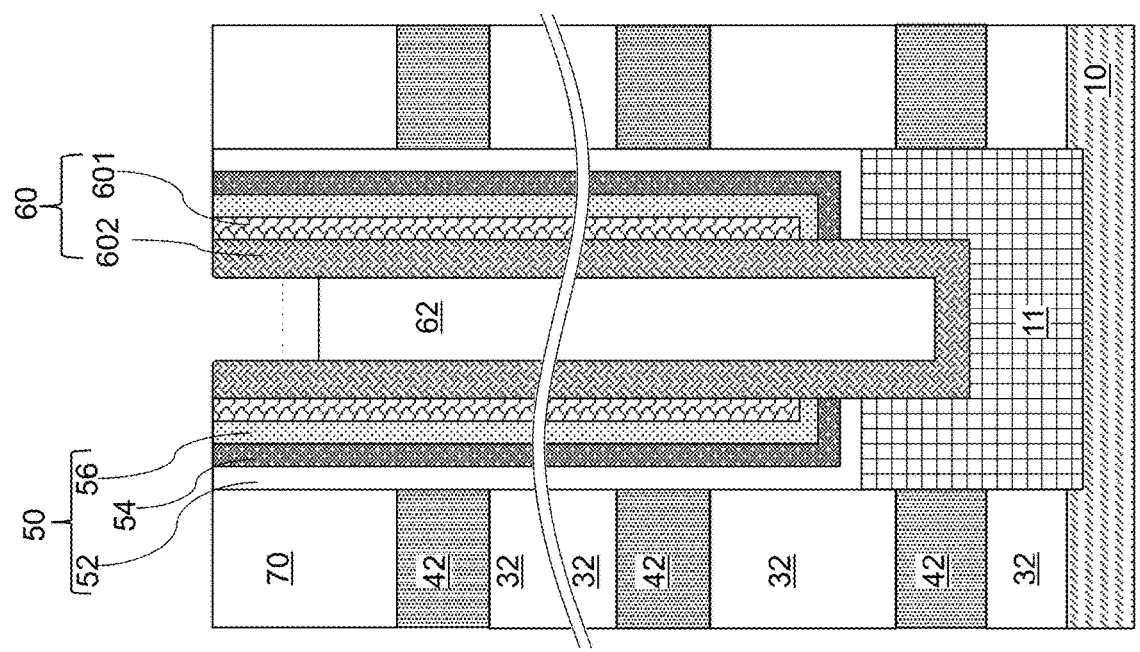

Referring to FIG. 5G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0\times10^{19}/cm^3$ to $2.0\times10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductivity type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirely within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. In alternative embodiments, a backside gate dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements as embodied as portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Referring to FIGS. 6A-6D, the first exemplary structure is illustrated after formation of memory opening fill structures 58 and support pillar structures 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The memory stack structures 55 and the support pillar structures 20 can be absent between neighboring pairs of edge seal regions 400, between an edge seal region 400 and a neighboring scribe region 500Y, between memory blocks 600, and between a neighboring pair of a memory block 600 and an edge seal region 400.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising portions of the charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Generally, clusters of memory opening fill structures 58 can be formed through each vertically alternating sequence of insulating layers 32 and sacrificial material layers 42. Each cluster of memory opening fill structures 58 can comprise multiple rows of memory stack structures 55 that are arranged along the first horizontal direction hd1. The clusters of memory opening fill structures 58 can be laterally spaced apart among one another with a uniform block-to-block pitch p_bb along the second horizontal direction hd2 (e.g., the bit line or x-direction) that is perpendicular to the first horizontal direction hd1 (e.g., the word line or y-direction).

Figure 6A:
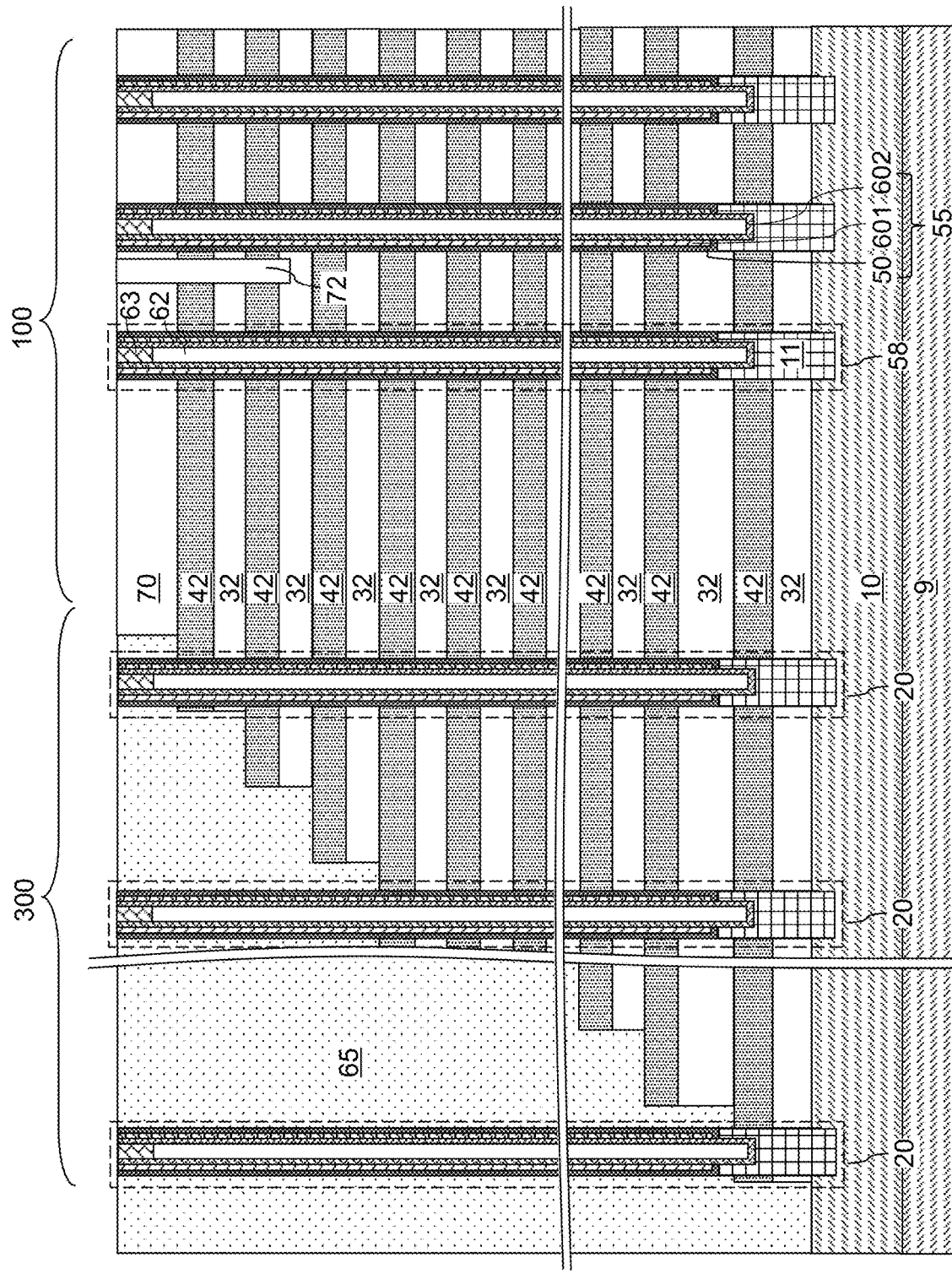
FIG. 6A is a schematic vertical cross-sectional view of a region of the first exemplary structure after formation of memory stack structures and support pillar structures according to an embodiment of the present disclosure.
Figure 6B:
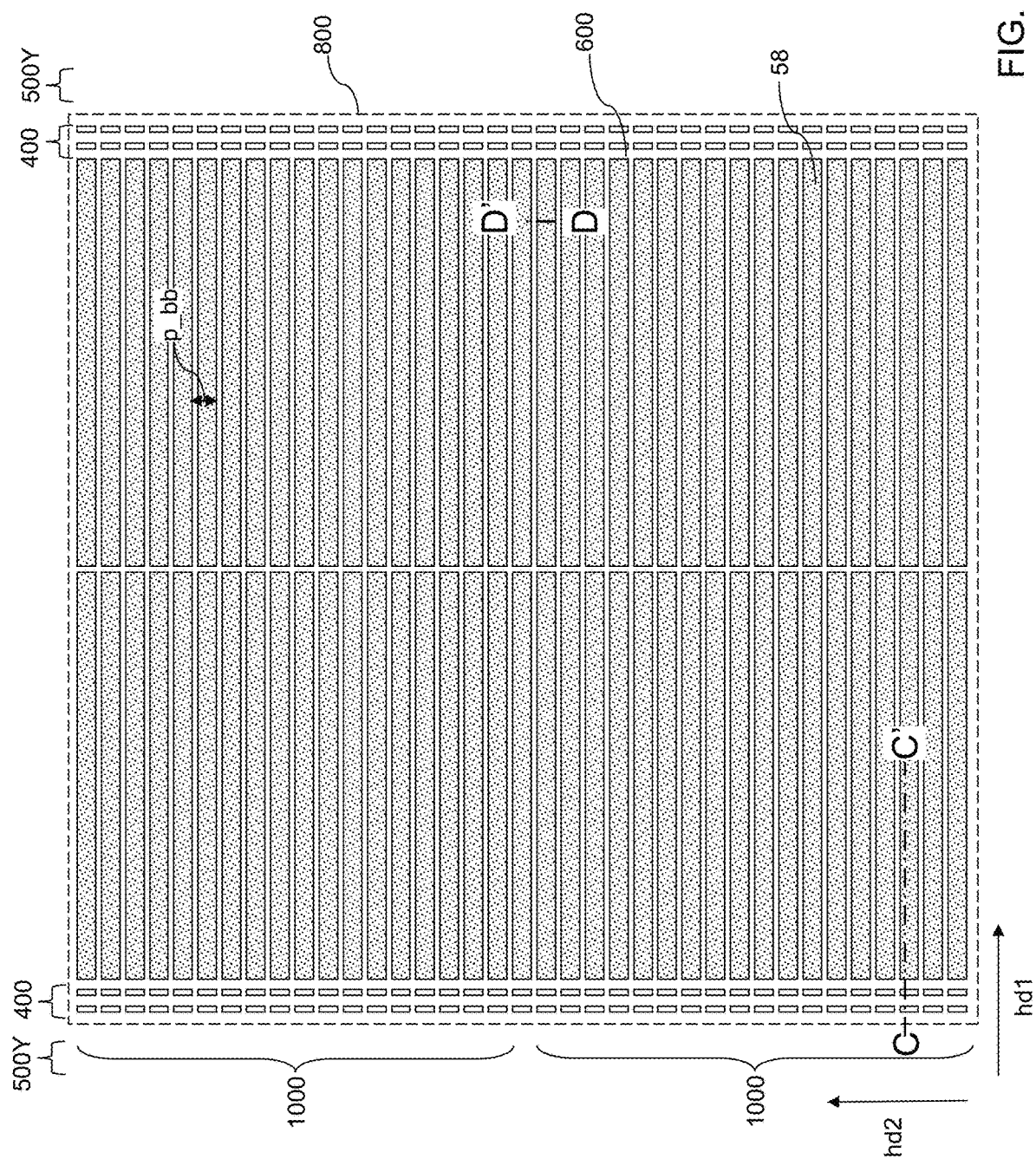
FIG. 6B is a top-down view of an exposure field within the first exemplary structure after the processing steps of FIG. 6A.
Figure 6D:
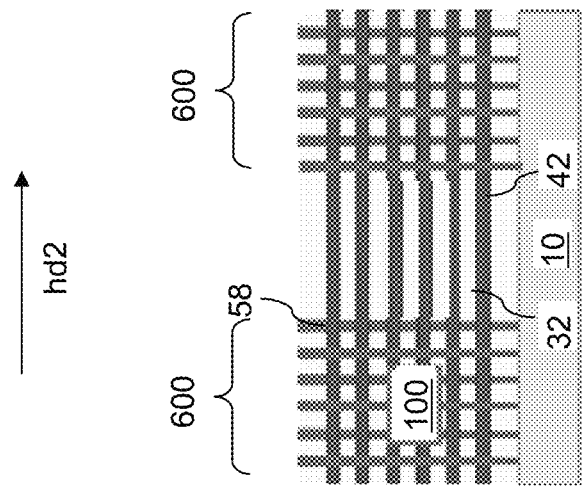
FIG. 6D is a vertical cross-sectional view of the first exemplary structure along the vertical plane D-D' of FIG. 6B.
Figure 6C:
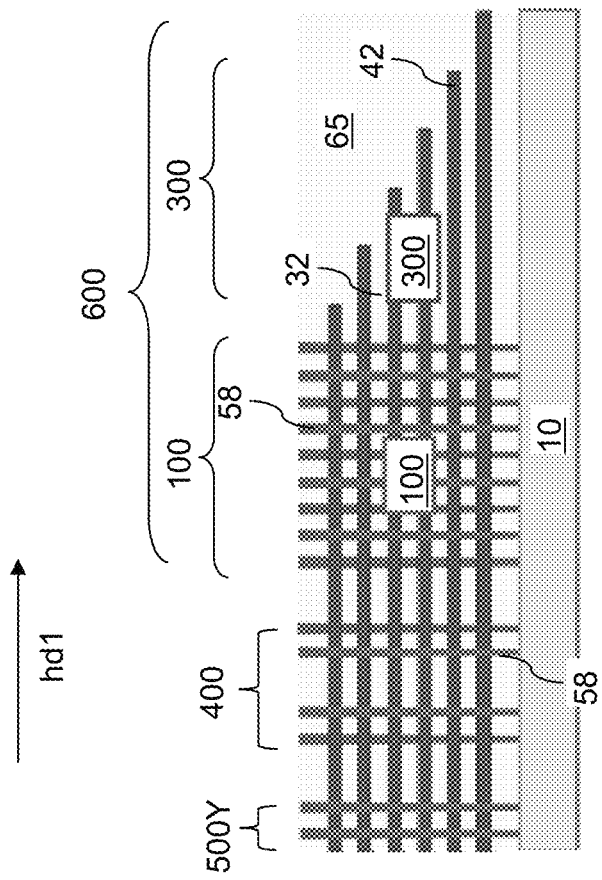
FIG. 6C is a vertical cross-sectional view of the first exemplary structure along the vertical plane C-C' of FIG. 6B.

Each lithographic exposure field 800 may be employed to build a single semiconductor die 1000, or may be employed to build multiple semiconductor dies 1000. According to an aspect of the present disclosure, the size of the semiconductor dies 1000 to be fabricated does not need to be determined up to the processing steps of FIGS. 6A-6D. Instead, determination of the size of the semiconductor dies 1000 to be manufactured may be deferred to the processing steps of FIGS. 7A-7D irrespective of the size of the semiconductor dies 1000 to be subsequently manufactured. The size of the semiconductor die 1000 may be determined based on the number of memory blocks 600 to be included within a semiconductor die 1000. FIG. 6B illustrates allocation of the memory blocks 600 into two semiconductor dies 1000 in case two semiconductor dies 1000 are subsequently manufactured within each lithographic exposure field. Each semiconductor die 1000 may have one or more memory planes, such as 1 to 8 planes, for example 2 to 4 planes.

Generally, the number of semiconductor dies 1000 that can be manufactured within the area of a single lithographic exposure field 800 can be in a range from 1 to $2^8$, although a greater number of semiconductor dies 1000 may also be manufactured. The area of each semiconductor die 1000 can include a set of memory blocks 600 and optional edge seal regions 400 that are located between two scribe regions 500Y that are laterally spaced apart along the first horizontal direction hd1. In one embodiment, the semiconductor dies 1000 within a single lithographic exposure field 800 can be arranged along the second horizontal direction hd2 between two scribe regions that are laterally spaced apart along the second horizontal direction hd2. The scribe regions 500Y are subsequently employed as dicing channels that separate the semiconductor dies 1000. In one embodiment, the scribe regions 500 may be located in the periphery of each lithographic exposure field 800. According to an aspect of the present disclosure, at least one memory block 600 that does not belong to any semiconductor die 1000 can be located between memory blocks 600 that belong to a neighboring pair of semiconductor dies 1000. The area of the at least one memory block 600 that does not belong to any semiconductor die 1000 is subsequent employed as an area of a dicing channel that separates the neighboring pair of semiconductor dies 1000.

Referring to FIGS. 7A-7G, a contact-level dielectric layer 73 can be formed over the vertically alternating sequences (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the vertically alternating sequences (32, 42) and/or the retro-stepped dielectric material portion 65 employing an anisotropic etch to form backside trenches 79 and edge seal trenches 179. Each of the backside trenches 79 and the edge seal trenches 179 can vertically extend from the top surface of the contact-level dielectric layer 73 at least to the top surface of the substrate (9, 10), and laterally extend through the memory array region 100 and the staircase region 300. The backside trenches 79 are trenches that are subsequently employed replace the material of the sacrificial material layers with an electrically conductive layers, such as word lines located between source and drain select gate electrodes. The edge seal trenches 179 are trenches that are subsequently employed to form components of edge seal structures that provide edge sealing to each semiconductor die 1000.

Figure 7A:
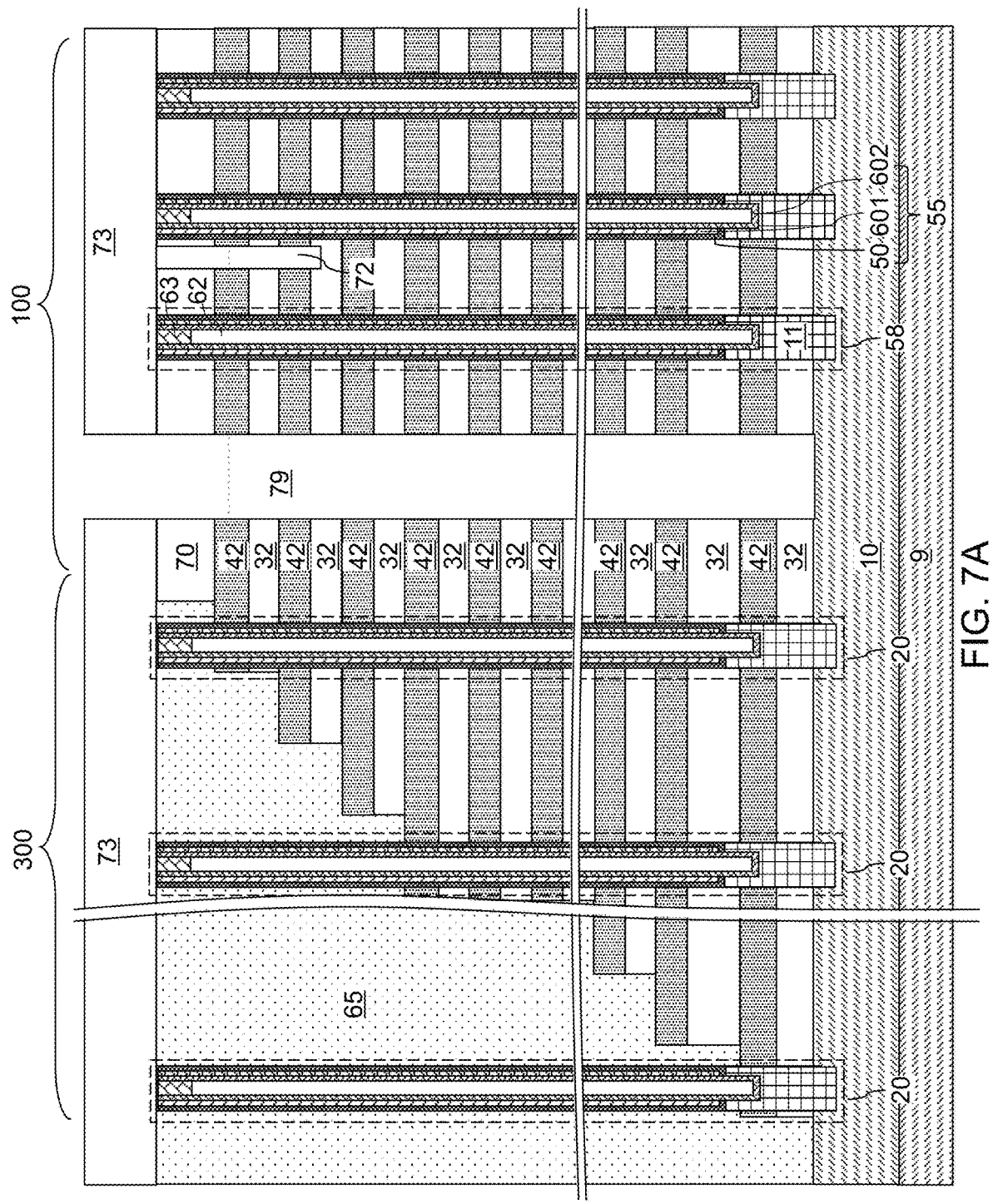
FIG. 7A is a schematic vertical cross-sectional view of a region of the first exemplary structure after formation of backside trenches according to an embodiment of the present disclosure.
Figure 7B:
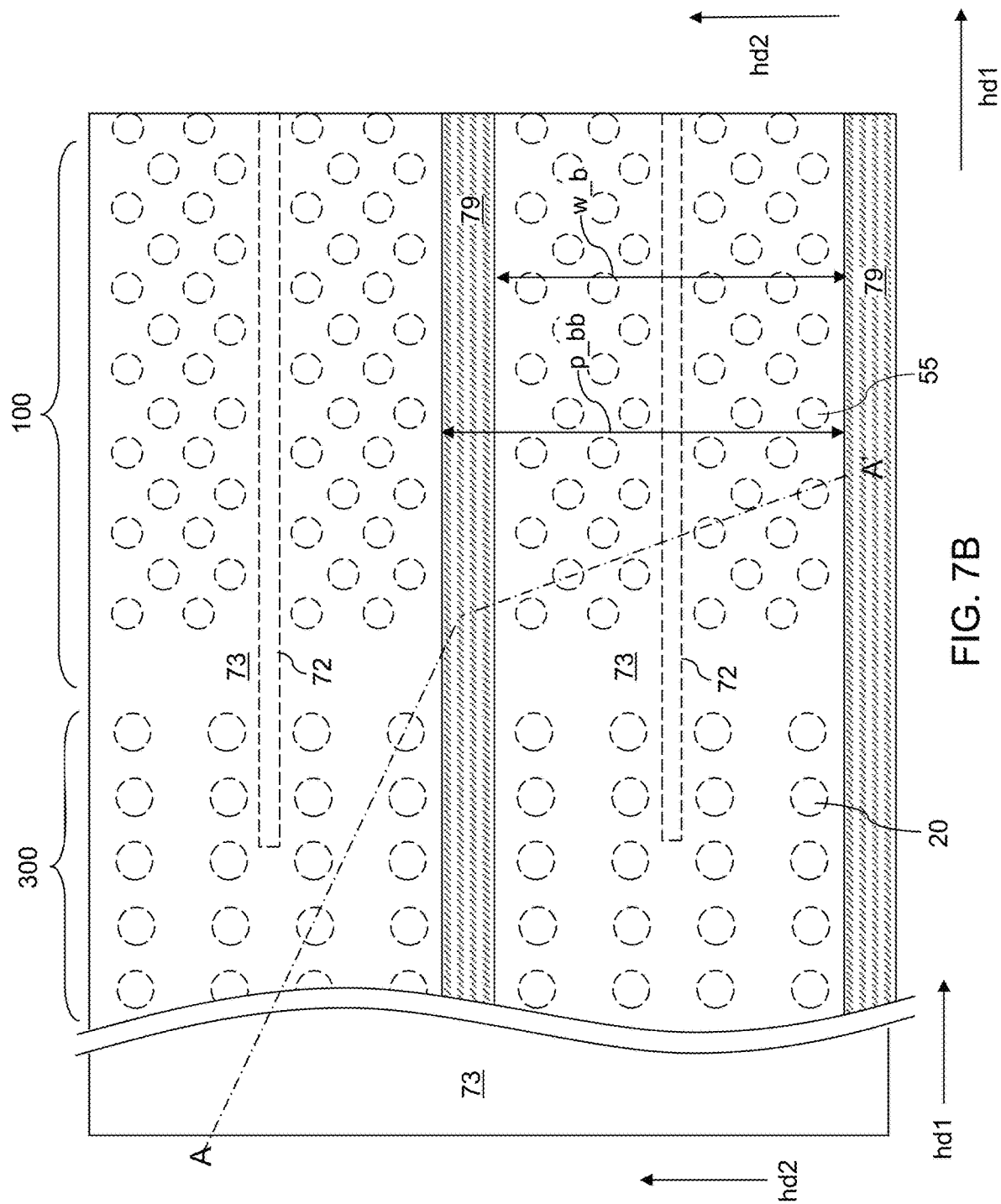
FIG. 7B is a partial see-through top-down view of the region of the first exemplary structure of FIG. 7A. The vertical plane A-A' is the plane of the schematic vertical cross-sectional view of FIG. 7A.
Figures 7C, 7D:
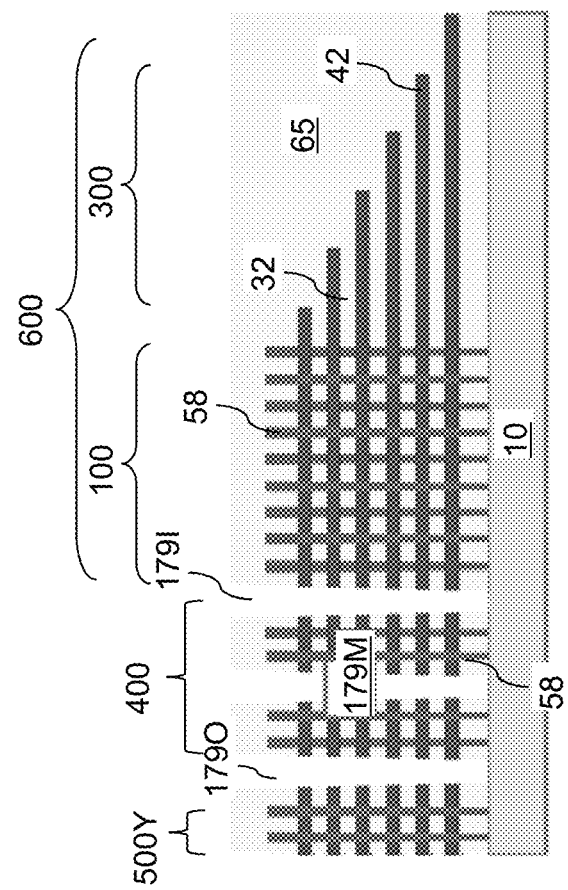
FIG. 7C is a vertical cross-sectional view of the first exemplary structure along a vertical plane after the processing steps of FIGS. 7A and 7B.
FIG. 7D is a vertical cross-sectional view of the first exemplary structure along another vertical plane after the processing steps of FIGS. 7A-7C.
Figure 7E:
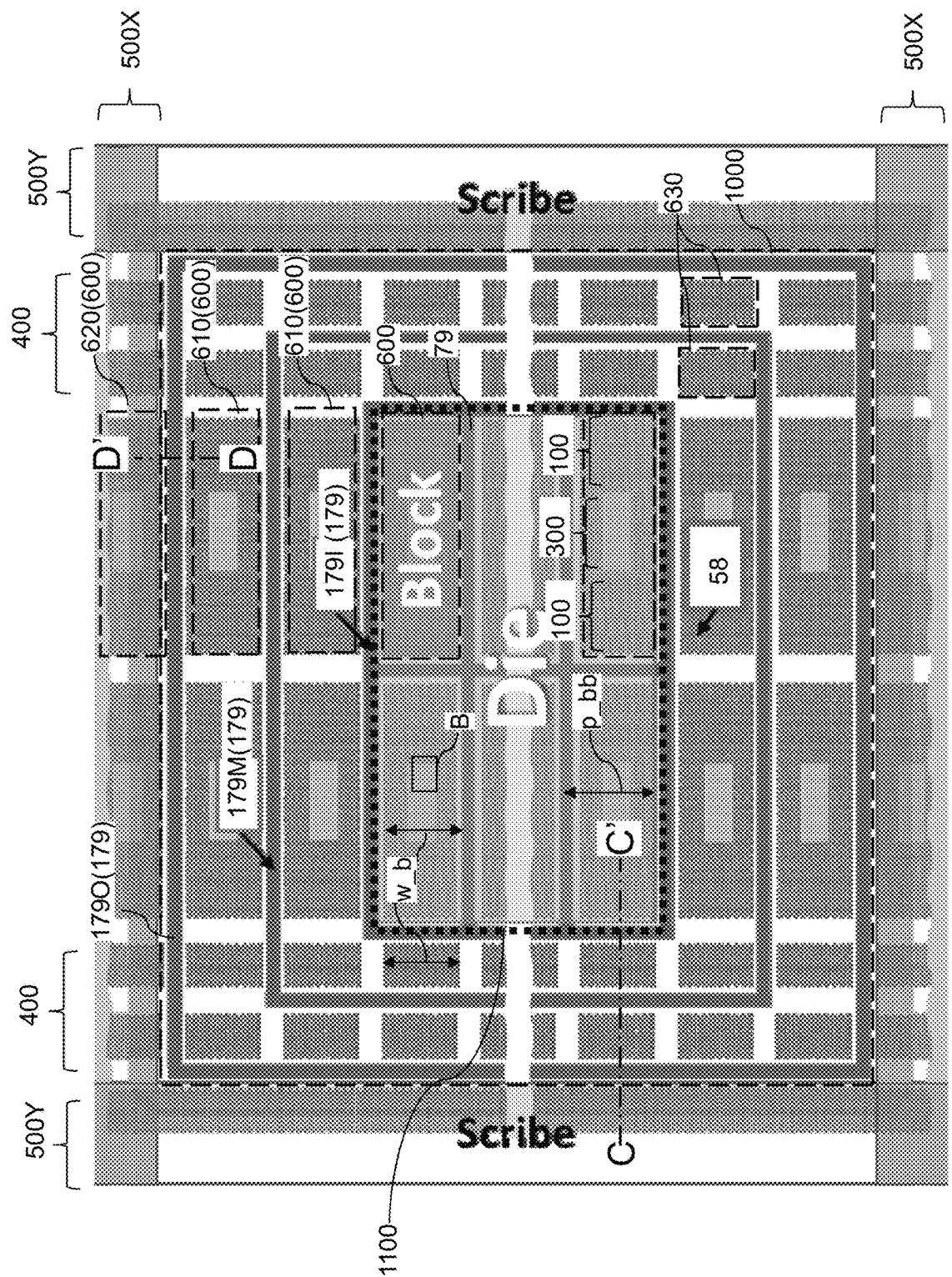
FIG. 7E is a top-down view of an exposure field and a surrounding area that includes dicing channel areas after the processing steps of FIGS. 7A-7D. The area B corresponds to the area of the view of FIG. 7B. The vertical plane C-C' is the plane of the vertical cross-sectional view of FIG. 7C. The vertical plane D-D' is the plane of the vertical cross-sectional view of FIG. 7D.
Figure 7F:
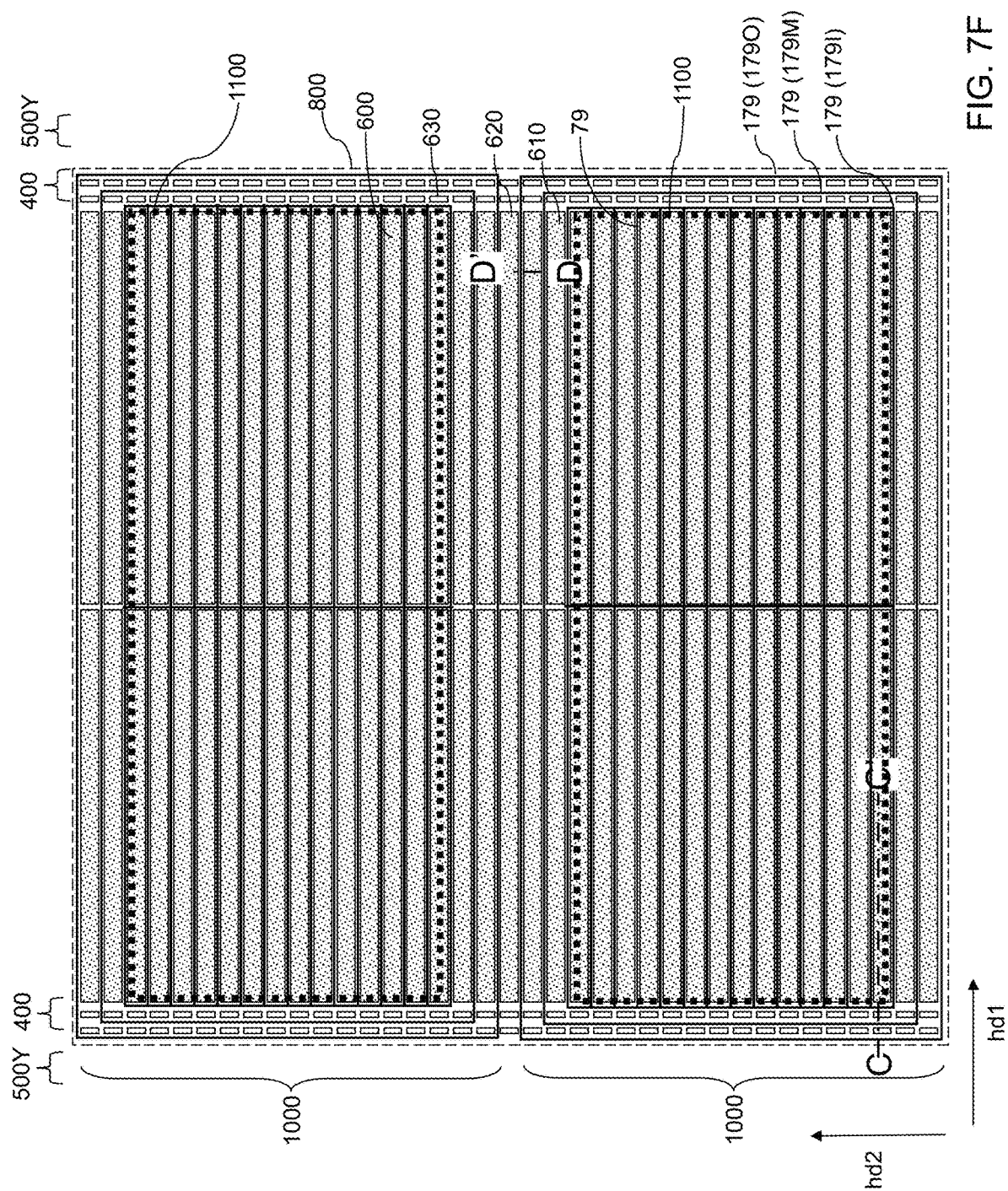
FIG. 7F is a top-down view of a first exemplary configuration for a lithographic exposure field within the first exemplary structure after the processing steps of FIGS. 7A-7D. The vertical plane C-C' is the plane of the vertical cross-sectional view of FIG. 7C. The vertical plane D-D' is the plane of the vertical cross-sectional view of FIG. 7D.
Figure 7G:
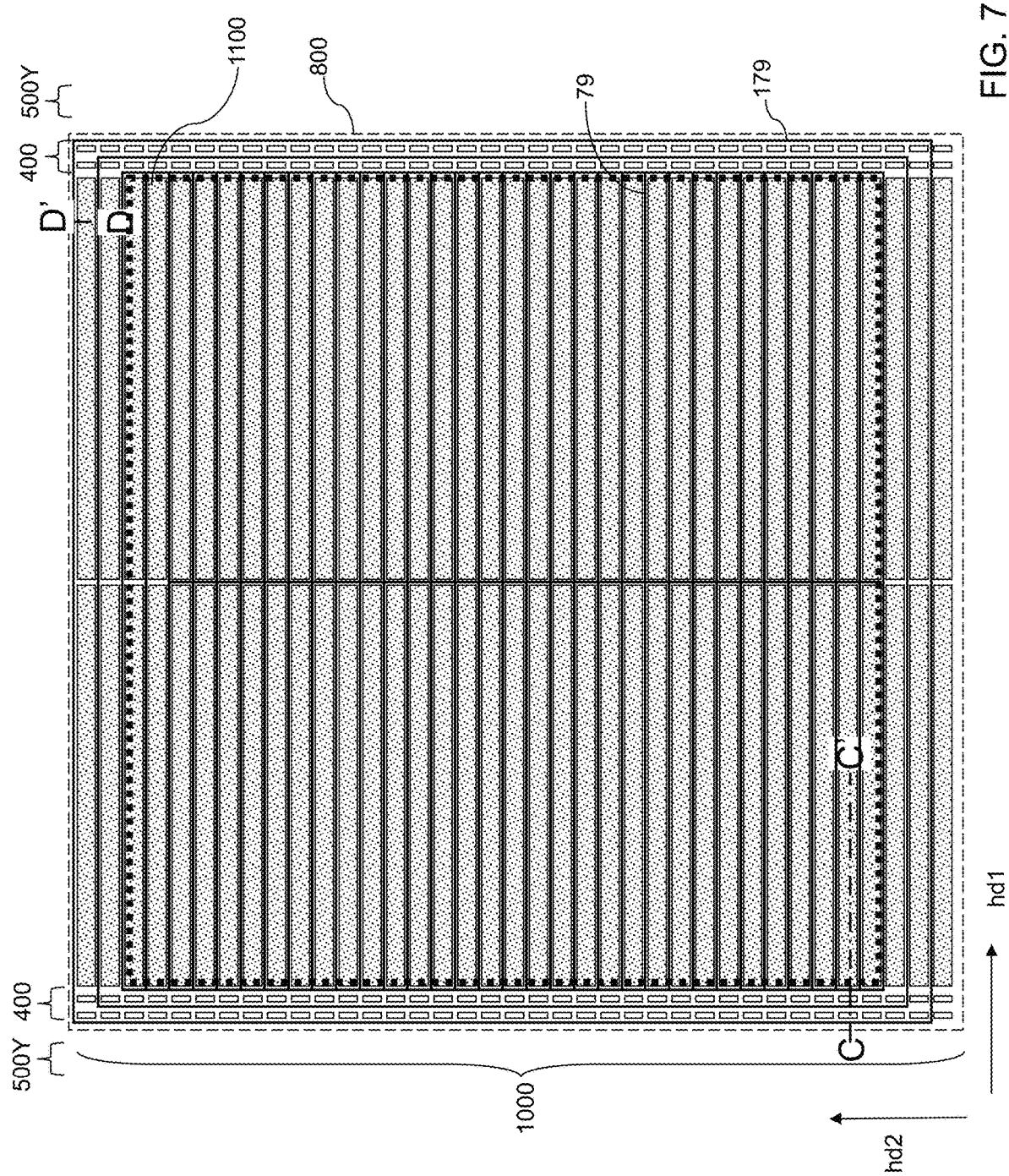
FIG. 7G is a top-down view of a second exemplary configuration for a lithographic exposure field within the first exemplary structure after the processing steps of FIGS. 7A-7D. The vertical plane C-C' is the plane of the vertical cross-sectional view of FIG. 7C. The vertical plane D-D' is the plane of the vertical cross-sectional view of FIG. 7D.

The pattern of the backside trenches 79 and the edge seal trenches 179 can be selected such that each semiconductor die 1000 has a suitable size that includes a target number of memory blocks 600. The target number of memory blocks 600, and the memory capacity of each semiconductor die 1000, can be determined at any time before formation of the backside trenches 79 and the edge seal trenches. According to an aspect of the present disclosure, it is possible to manufacture the first exemplary structure up to any processing step that precedes the processing steps of FIGS. 7A-7G without determining the size of the semiconductor dies 1000. Thus, a stockpile of semiconductor structures can be manufactured up the processing steps of FIGS. 6A-6D, and remain on standby until a decision on the size of each semiconductor die 1000 to be manufactured is made. If an order for manufacture of semiconductor dies 1000 with a large memory capacity (such a capacity of 1 TB) is received, a mask set configured to form semiconductor dies with the large memory capacity can be employed to form the backside trenches 79 and the edge seal trenches 179. In this case, each semiconductor die 1000 includes a sufficient number of memory blocks 600 that enables the target memory capacity. If an order for manufacture of semiconductor dies 1000 with a small memory capacity (such a capacity of 128 GB) is received, a maskset configured to form semiconductor dies with the small memory capacity can be employed to form the backside trenches 79 and the edge seal trenches 179. In this case, each semiconductor die 1000 includes only the number of memory blocks 600 that is sufficient to provide the target memory capacity. FIG. 7F illustrates a first exemplary configuration for the backside trenches 79 and the edge seal trenches 179 for forming two semiconductor dies 1000 within each lithographic exposure field 800. FIG. 7G illustrates a second exemplary configuration for the backside trenches 79 and the edge seal trenches 179 for forming a single semiconductor die 1000 within each lithographic exposure field 800.

Each of the vertically alternating sequences (32, 42) can be divided into multiple alternating sequences (32, 42) of insulating layers 32 and sacrificial material layers 42. For example, each memory block 600 may include a respective alternating sequence (32, 42) of insulating layers 32 and sacrificial material layers 42. In one embodiment, each alternating stack (32, 42) within a memory block 600 may be bounded by, and laterally surrounded entirely by, a respective set of backside trenches 79. The edge seal trenches 179 laterally surround a respective set of memory blocks 600 that are subsequently employed to provide electrically active memory planes within an active region 1100 containing one or more memory planes in a semiconductor die 1000.

According to an aspect of the present disclosure, the edge seal trenches 179 can be formed as sets of nested moat trenches that laterally surround, and enclose, a respective set of memory blocks 600 that are subsequently employed to provide electrically active memory planes in the active region 1100 within a semiconductor die 1000. In one embodiment, a set of at least two edge seal trenches 179 can laterally surround a set of memory blocks 600 that include all electrically active memory planes in the active region 1100 of a semiconductor die 1000. Each set of at least two edge seal trenches 179, such as three edge seal trenches, includes an inner edge seal trench 179I that is the innermost edge seal trenches 179, an outer edge seal trench 179O that is the outermost edge seal trench 179 and optionally one or more middle seal trenches 179M located between the inner and outer seal trenches.

In one embodiment, a dummy memory block 610 may be present between the inner edge seal trench 179I and the outer edge seal trench 179O. If the middle edge seal trench 179M is present, then respective dummy memory blocks 610 may be present between the middle edge seal trench 179M and respective inner and outer edge seal trenches. A scribe area memory block 620 can be present in the second scribe region 500X located between a neighboring pair of semiconductor dies 1000 separated along the second horizontal direction hd2. Optional additional dummy memory blocks 630 are located in the edge seal region 400 between the memory blocks 600 of the active region 1100 and the first scribe region 500Y. However, the first scribe region 500Y preferably lacks memory blocks. The dummy memory blocks 610, 630 and the scribe area memory blocks 620 are memory blocks that are not employed as electrically active components. Thus, the dummy memory blocks 610, 630 and the scribe area memory blocks 620 include memory stack structures 55 that that are not configured to store data bits. For example, the memory stack structures 55 in the dummy memory blocks 610, 630 and the scribe area memory blocks 620 may not be electrically connected to bit lines and/or may not be used by the controller (e.g., driver circuit) to store data bits. The dummy memory blocks 610, 630 are located inside a respective semiconductor die 1000. The areas of the scribe area memory blocks 620 can be provided within the area of a lithographic exposure field 800, and can be subsequently employed as second scribe region 500X in addition to the first scribe regions 500Y that may be provided at the periphery of each lithographic exposure field 800. The scribe area memory blocks 620 are located outside the semiconductor dies 1000, and may be subsequently removed during dicing of the semiconductor dies 1000 through the second scribe region 500X containing the scribe area memory blocks 620.

Generally, the pattern for the backside trenches 79 can be selected to enable subsequent replacement of the sacrificial material layers 42 in each memory block 600 with electrically conductive layers, which function as word lines or control gate electrode for a respective three-dimensional array of memory elements. In one embodiment, a subset of the backside trenches 79 can laterally extend along the first horizontal direction hd1 and can be laterally spaced apart from each other along the second horizontal direction hd2. Optionally, another subset of the backside trenches 79 can laterally extend along the second horizontal direction hd2 in the active region 1100 between adjacent memory blocks or planes. Generally, the configuration of the backside trenches 79 can be selected in any geometrical pattern that enables subsequent replacement of the sacrificial material layers 42 with electrically conductive layers. The memory stack structures 55 can be arranged in rows that extend along the first horizontal direction hd1. The drain select level isolation structures 72 can laterally extend along the first horizontal direction hd1 and separate the drain select gate electrodes in the same memory block 600. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Generally, backside trenches 79, an inner edge seal trench 179I, an outer edge seal trench 179O and optionally a middle edge seal trench 179M are formed through the vertically alternating sequence of insulating layers 32 and sacrificial material layers 42 within each semiconductor die 1000. The backside trenches 79, the inner edge seal trench 179I, the outer edge seal trench 179O, and the middle edge seal trench 179M can be formed simultaneously by an anisotropic etch process employing an etch mask (such as the photoresist layer) that includes openings in areas of backside trenches 79, the inner edge seal trench 179I, the outer edge seal trench 179O and the middle edge seal trench 179M. The inner edge seal trench 179I within each semiconductor die 1000 laterally encloses first clusters of the memory stack structures 55 that are contained within the memory blocks 600 that are electrically active memory blocks in the active region 1100 (i.e., that do not belong to the dummy memory blocks 610, 630 and the scribe area memory blocks 620).

In one embodiment, the backside trenches 79 comprise first backside trenches laterally extending along the first horizontal direction hd1 between neighboring pairs of the first clusters. In one embodiment, the backside trenches 79 may include second backside trenches that laterally extend along the second horizontal direction hd2, are located between memory planes, and contact a respective subset of the plurality of alternating stacks (32, 42).

The outer edge seal trench 179O within each semiconductor die 1000 laterally surrounds the inner edge seal trench 179I of the semiconductor die 1000. A second cluster of memory opening fill structures 58 (located within the dummy memory blocks 610) is present between each neighboring pair of segments of the inner edge seal trench 179I and the outer edge seal trench 179O that laterally extends along the first horizontal direction hd1.

In one embodiment, an inner edge seal trench 179I can laterally surround a plurality of alternating stacks (32, 42) of a set of memory blocks 600 continuously, and can include a pair of first inner edge seal segments that are parallel to the first horizontal direction hd1 and a pair of second inner edge seal segments that are perpendicular to the first horizontal direction hd1 (i.e., parallel to the second horizontal direction hd2). In one embodiment, an outer edge seal trench 179O can laterally surround the inner edge seal trench 179I continuously, and can include a pair of first outer edge seal segments that are parallel to the first horizontal direction hd1 and a pair of second outer edge seal segments that are perpendicular to the first horizontal direction hd1. In one embodiment, additional alternating stacks of insulating layers 32 and spacer material layers 42 can be located between a neighboring pair of edge seal trenches 179. For example, each edge seal region 400 can include a respective alternating stack of insulating layers 32 and spacer material layers 42. An array of memory stack structures 55 vertically extends through each alternating stack (32, 42) of insulating layers 32 and sacrificial material layers 42 in the memory blocks 600. Additional arrays of memory stack structures 55 vertically extend through the additional alternating stacks (32, 42) of insulating layers 32 and sacrificial material layers 42 in additional dummy memory blocks 630 in the edge seal regions 400.

In one embodiment, a center-to-center distance along the second horizontal direction hd2 between each neighboring pair of segments of the inner edge seal trench 179I and the outer edge seal trench 179O that laterally extend along the first horizontal direction hd1 can be the same as, or can be an integer multiple of, the uniform block-to-block pitch p_bb of the clusters of memory opening fill structures 58. In one embodiment, each of the plurality of alternating stacks (32, 42) in the memory blocks 600 can have a uniform block width w_b and uniform block-to-block pitch p_bb along the second horizontal direction hd2. In one embodiment, each of the additional alternating stacks of insulating layers 32 and sacrificial material layers 42 in the additional dummy memory blocks 630 in the edge seal regions 400 can have the uniform block width w_b along the second horizontal direction hd2, but a narrower width along the first horizontal direction hd1 than the other blocks (600, 610, 620).

In one embodiment, the lateral spacing along the second horizontal direction hd2 between the neighboring pair of first segments of the inner edge seal trench 179I and the first outer edge trench 179O that extend along the first horizontal direction hd1 can be greater than the lateral spacing between a neighboring pair of second segments of the inner edge seal trench 179I and the outer edge seal trench 179O that extend along the second horizontal direction hd2.

Figure 8:
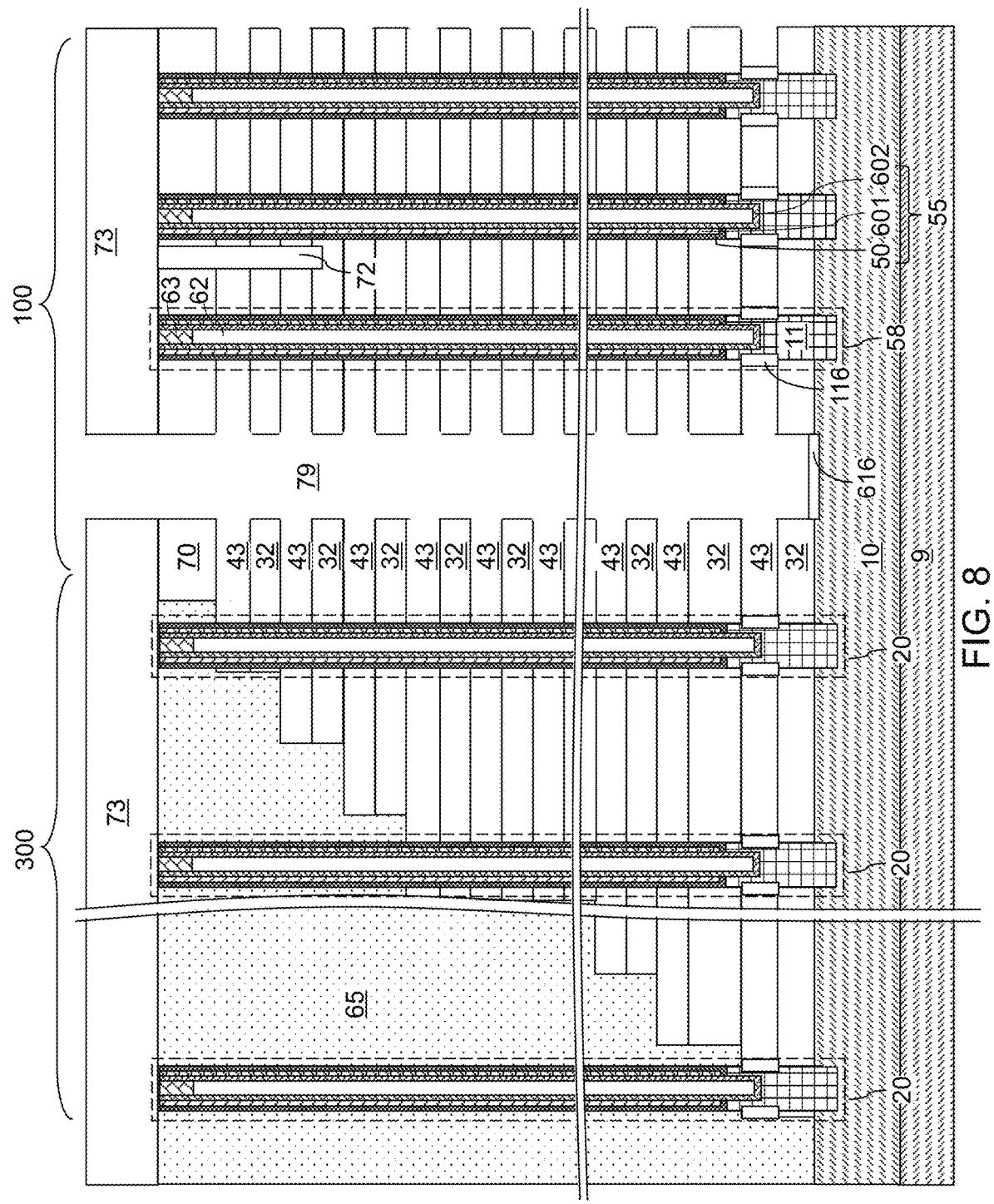
FIG. 8 is a schematic vertical cross-sectional view of a region of the first exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79 and the edge seal trenches 179, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79 and the edge seal trenches 179. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

In one embodiment, portions of the sacrificial material layers 42 that are more distal from a most proximal one of the backside trenches 79 and the edge seal trenches 179 may not be etched during the isotropic etch process. In this case, alternating stacks and insulating layers 32 and sacrificial material layers 42 may remain in such regions, which may include, for example, portions of the 602

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on sidewalls of the backside trenches 79 and the edge seal trenches 179. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79 and the edge seal trenches 179, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
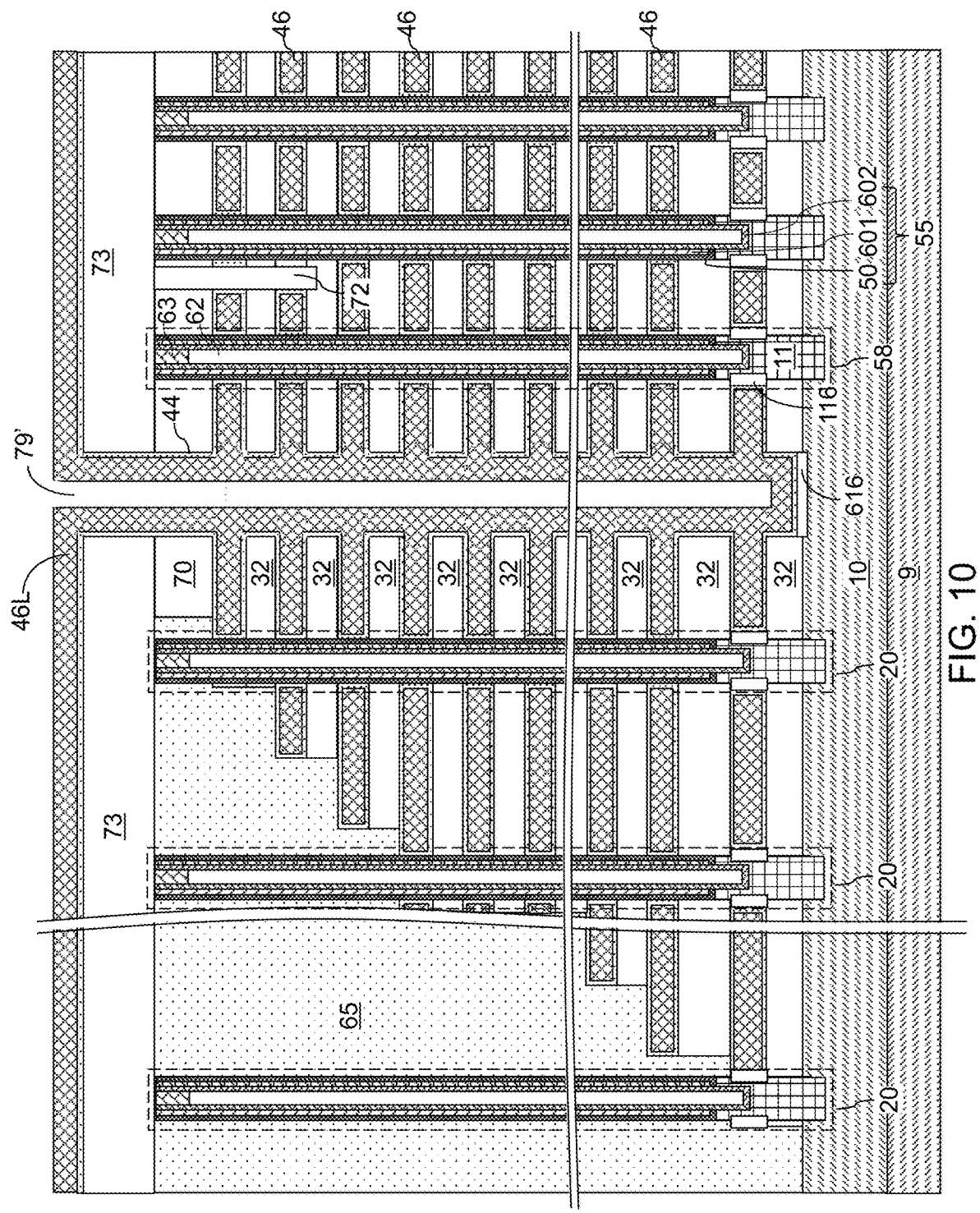
FIG. 10 is a schematic vertical cross-sectional view of a region of the first exemplary structure at the processing step of FIG. 9D.

Referring to FIGS. 9D and 10, a metal fill material is deposited in the plurality of backside recesses 43, on the sidewalls of the backside trenches 79 and the edge seal trenches 179, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of the backside trenches 79 and the edge seal trenches 179 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 and the edge seal trenches 179 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
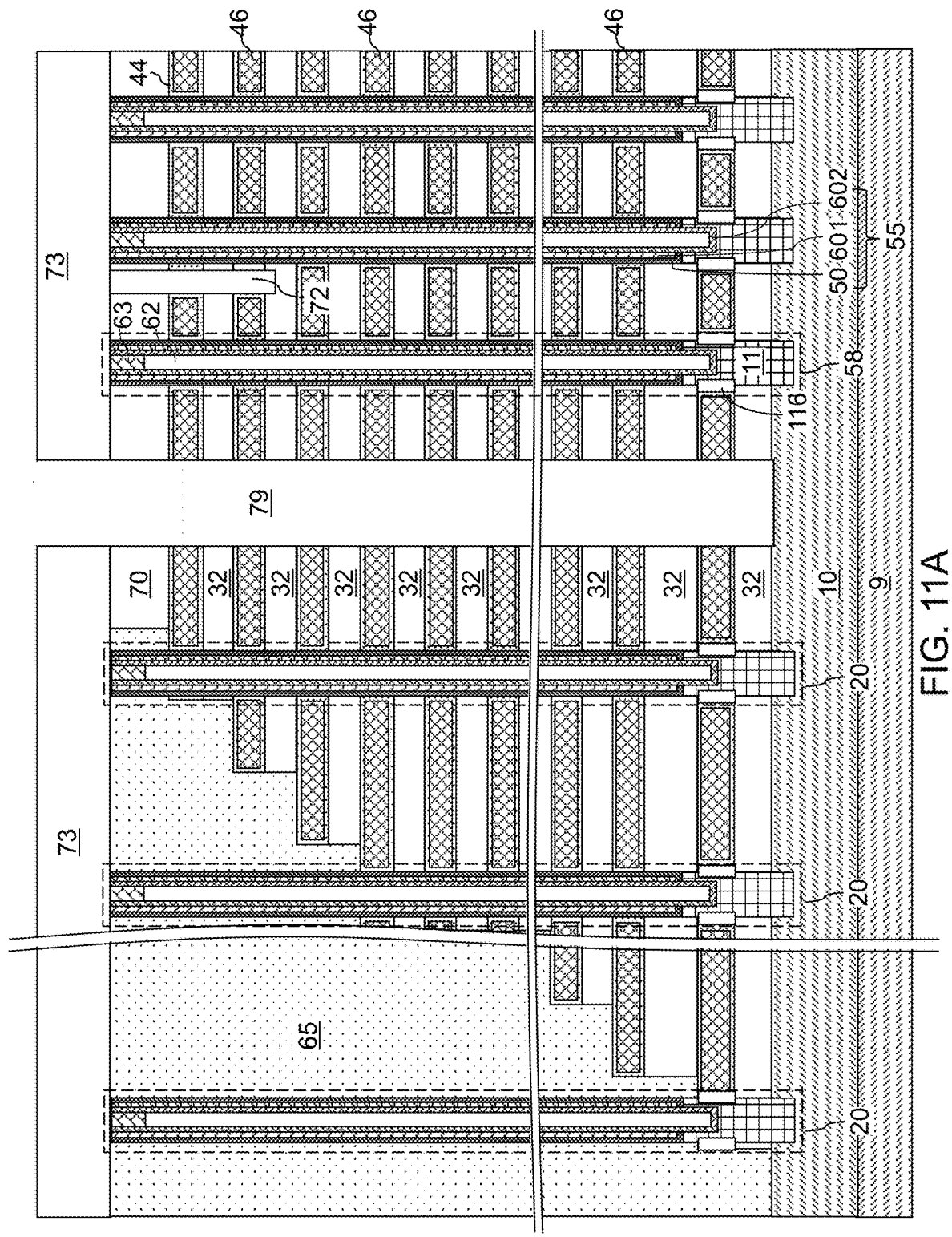
FIG. 11A is a schematic vertical cross-sectional view of a region of the first exemplary structure after removal of a deposited conductive material from within the backside trench according to an embodiment of the present disclosure.
Figure 11B:
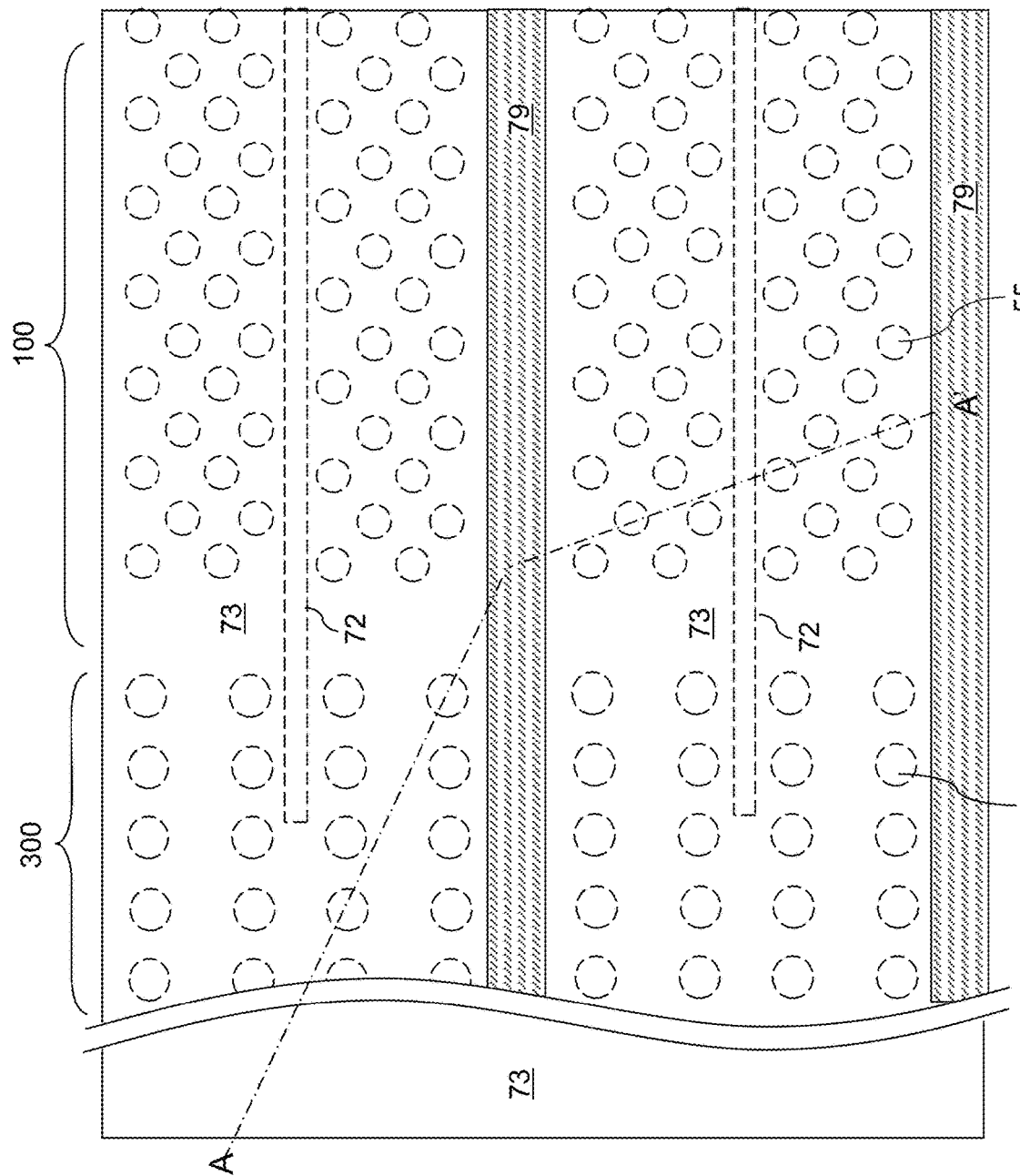
FIG. 11B is a partial see-through top-down view of a region of the first exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and the edge seal trenches 179 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Horizontal portion of the backside blocking dielectric layer 44 can be removed from the bottom portion of each of the backside trenches 79 and the edge seal trenches 179. The planar dielectric portions 616 can be removed during removal of the continuous electrically conductive material layer 46L. A backside cavity 79' is present within each backside trench 79. An edge seal cavity is present within each edge seal trench 179.

Referring to FIGS. 12A-12D, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer in a backside trench 79 constitutes a backside trench insulating spacer 74. Each remaining portion of the insulating material layer in the edge seal trench 179 constitutes an edge seal trench insulating spacer 174. A backside cavity is present within each volume surrounded by a backside trench insulating spacer 74. An edge seal cavity is present within each volume surrounded by an edge seal trench insulating spacer 174. A top surface of the semiconductor material layer 10 can be physically exposed at the bottom of each backside trench 79 and at the bottom of each edge seal trench 179.

Dopants of the second conductivity type can be implanted into surface portions of the semiconductor material layer 10 that underlie the backside trenches 79 and the edge seal trenches 179 before or after insulating spacer (74, 174) formation. A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the backside trench insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the backside trench insulating spacer 74. An isolation implantation region 172 can be formed underneath each of the edge seal trenches 179 by conversion of a respective surface portion of the semiconductor material layer 10 into doped semiconductor portions having a doping of the second conductivity type. Depending on the lateral distance between neighboring segments of the edge seal trenches 179, neighboring portions of the isolation implantation regions 172 may merge (as illustrated in FIG. 12C) or may not merge (as illustrated in FIG. 12D).

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. At least one bottommost electrically conductive layer 46 provided upon formation of the electrically conductive layers 46 within the alternating stack (32, 46) can comprise a source select gate electrode for the vertical NAND strings. At least one topmost electrically conductive layer 46 provided upon formation of the electrically conductive layers 46 within the alternating stack (32, 46) can comprise a drain select gate electrode for the vertical NAND strings. The electrically conductive layers 46 located between source and drain select gate electrodes comprise word lines. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

At least one conductive material can be deposited in the remaining unfilled volumes of the backside trenches 79 and the edge seal trenches 179. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each contiguous combination of a backside contact via structure 76 and a backside trench insulating spacer 74 constitutes a backside trench fill structure (74, 76). Each continuous portion of the at least one conductive material in the edge seal trenches 179 constitutes an edge seal conductive via structure 176. Each contiguous pair of an edge seal trench insulating spacer 174 and an edge seal conductive via structure 176 constitutes an edge seal trench fill structure 178.

Each backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Each edge seal conductive via structure 176 is located within a respective one of the edge seal trenches 179, and can contact a top surface of a respective one of the isolation implantation regions 172. Each isolation implantation region 172 can form lateral back-to-back p-n junctions with the semiconductor material layer 10 between the inside of a semiconductor die 1000 and the outside of the semiconductor die 1000. Lateral back-to-back p-n junctions can provide lateral electrical isolation within the edge seal regions including the edge seal trench fill structures 178.

Referring to FIGS. 13A-13D, additional contact via structures (88, 86) can be formed through the contact-level dielectric layer 73, and optionally through the retro-stepped dielectric material portion 65. For example, drain contact via structures 88 can be formed through the contact-level dielectric layer 73 on each drain region 63. The drain contact via structures 88 are not illustrated in FIGS. 13C and 13D for clarity. Word line contact via structures 86 can be formed on the electrically conductive layers 46 through the contact-level dielectric layer 73, and through the retro-stepped dielectric material portion 65.

Referring to FIGS. 14A and 14B, interconnect-level dielectric layers 960 and metal interconnect structures 980 can be formed over the contact-level dielectric layer 73. The interconnect-level dielectric layers can include multiple levels of dielectric material layers. The metal interconnect structures 980 can include drain contact via structures 88, bit lines 98, metal line structures 981, metal via structures 982, and metal bonding pads 983.

According to an aspect of the present disclosure, a subset of the metal interconnect structures 980 can be formed over each edge seal trench fill structure 178 such that the subset of the metal interconnect structures 980 continuously extends from the top surface of the respective edge seal trench fill structure 178 to the topmost surface of the interconnect-level dielectric layer 960 of each die 1000. Further, the subset of the metal interconnect structures 980 can continuously surround an entire volume of the interconnect-level dielectric layers 960 that is located within the area enclosed by the edge seal trench fill structure 178. Within each semiconductor die 1000, the set of all edge seal trench fill structures 178 and the subset of the metal interconnect structures 980 that overlie the edge seal trench fill structures 178 constitutes an edge seal structure 1010. The edge seal structure 1010 laterally surrounds the entire set of memory blocks 600 that are electrically active within the active region 1100 of the semiconductor die 1000, and can provide a continuous sealing surface without any opening therethrough between the horizontal plane including the top surface of the semiconductor material layer 10 and the horizontal plane including the topmost surface of the interconnect-level dielectric layers 960.

Generally, at least one trench fill material can be deposited in the backside trenches 79, the inner edge seal trench 179I, the outer edge seal trench 179O and optionally the middle edge seal trench 179M employing a same set of processing steps. An inner edge seal structure 101I comprises portions of the at least one trench fill material deposited in the inner edge seal trench 179I, an outer edge seal structure 101O comprises portions of the at least one trench fill material deposited in the outer edge seal trench 179O, and optionally, a middle edge seal structure 101M comprises portions of the at least one trench fill material deposited in the middle edge seal trench 179M.

The backside trench fill structures (74, 76) include first backside trench fill structures located in first backside trenches that laterally extend along the first horizontal direction hd1, and optionally second backside trench fill structures located in second backside trenches that laterally extend along the second horizontal direction hd2. Each first backside trench fill structure is located within a respective one of the first backside trenches, and each second backside trench fill structure is located within a respective one of the second backside trenches. Each of the backside trench fill structures (74, 76), the inner edge seal structure 101I, the outer edge seal structure 101O and the optional middle edge seal structure 101M comprise a same set of at least one trench fill material. The at least one trench fill material can comprise an insulating spacer material and at least one conductive fill material. The insulating spacer material is the material of the backside trench insulating spacers 74 and the edge seal trench insulating spacers 174. The insulating spacer material is located at a peripheral region of each of the backside trench fill structures (74, 76), the inner edge seal structure 101I, the outer edge seal structure 101O, and the middle edge seal structure 101M. The at least one conductive fill material can be embedded within the insulating spacer material, and can contact a top surface of the substrate (9, 10).

The inner edge seal structure 101I laterally surrounds a plurality of alternating stacks (32, 46) continuously, and includes a pair of first inner edge seal segments that are parallel to the first horizontal direction hd1 and a pair of second inner edge seal segments that are perpendicular to the first horizontal direction hd2. The outer edge seal structure 101O laterally surrounds the inner edge seal structure 101I continuously and includes a pair of first outer edge seal segments that are parallel to the first horizontal direction hd1 and a pair of second outer edge seal segments that are perpendicular to the first horizontal direction hd2. The optional middle edge seal structure 101M also laterally surrounds the inner edge seal structure 101I continuously and includes a pair of first outer edge seal segments that are parallel to the first horizontal direction hd1 and a pair of second outer edge seal segments that are perpendicular to the first horizontal direction hd2. Additional alternating stacks of insulating layers 32 and electrically conductive layers 46 contained within a dummy memory block 610 may be located between a neighboring pair of a respective one of the first inner edge seal segments and a respective one of the first outer edge seal segments.

Subsequently, the combination of the substrate (9, 10), remaining portions of the continuous insulating material layers 32, the electrically conductive layers 46, the clusters of memory opening fill structures 58, and the at least one trench fill material can be diced along the scribe regions 500X and 500Y which function as dicing channels. In one embodiment, the diced semiconductor die 1000 may comprise a memory die. In one embodiment, the scribe regions may be located at peripheral regions of each lithographic exposure field 800, and areas of the scribe area memory blocks 620 that are located within the scribe region 500X. All dicing channels (i.e., scribe regions 500X and 500Y) are located outside the outer edge seal trench 101O of each semiconductor die 1000.

In one embodiment, at least two clusters of memory opening fill structures 58 that are located outside the segments of the outer edge seal structures 101O and that laterally extend along the first horizontal direction hd1 are diced through during dicing of the combination. The at least two clusters of memory opening fill structures 58 can be located within two scribe area memory blocks 620. In another embodiment, support pillar structures 20 in addition to or instead of the memory opening fill structures 58 may be located in the scribe area memory blocks 620. The support pillar structures 20 may have the same configuration and materials as the memory opening fill structures 58, except that there may be no bit lines 98 that electrically contact the support pillar structures 20.

Figures 14C, 14D:
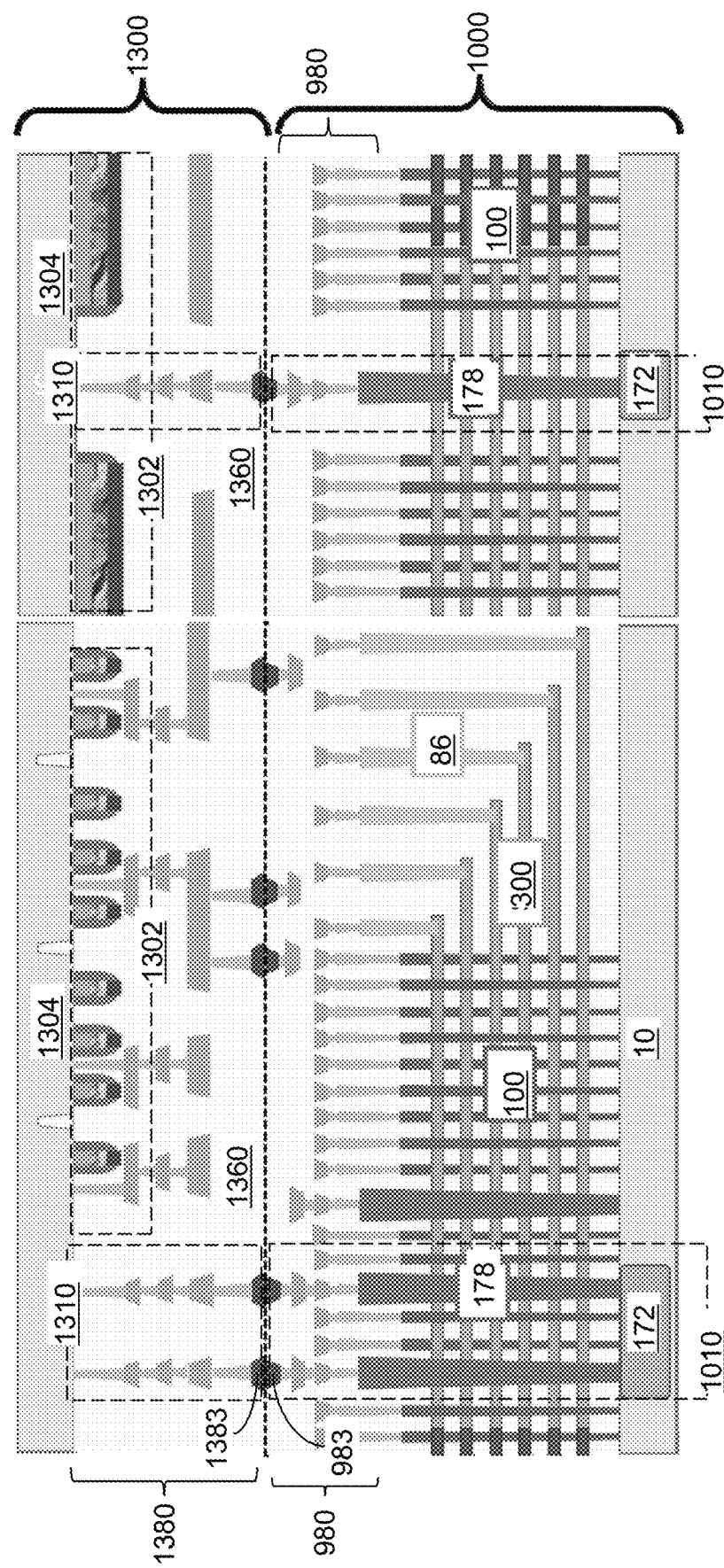
FIG. 14C is a vertical cross-sectional view of a region of the first exemplary structure along a vertical plane after bonding a driver circuit substrate according to an embodiment of the present disclosure.
FIG. 14D is a vertical cross-sectional view of a region of the first exemplary structure along another vertical plane after the processing steps of FIG. 14C.

Referring to FIGS. 14C and 14D, after dicing, the semiconductor die 1000 may be bonded to a logic die 1300 by metal to metal bonding, dielectric bonding or hybrid metal and dielectric bonding. The logic die 1300 may comprise a driver circuit (i.e., peripheral circuit) for the memory semiconductor die 1000. The logic die 1300 includes driver circuit devices 1302, such as transistors in a CMOS configuration, located over a driver circuit substrate 1304, which may comprise another silicon wafer or another handle substrate. The logic die 1300 also include metal interconnect structures 1380 embedded in an interconnect-level dielectric layer 1360. The metal interconnect structures 1380 may contact the nodes of the driver circuit devices 1302 and/or the driver circuit substrate 1304. The metal interconnect structures 1380 include logic die bonding pads 1383 which are bonded to the memory die bonding pads 983.

A subset of the metal interconnect structures 1380 in the logic die comprises logic edge seal structures 1310, which continuously extend from the logic die bonding pads 1383 which are located over the memory edge seal structures 1010 in the memory die 1000 to the surface of the logic die substrate 1304. Further, the logic edge seal structures 1310 can continuously surround an entire volume of the interconnect-level dielectric layers 1360 that is located within the area containing the driver circuit devices 1302 and corresponding to an area enclosed by the edge seal structures 1010 in the memory die 1000 below. Thus, the driver circuit devices 1302 are enclosed by the logic die edge seal structures 1310 which are bonded to the memory edge seal structures 1010 via respective bonding pads 1383, 983 to form continuous edge seal structures 1310, 1010 extending through both die 1300, 1000.

Figure 15B:
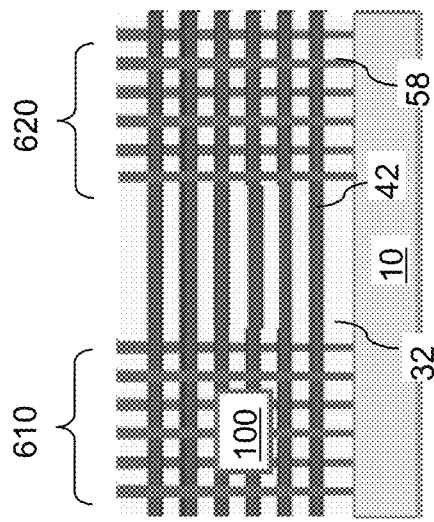
FIG. 15B is another vertical cross-sectional view of the second exemplary structure of FIG. 15A.
Figure 15A:
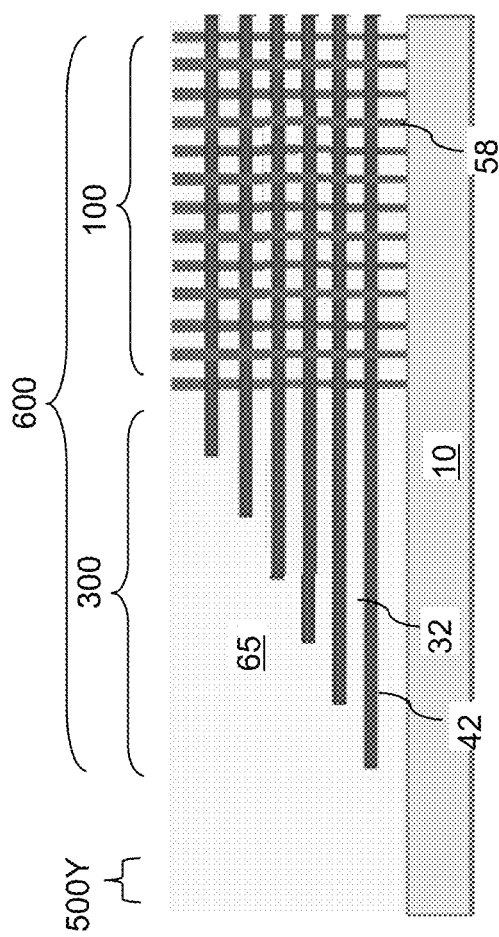
FIG. 15A is a vertical cross-sectional view of a second exemplary structure after formation of memory opening fill structures according to an embodiment of the present disclosure.

Referring to FIGS. 15A and 15B, a second exemplary structure according to a second embodiment of the present disclosure can be derived from the first exemplary structure by forming memory edge seal structures 1010 adjacent to the staircase regions 300 rather than through memory array regions 100 in the dummy memory blocks 610. The scribe regions 500Y in the scribe area memory blocks 620 are formed outside the edge seal structures 1010. The second exemplary structure illustrated in FIGS. 15A and 15B are at a processing step that corresponds to the processing step of FIGS. 6A-6D.

Figure 16B:
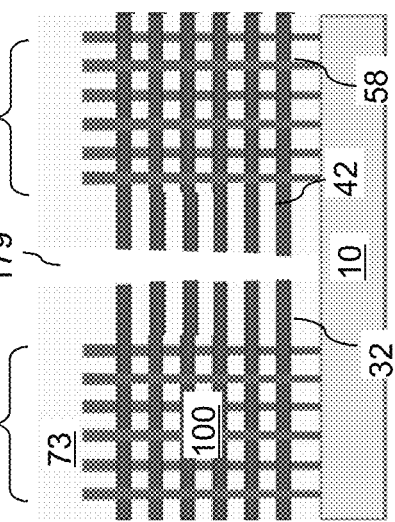
FIG. 16B is another vertical cross-sectional view of the second exemplary structure of FIG. 16A.
Figure 16A:
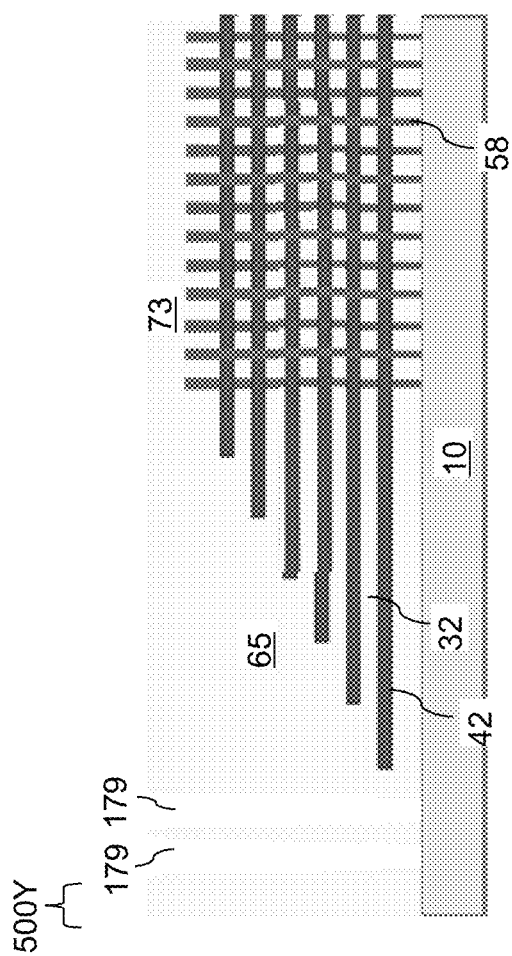
FIG. 16A is a vertical cross-sectional view of a second exemplary structure after formation of backside trenches and edge seal trenches according to an embodiment of the present disclosure.

Referring to FIGS. 16A and 16B, a contact-level dielectric layer 73, backside trenches 79, and the edge seal trenches 179 can be formed by performing the processing steps of FIGS. 7A-7G. In this embodiment, the edge seal trenches 179 can be formed through the retro-stepped dielectric material portions 65. The general layout of the backside trenches 79 and the edge seal trenches 179 may be the same as in the first exemplary structure illustrated in FIGS. 7A-7G.

Figure 12A:
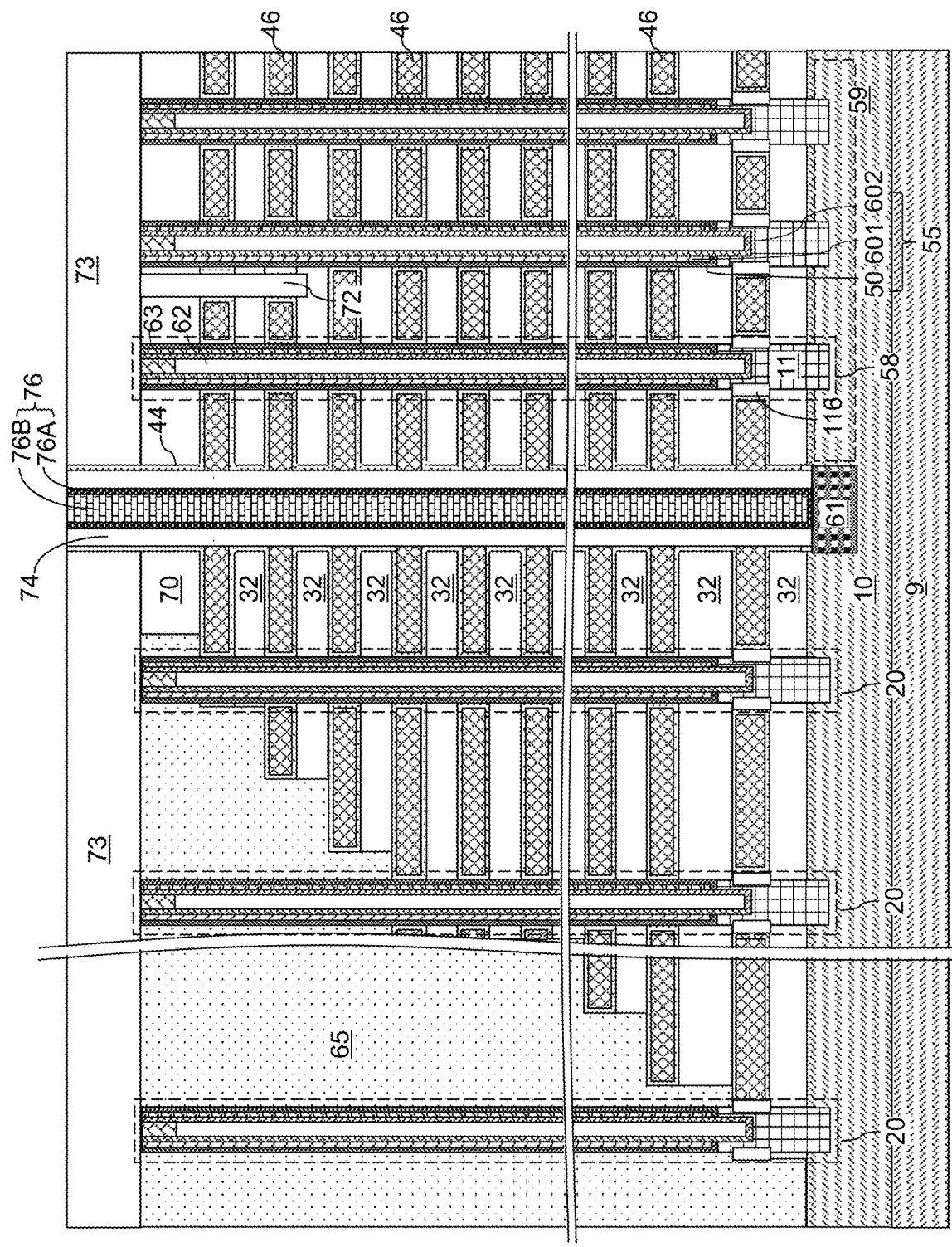
FIG. 12A is a schematic vertical cross-sectional view of a region of the first exemplary structure after formation of an insulating spacer and a backside contact structure according to an embodiment of the present disclosure.
Figure 17A:
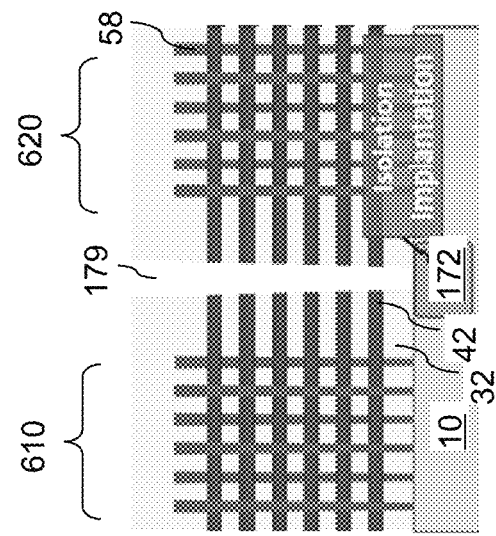
FIG. 17A is a vertical cross-sectional view of a second exemplary structure after formation of doped semiconductor regions by ion implantation according to an embodiment of the present disclosure.
Figure 17B:
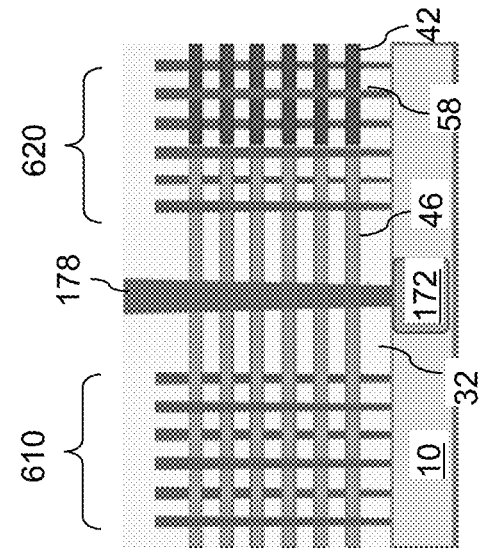
FIG. 17B is another vertical cross-sectional view of the second exemplary structure of FIG. 17A.

Referring to FIGS. 17A and 17B, dopants of the second conductivity type can be implanted into surface portions of the semiconductor material layer 10 as in the processing steps of FIGS. 12A-12C to form source regions 61 and isolation implantation regions 172. Optionally, formation of the source regions 61 and the isolation implantation regions 172 may be postponed until the processing steps of FIGS. 18A and 18B.

Figure 18A:
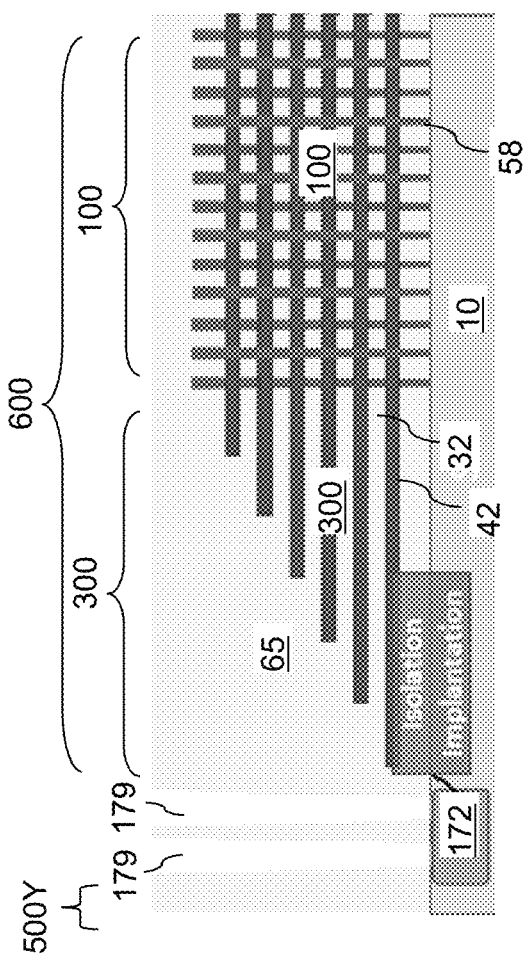
FIG. 18A is a vertical cross-sectional view of a second exemplary structure after replacement of sacrificial material layers with electrically conductive layers and formation of backside trench fill structures and etch seal trench fill structures according to an embodiment of the present disclosure.
Figure 18B:
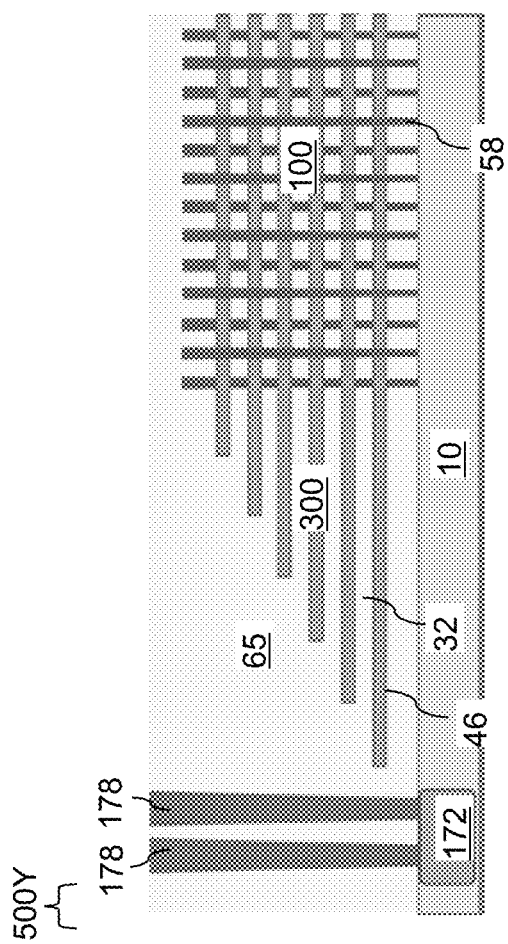
FIG. 18B is another vertical cross-sectional view of the second exemplary structure of FIG. 18A.

Referring to FIGS. 18A and 18B, portions of the sacrificial material layers 42 located within each outer edge seal trench 179O can be replaced with electrically conductive layers 46 by performing the processing steps of FIGS. 8-11B that are described above. Backside trench fill structures (74, 76) and edge seal trench fill structures 178 can be formed by performing the processing steps of FIGS. 12A-12D that are described above.

Figure 13A:
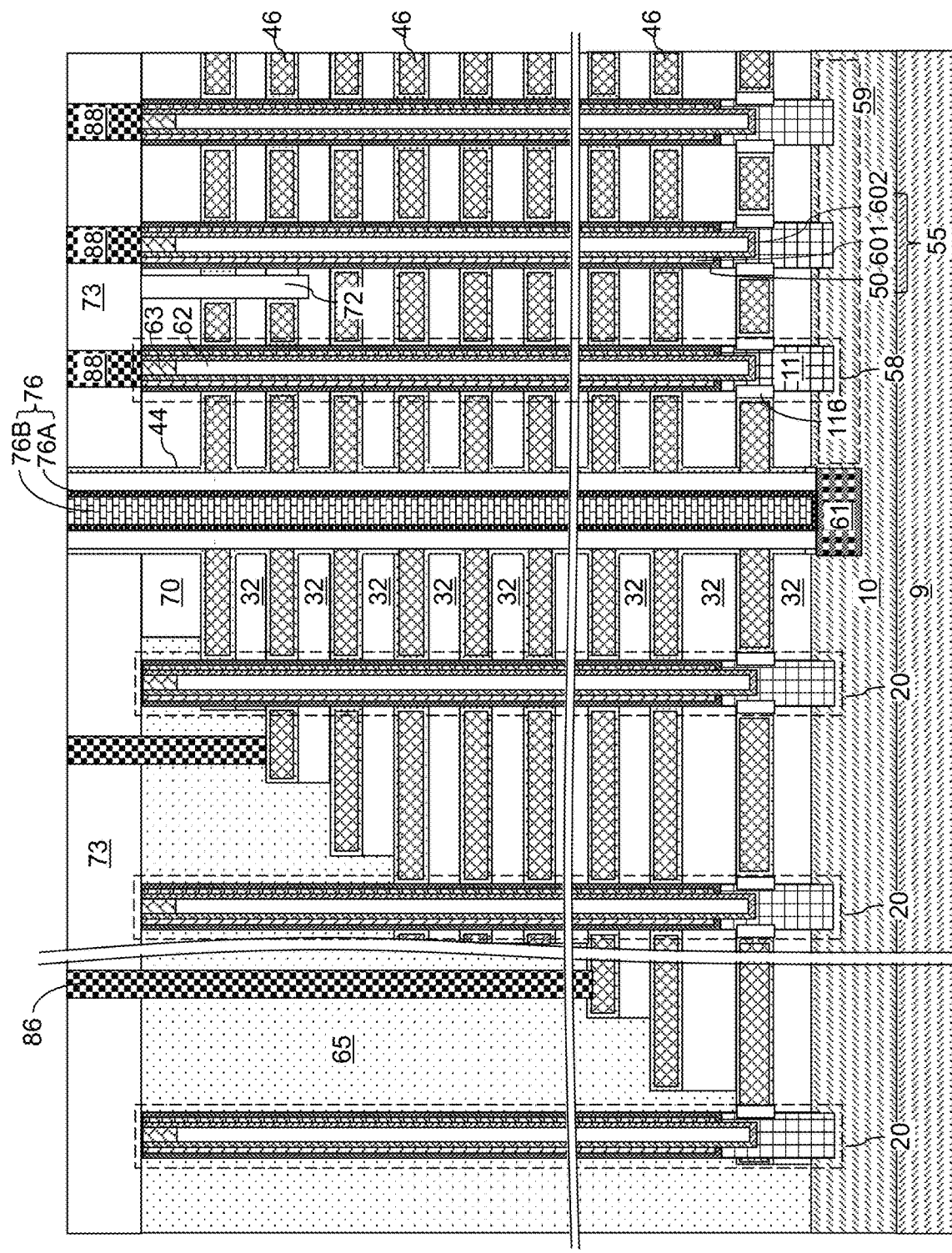
FIG. 13A is a schematic vertical cross-sectional view of a region of the first exemplary structure after formation of additional contact via structures according to an embodiment of the present disclosure.
Figure 13B:
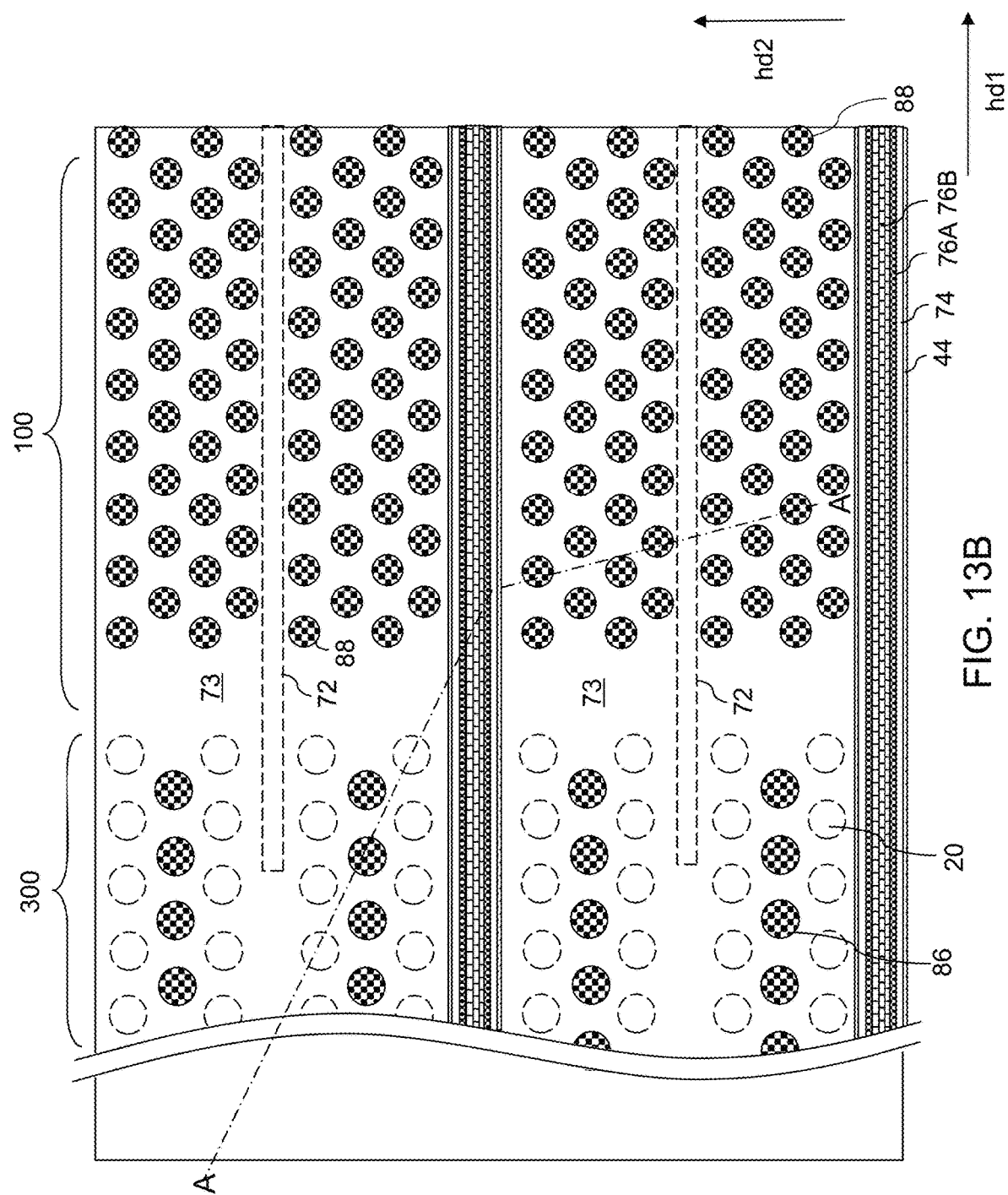
FIG. 13B is a top-down view of the first exemplary structure of FIG. 13A. The vertical plane A-A' is the plane of the schematic vertical cross-sectional view of FIG. 13A.
Figure 13D:
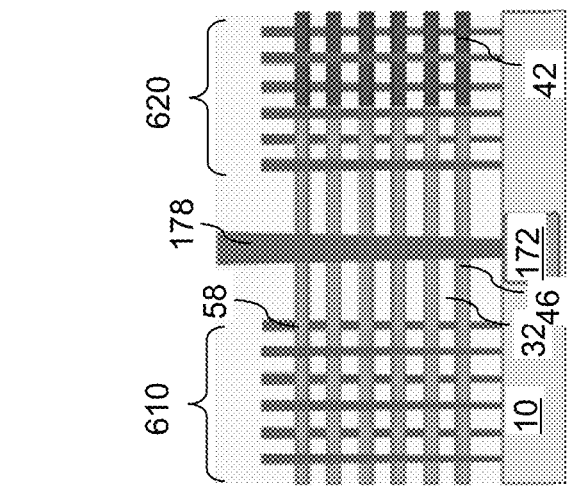
FIG. 13D is a vertical cross-sectional view of a region of the first exemplary structure along another vertical plane after the processing steps of FIGS. 13A-13C.
Figure 13C:
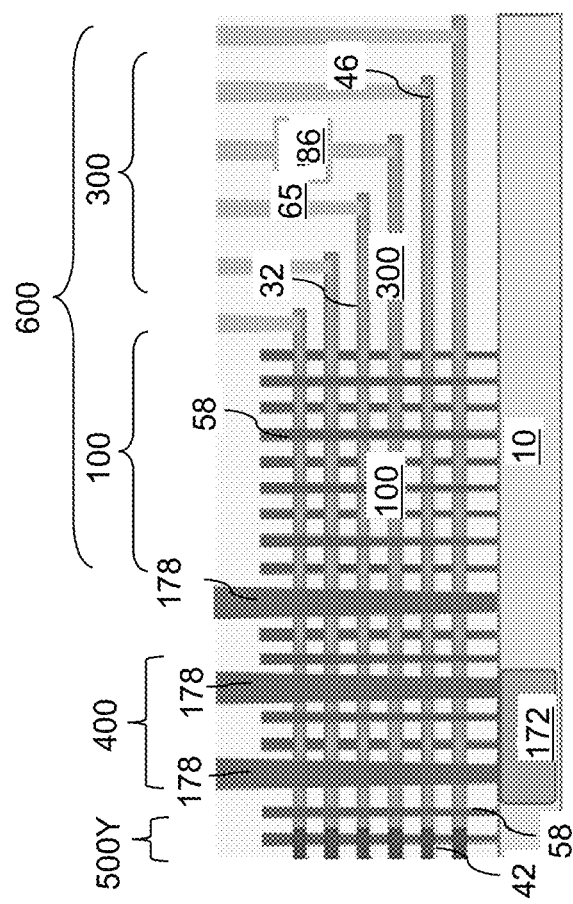
FIG. 13C is a vertical cross-sectional view of a region of the first exemplary structure along a vertical plane after the processing steps of FIGS. 13A and 13B.

Referring to FIGS. 19A and 19B, the processing steps of FIGS. 13A and 13B can be performed to form word line contact via structures 86. Drain contact via structures 88 (shown in FIG. 20B) may also be formed at this processing step.

Figure 20C:
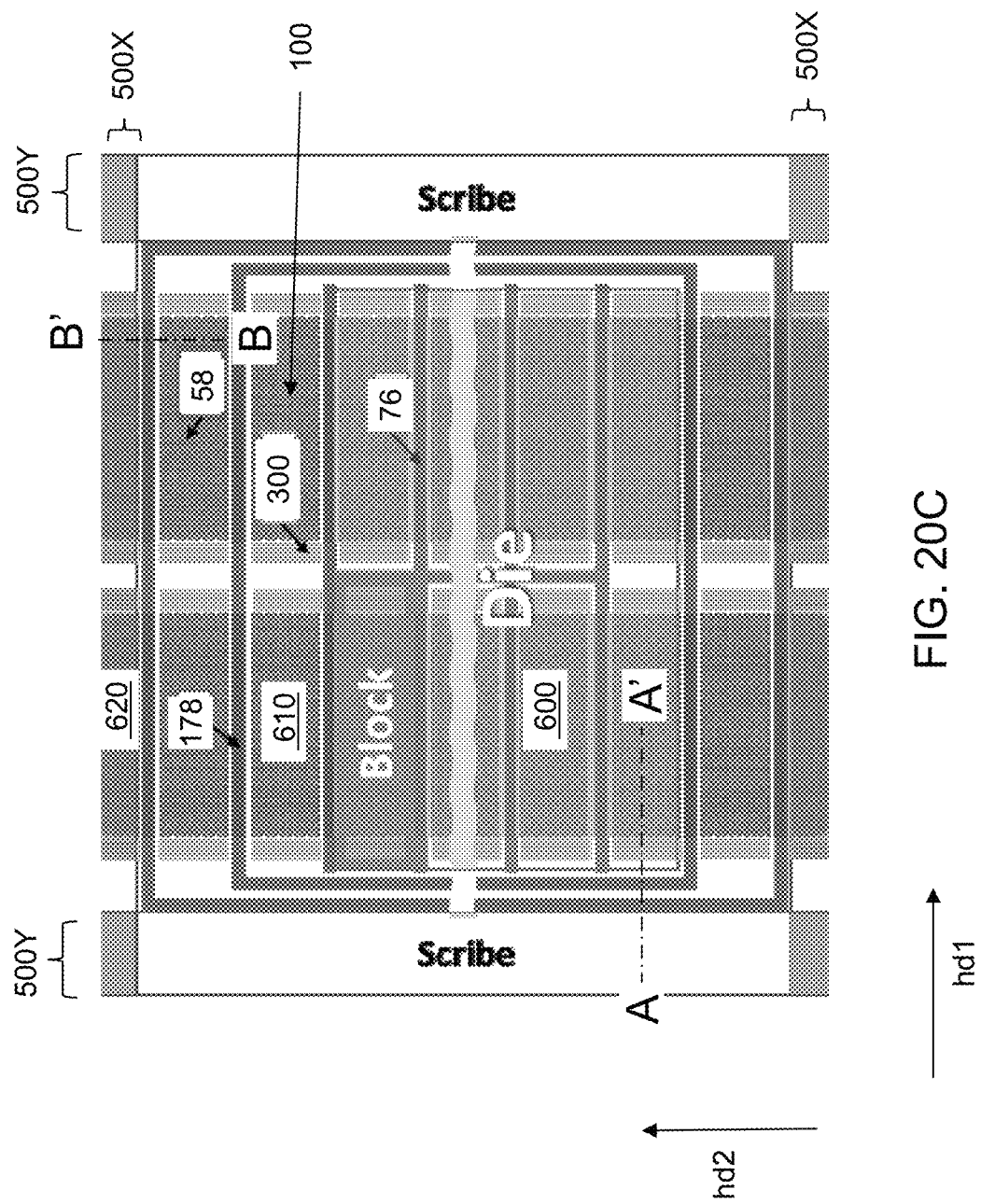
FIG. 20C is a top-down view of a die and surrounding dicing channels at the processing steps of FIGS. 20A and 20B.

Referring to FIGS. 20A-20C, the processing steps of FIGS. 14A-14D can be performed to form interconnect-level dielectric layers 960 and metal interconnect structures 980 over the contact-level dielectric layer 73. The interconnect-level dielectric layers can include multiple levels of dielectric material layers. The metal interconnect structures 980 can include bit lines 98, metal via structures, metal line structures, and metallic bonding pads. The logic die 1300 can then be bonded to the memory die 1000.

A subset of the metal interconnect structures 980 can be formed over each edge seal trench fill structure 178 such that the subset of the metal interconnect structures 980 continuously extends from the top surface of the respective edge seal trench fill structure 178 to the topmost surface of the interconnect-level dielectric layer 960. Further, the subset of the metal interconnect structures 980 can continuously surround an entire volume of the interconnect-level dielectric layers 960 that is located within the area enclosed by the edge seal trench fill structure 178. Within each semiconductor die 1000, the set of all edge seal trench fill structures 178 and the subset of the metal interconnect structures 980 that overlie the edge seal trench fill structures 178 constitutes an edge seal structure 1010. The edge seal structure 1010 laterally surrounds the entire set of memory blocks 600 that are electrically active within the active region 1100 of the semiconductor die 1000, and can provide a continuous sealing surface without any opening therethrough between the horizontal plane including the top surface of the semiconductor material layer 10 and the horizontal plane including the topmost surface of the interconnect-level dielectric layers 960. The edge seal structure 1010 of each semiconductor die 1000 can include an inner edge seal structure 101I and an outer edge seal structure 101O. Retro-stepped dielectric material portions 65 overlie stepped surfaces of a respective subset of the plurality of alternating stacks (32, 46). The second inner edge seal segments of the inner edge seal structure 101I (which extends along the second horizontal direction hd2) can contact a sidewall of a respective one of the retro-stepped dielectric material portions 65.

Referring to FIGS. 21A and 21B, a third exemplary structure according to a third embodiment of the present disclosure can be derived from the first exemplary structure by patterning the vertically alternating sequences (32, 42) to form both a dummy staircase region 300D in addition to the active staircase region 300 in the middle of the memory blocks 600, 610, 620 of the prior embodiments. In the active staircase region 300, the word lines and select gate electrodes 46 are electrically connected to respective word line contact via structures 86. In the dummy staircase region 300D, the word lines and select gate electrodes 46 are not connected to respective via structures. The third exemplary structure according to a third embodiment of the present disclosure can be derived from the second exemplary structure by forming memory edge seal structures 1010 adjacent to the dummy staircase region 300D rather than adjacent to the active staircase region 300. A dielectric material portion 165 is formed over the dummy staircase region 300D. The dielectric material portions 165 may include the same material as, and may be formed at the same processing step as, the retro-stepped dielectric material portions 65. The second exemplary structure illustrated in FIGS. 21A and 21B are at a processing step that corresponds to the processing step of FIGS. 6A-6D.

Referring to FIGS. 22A and 22B, a contact-level dielectric layer 73, backside trenches 79, and the edge seal trenches 179 can be formed by performing the processing steps of FIGS. 7A-7G. In this embodiment, the edge seal trenches 179 can be formed through the dielectric material portions 165. The general layout of the backside trenches 79 and the edge seal trenches 179 may be the same as in the first exemplary structure illustrated in FIGS. 7A-7G.

Figure 23B:
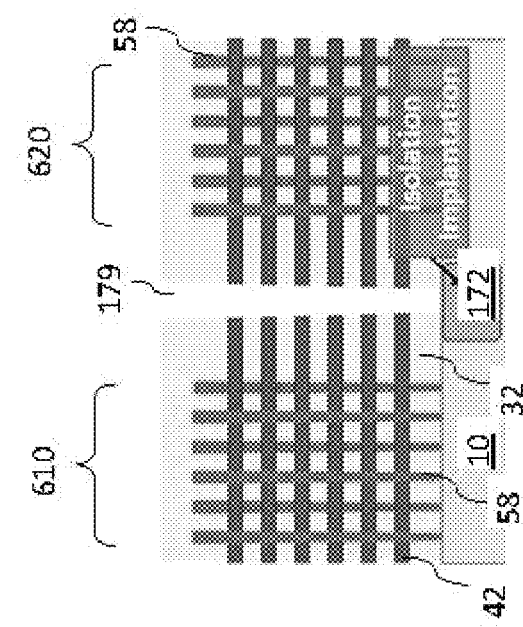
FIG. 23B is another vertical cross-sectional view of the third exemplary structure of FIG. 23A.
Figure 23A:
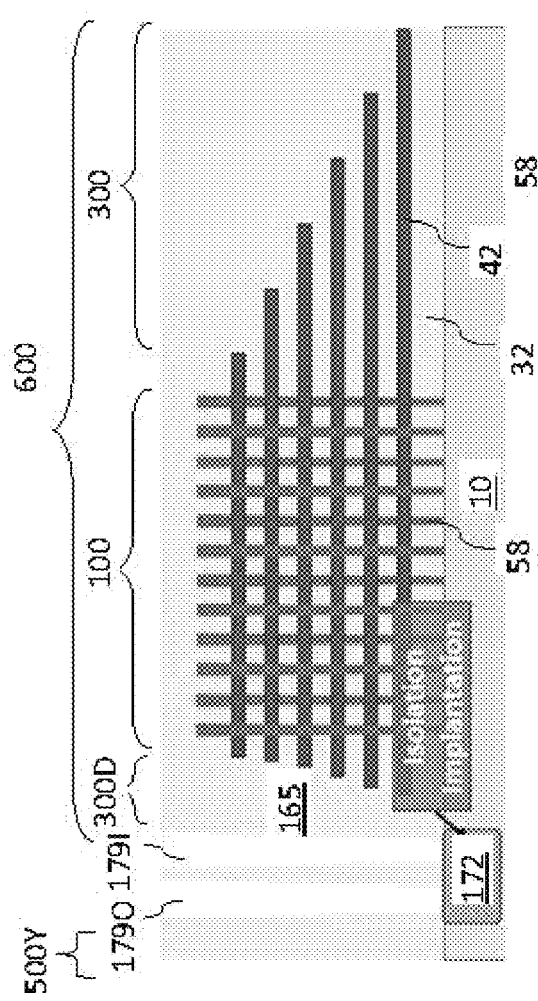
FIG. 23A is a vertical cross-sectional view of a third exemplary structure after formation of doped semiconductor regions by ion implantation according to an embodiment of the present disclosure.

Referring to FIGS. 23A and 23B, dopants of the second conductivity type can be implanted into surface portions of the semiconductor material layer 10 as in the processing steps of FIGS. 12A-12C to form source regions 61 and isolation implantation regions 172. Optionally, formation of the source regions 61 and the isolation implantation regions 172 may be postponed until the processing steps of FIGS. 24A and 24B.

Figure 24B:
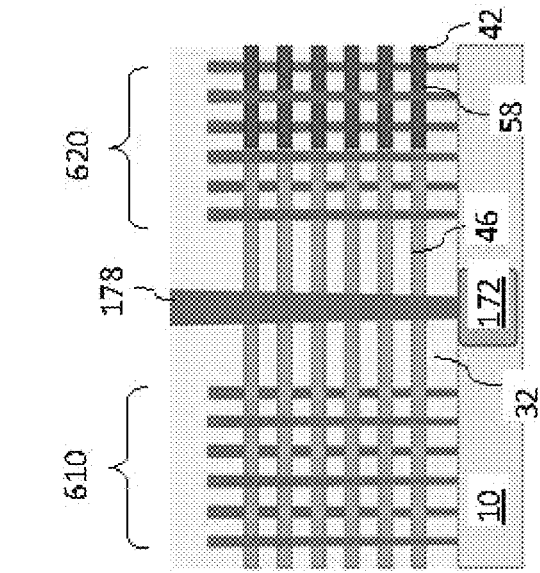
FIG. 24B is another vertical cross-sectional view of the third exemplary structure of FIG. 24A.
Figure 24A:
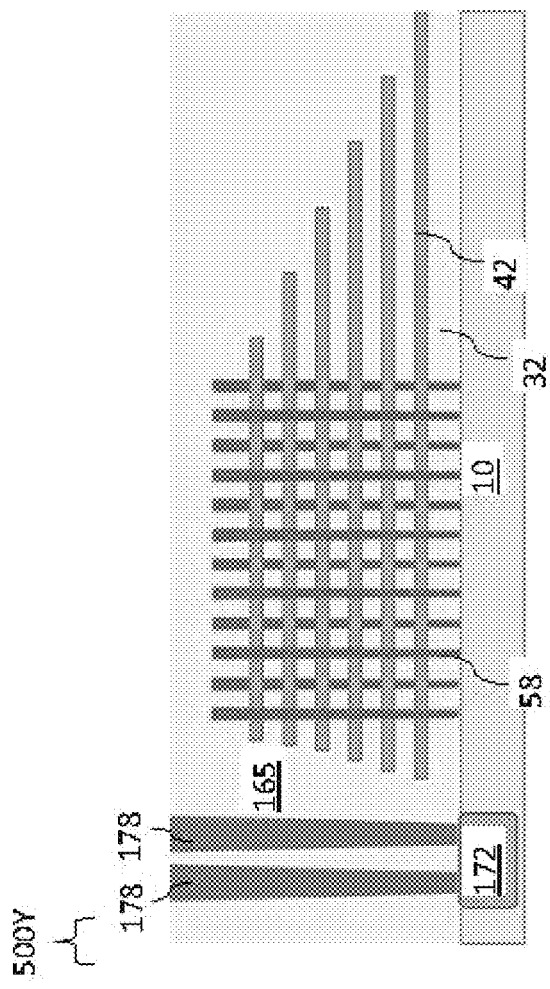
FIG. 24A is a vertical cross-sectional view of a third exemplary structure after replacement of sacrificial material layers with electrically conductive layers and formation of backside trench fill structures and etch seal trench fill structures according to an embodiment of the present disclosure.

Referring to FIGS. 24A and 24B, portions of the sacrificial material layers 42 located within each outer edge seal trench 179O can be replaced with electrically conductive layers 46 by performing the processing steps of FIGS. 8-11B that are described above. Backside trench fill structures (74, 76) and edge seal trench fill structures 178 can be formed by performing the processing steps of FIGS. 12A-12D that are described above.

Referring to FIGS. 25A and 25B, the processing steps of FIGS. 13A and 13B can be performed to form word line contact via structures 86. Drain contact via structures (not shown) may also be formed at this processing step.

Figure 26C:
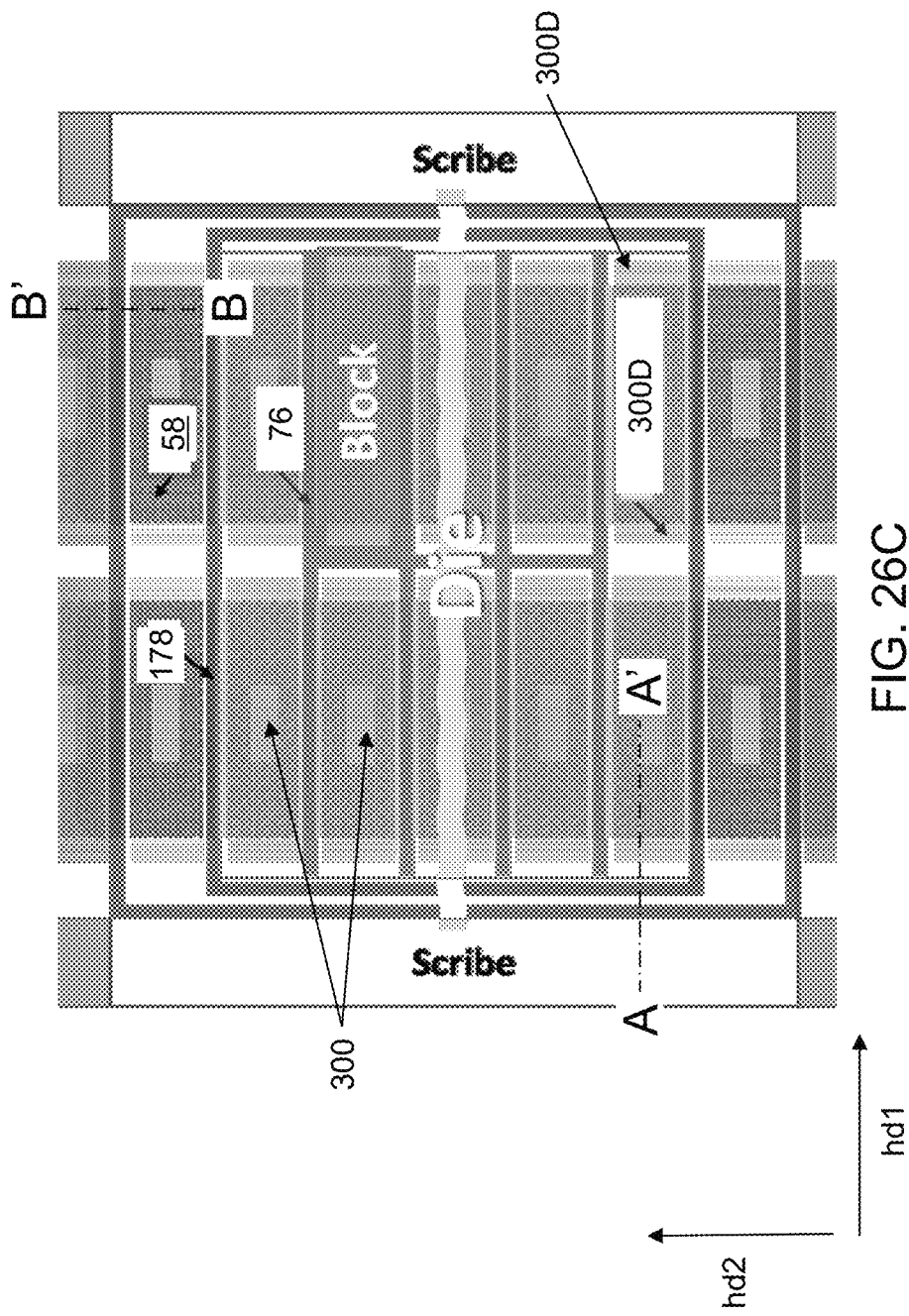
FIG. 26C is a top-down view of a die and surrounding dicing channels at the processing steps of FIGS. 26A and 26B.

Referring to FIGS. 26A-26C, the processing steps of FIGS. 14A-14D can be performed to form interconnect-level dielectric layers 960 and metal interconnect structures 980 over the contact-level dielectric layer 73. The interconnect-level dielectric layers can include multiple levels of dielectric material layers. The metal interconnect structures 980 can include bit lines, metal via structures, metal line structures, and metallic bonding pads. The logic die 1300 can then be bonded to the memory die 1000.

A subset of the metal interconnect structures 980 can be formed over each edge seal trench fill structure 178 such that the subset of the metal interconnect structures 980 continuously extends from the top surface of the respective edge seal trench fill structure 178 to the topmost surface of the interconnect-level dielectric layer 960. Further, the subset of the metal interconnect structures 980 can continuously surround an entire volume of the interconnect-level dielectric layers 960 that is located within the area enclosed by the edge seal trench fill structure 178. Within each semiconductor die 1000, the set of all edge seal trench fill structures 178 and the subset of the metal interconnect structures 980 that overlie the edge seal trench fill structures 178 constitutes an edge seal structure 1010. The edge seal structure 1010 laterally surrounds the entire set of memory blocks 600 that are electrically active within the semiconductor die 1000, and can provide a continuous sealing surface without any opening therethrough between the horizontal plane including the top surface of the semiconductor material layer 10 and the horizontal plane including the topmost surface of the interconnect-level dielectric layers 960. The edge seal structure 1010 of each semiconductor die 1000 can include an inner edge seal structure 101I and an outer edge seal structure 101O.

Figure 27B:
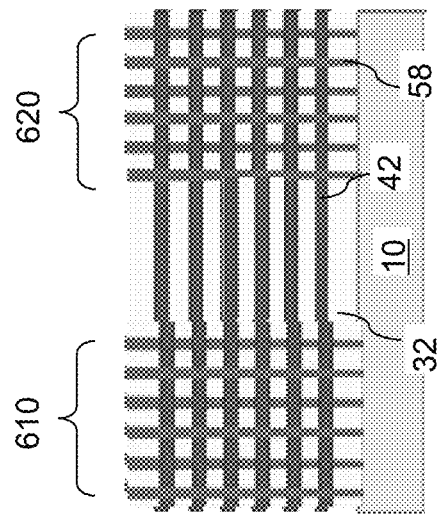
FIG. 27B is another vertical cross-sectional view of the fourth exemplary structure of FIG. 27A.
Figure 27A:
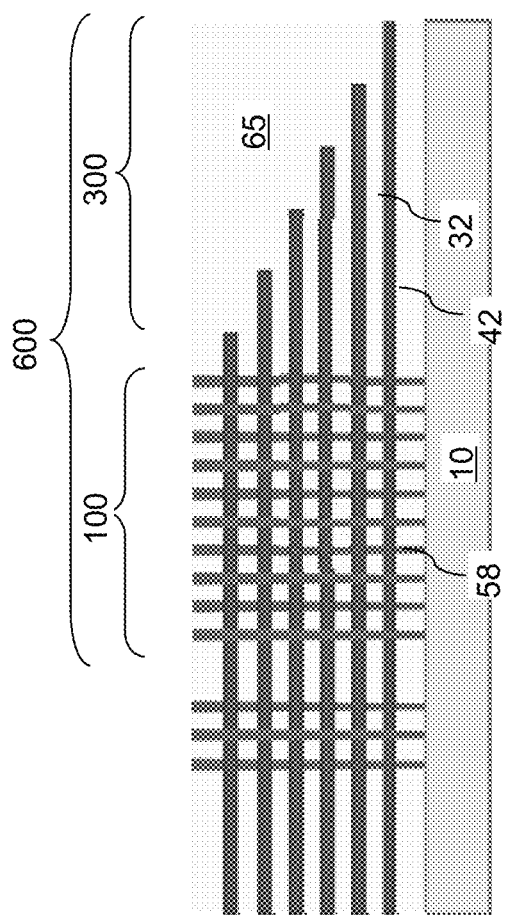
FIG. 27A is a vertical cross-sectional view of a fourth exemplary structure after formation of memory opening fill structures according to an embodiment of the present disclosure.

Referring to FIGS. 27A and 27B, a fourth exemplary structure according to a fourth embodiment of the present disclosure can be derived from the first exemplary structure by not replacing the sacrificial material layers 42 with electrically conductive layers 46 in the areas of the edge seal structures 1010. Thus, the edge seal trench fill structures 178 extend through an alternating stack of insulating layers 32 and sacrificial material layers 42, such as silicon nitride layers. The fourth exemplary structure illustrated in FIGS. 27A and 27B can be the same as the first exemplary structure illustrated in FIGS. 6A-6D.

Figure 28B:
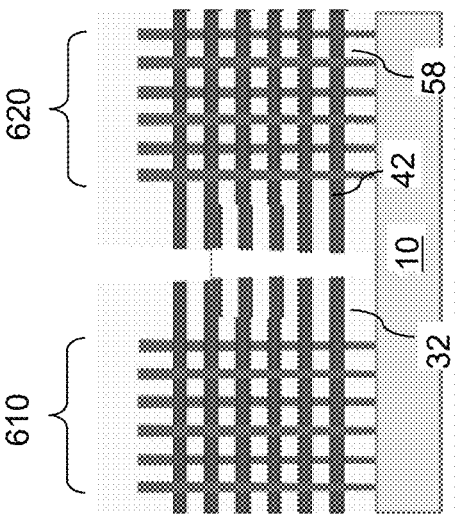
FIG. 28B is another vertical cross-sectional view of the fourth exemplary structure of FIG. 28A.
Figure 28A:
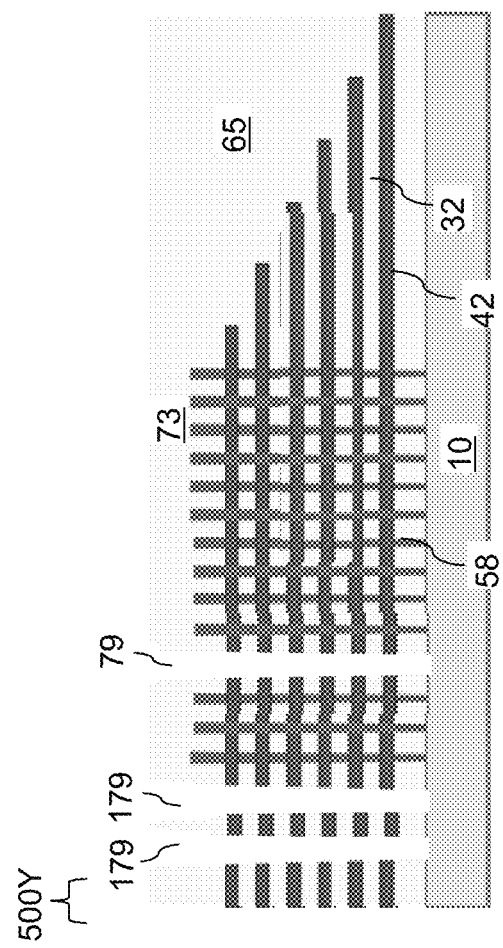
FIG. 28A is a vertical cross-sectional view of a fourth exemplary structure after formation of backside trenches and edge seal trenches according to an embodiment of the present disclosure.

Referring to FIGS. 28A and 28B, a contact-level dielectric layer 73, backside trenches 79, and the edge seal trenches 179 can be formed by performing the processing steps of FIGS. 7A-7G. In this embodiment, the edge seal trenches 179 can be formed through a respective vertically alternating sequence (32, 42). The layout of the edge seal trenches 179 may be the same as in the first exemplary structure illustrated in FIGS. 7D-7G. In this embodiment, the layout of the backside trenches 79 can be modified from the layout of illustrated in FIGS. 7E-7G such that a subset of the second backside trenches that laterally extend along the second horizontal direction hd2 and are proximal to the edge seal trenches 179 are omitted.

Figure 29A:
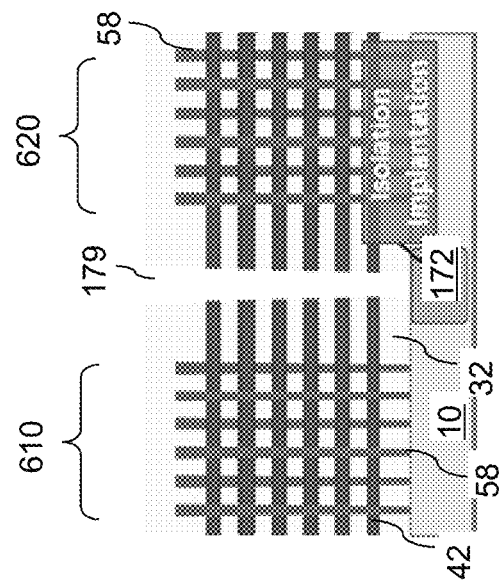
FIG. 29A is a vertical cross-sectional view of a fourth exemplary structure after formation of doped semiconductor regions by ion implantation according to an embodiment of the present disclosure.
Figure 29B:
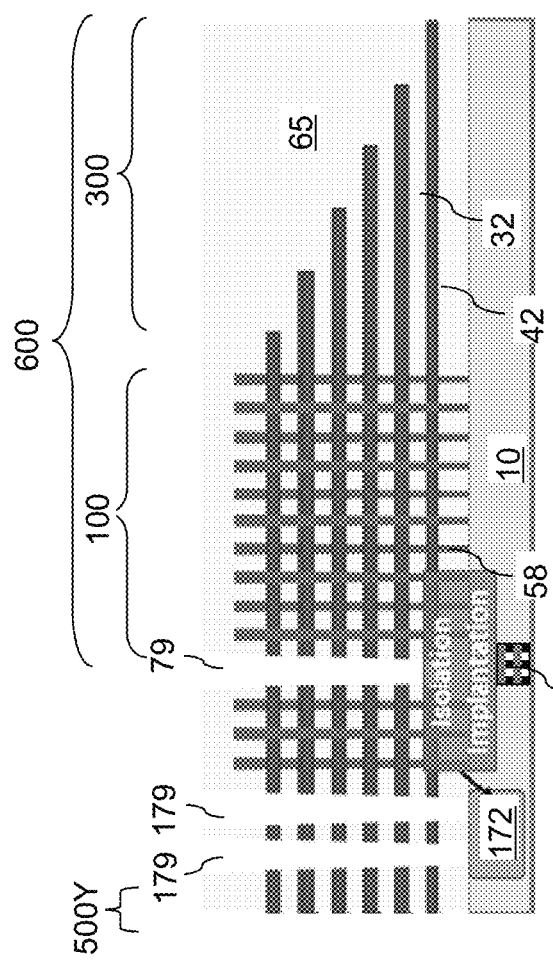
FIG. 29B is another vertical cross-sectional view of the fourth exemplary structure of FIG. 29A.

Referring to FIGS. 29A and 29B, dopants of the second conductivity type can be implanted into surface portions of the semiconductor material layer 10 as in the processing steps of FIGS. 12A-12C to form source regions 61 and isolation implantation regions 172. Optionally, formation of the source regions 61 and the isolation implantation regions 172 may be postponed until the processing steps of FIGS. 30A and 30B.

Figure 30A:
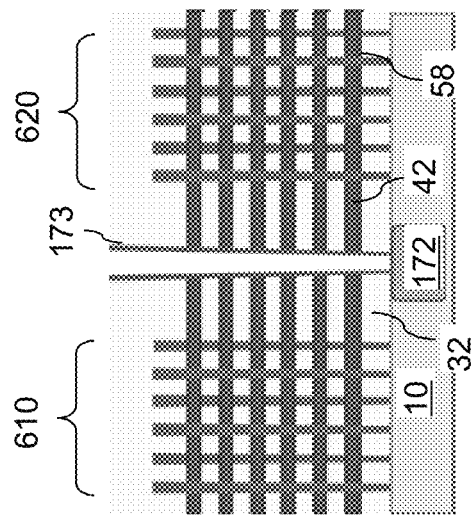
FIG. 30A is a vertical cross-sectional view of a fourth exemplary structure after formation of barrier dielectric spacers according to an embodiment of the present disclosure.
Figure 30B:
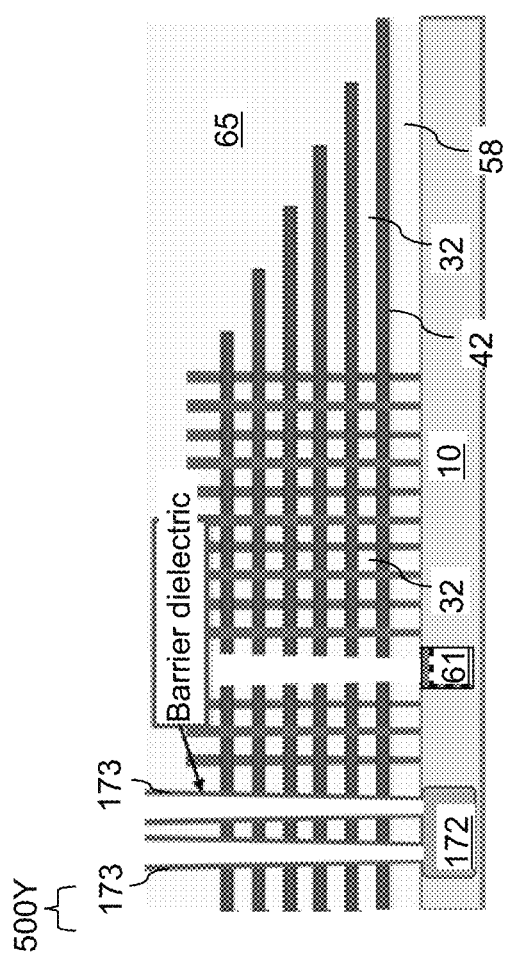
FIG. 30B is another vertical cross-sectional view of the fourth exemplary structure of FIG. 30A.

Referring to FIGS. 30A and 30B, a barrier dielectric material such as silicon oxide can be conformally deposited at least in the edge seal trenches 179 and optionally in the backside trenches 79. An anisotropic etch process such as a reactive ion etch process can be performed to remove horizontal portions of the barrier dielectric material. Remaining vertical portions of the barrier dielectric material constitute barrier dielectric spacers 173. An inner barrier dielectric spacer and an outer barrier dielectric spacer can be formed within each edge seal trench 179. The thickness of each barrier dielectric spacer 173 can be selected such that the barrier dielectric spacers 173 effectively function as an etch barrier. For example, each barrier dielectric spacer 173 may include silicon oxide and may have a thickness in a range from 30 nm to 600 nm. Formation of additional barrier dielectric spacers in the backside trenches 79 can be prevented, for example, by filling the backside trenches 79 with a sacrificial material (such as amorphous silicon or amorphous carbon) prior to deposition of the barrier dielectric material. The sacrificial material can be removed from the backside trenches 79 after formation of the barrier dielectric spacers 173.

Figure 31A:
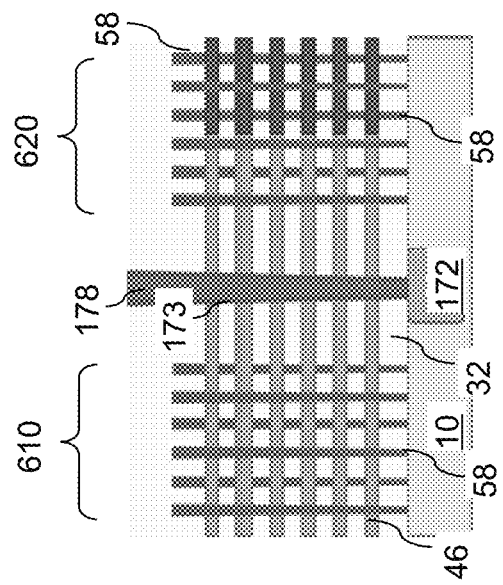
FIG. 31A is a vertical cross-sectional view of a fourth exemplary structure after replacement of sacrificial material layers with electrically conductive layers and formation of backside trench fill structures and etch seal trench fill structures according to an embodiment of the present disclosure.
Figure 31B:
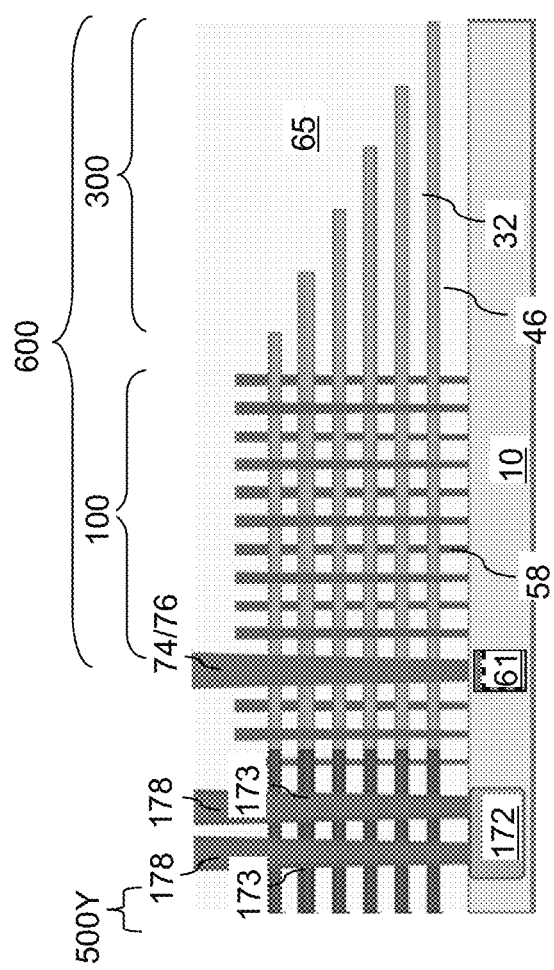
FIG. 31B is another vertical cross-sectional view of the fourth exemplary structure of FIG. 18A.

Referring to FIGS. 31A and 31B, portions of the sacrificial material layers 42 located within each outer edge seal trench 179O can be replaced with electrically conductive layers 46 by performing the processing steps of FIGS. 8-11B that are described above. However, due to the presence of the barrier dielectric spacers 173, the sacrificial material layers 42 are not etched or removed in the edge seal regions 400. Backside trench fill structures (74, 76) are formed through the alternating stacks of insulating layers 32 and electrically conductive layers 46, which the edge seal trench fill structures 178 are formed through alternating stacks of insulating layers 32 and sacrificial material layers 42 by performing the processing steps of FIGS. 12A-12D that are described above.

Figure 32A:
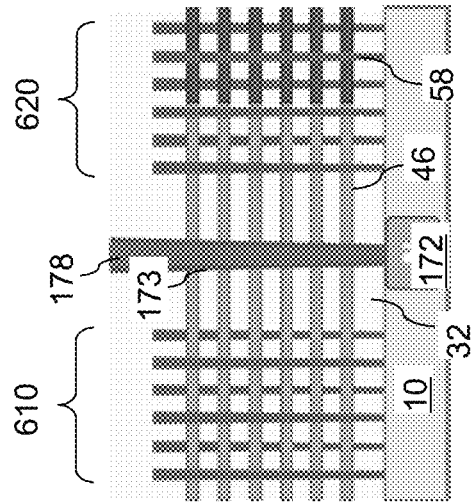
FIG. 32A is a vertical cross-sectional view of a fourth exemplary structure after formation of layer contact via structures according to an embodiment of the present disclosure.
Figure 32B:
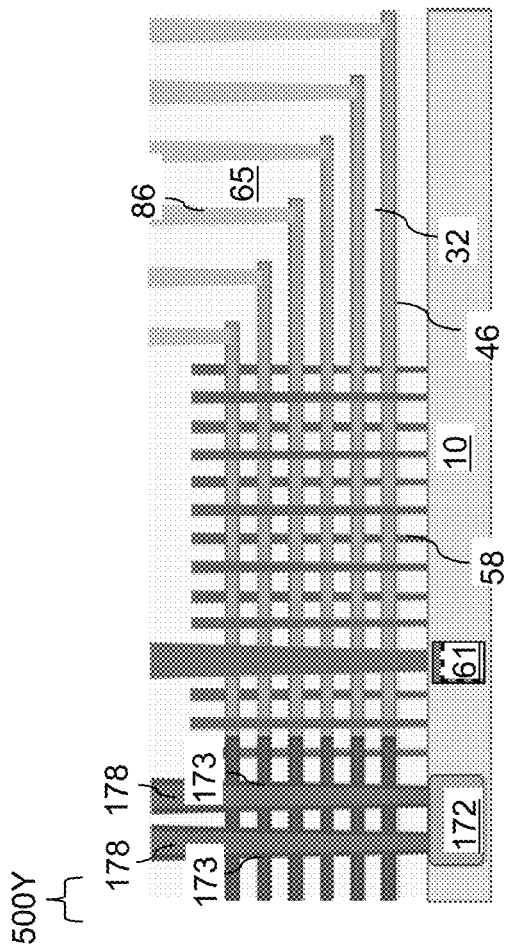
FIG. 32B is another vertical cross-sectional view of the fourth exemplary structure of FIG. 32A.

Referring to FIGS. 32A and 32B, the processing steps of FIGS. 13A and 13B can be performed to form word line contact via structures 86. Drain contact via structures (not shown) may also be formed at this processing step.

Figures 33A, 33B:
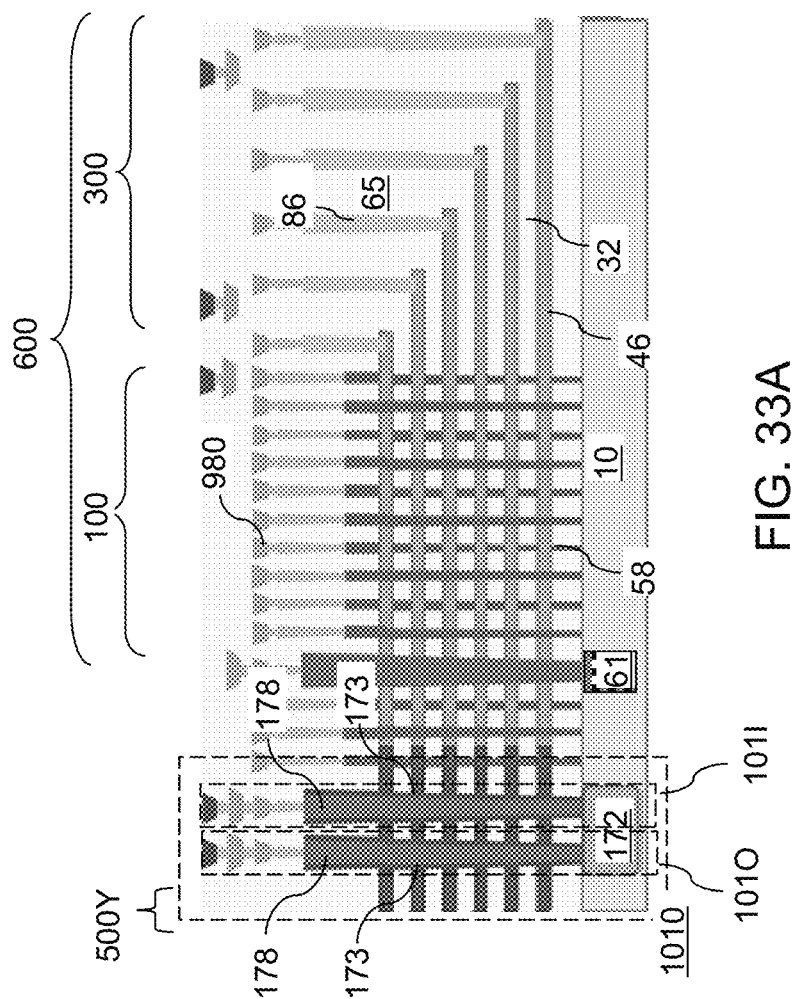
FIG. 33A is a vertical cross-sectional view of a fourth exemplary structure after formation of metal interconnect structures and edge seal structures according to an embodiment of the present disclosure.
FIG. 33B is another vertical cross-sectional view of the fourth exemplary structure of FIG. 33A.
Figure 33C:
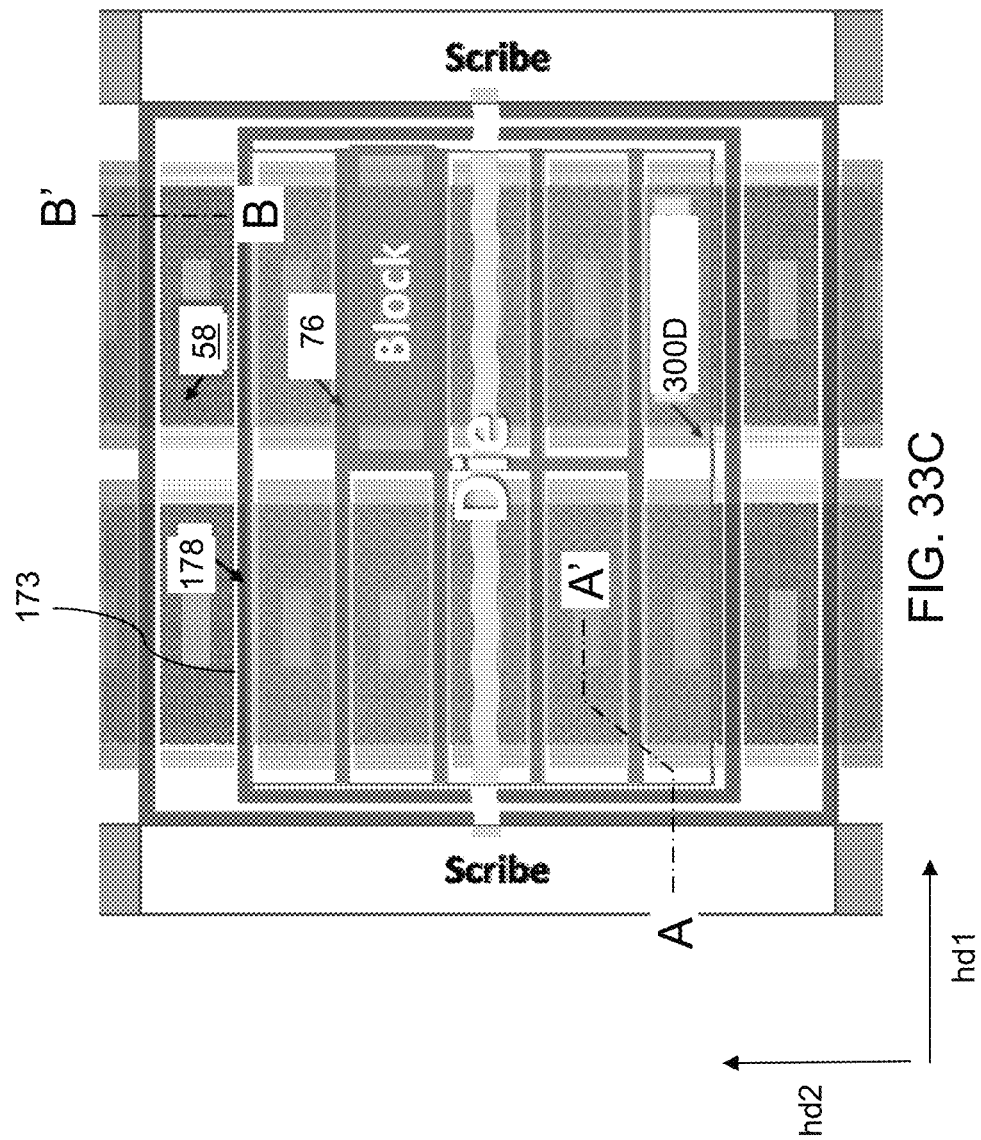
FIG. 33C is a top-down view of a die and surrounding dicing channels at the processing steps of FIGS. 33A and 33B.

Referring to FIGS. 33A-33C, the processing steps of FIGS. 14A-14D can be performed to form interconnect-level dielectric layers 960 and metal interconnect structures 980 over the contact-level dielectric layer 73. The interconnect-level dielectric layers can include multiple levels of dielectric material layers. The metal interconnect structures 980 can include bit lines, metal via structures, metal line structures, and metallic bonding pads. The logic die 1300 can then be bonded to the memory die 1000.

Referring to FIGS. 34A and 34B, a fifth exemplary structure according to a fifth embodiment of the present disclosure can be derived from the first exemplary structure by forming the edge seal trench fill structures 178 at the same time as the word line contact via structures 86, rather than at the same time as the backside contact via structures 76. The fifth exemplary structure illustrated in FIGS. 34A and 34B can be the same as the first exemplary structure illustrated in FIGS. 6A-6D

Referring to FIGS. 35A and 35B, a contact-level dielectric layer 73 and backside trenches 79 can be formed by performing the processing steps of FIGS. 7A-7G. In this embodiment, the edge seal trenches 179 are formed during a later step.

Figure 36A:
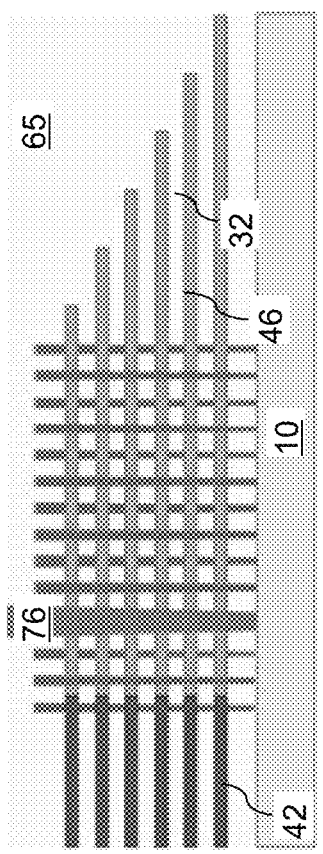
Figure 36B:
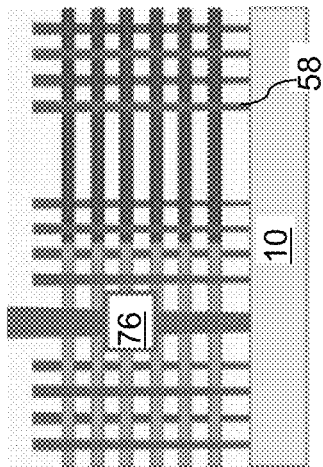

Referring to FIGS. 36A and 36B, portions of the sacrificial material layers 42 located adjacent to the backside trenches are be replaced with electrically conductive layers 46 by performing the processing steps of FIGS. 8-11B that are described above. Backside trench fill structures (74, 76) are formed in the backside trenches 79 through the alternating stacks of insulating layers 32 and electrically conductive layers 46, by performing the processing steps of FIGS. 12A-12D that are described above.

Figure 37A:
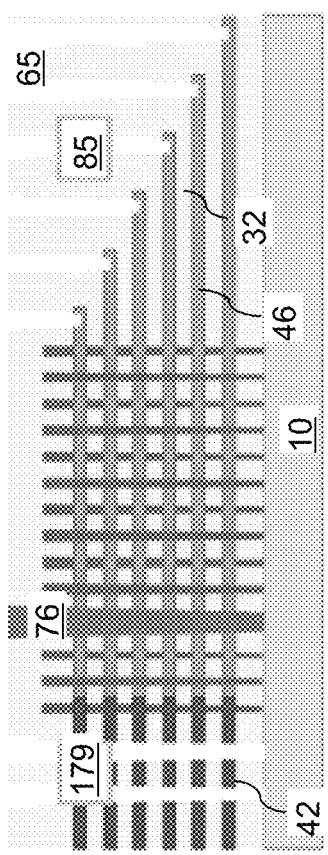
Figure 37B:
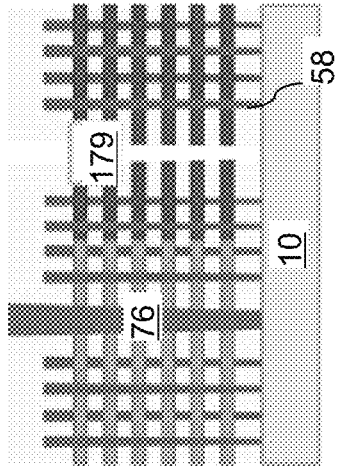

Referring to FIGS. 37A and 37B, word line contact vias 85 and the edge seal trenches 179 are formed during the same etching step. The word line contact vias 85 extend to the electrically conductive layers 46 in the staircase region 300. The edge seal trenches 179 are located in the same location as in the first embodiment.

Figure 38B:
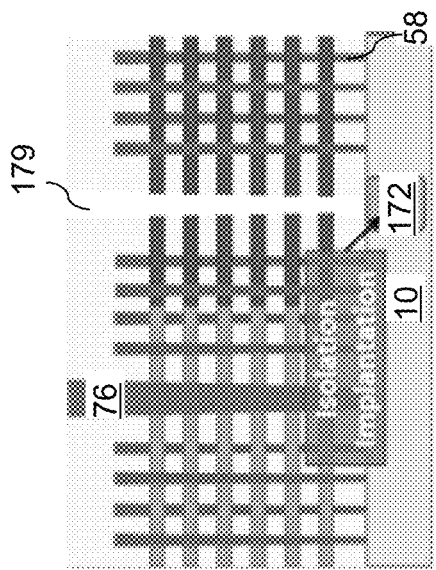
Figure 38A:
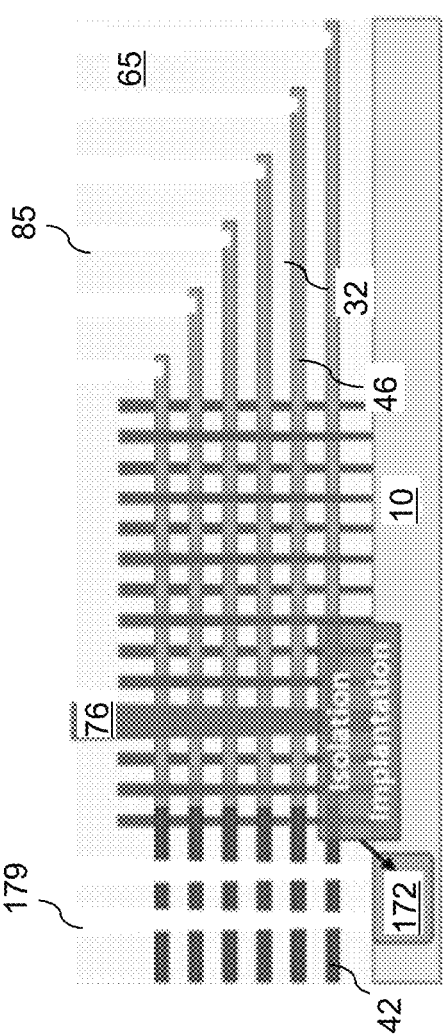

Referring to FIGS. 38A and 38B, dopants of the second conductivity type can be implanted through the edge seal trenches 179 into surface portions of the semiconductor material layer 10 as in the processing steps of FIGS. 12A-12C to form source regions 61 and isolation implantation regions 172.

Figure 39B:
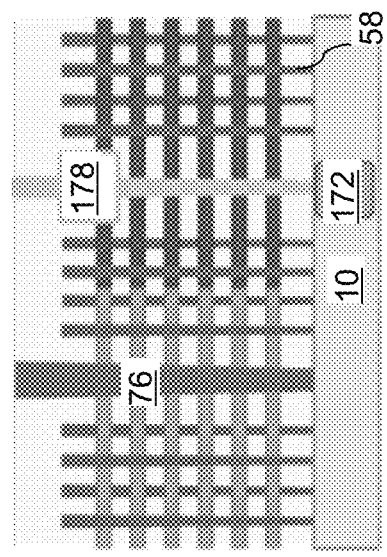
Figure 39A:
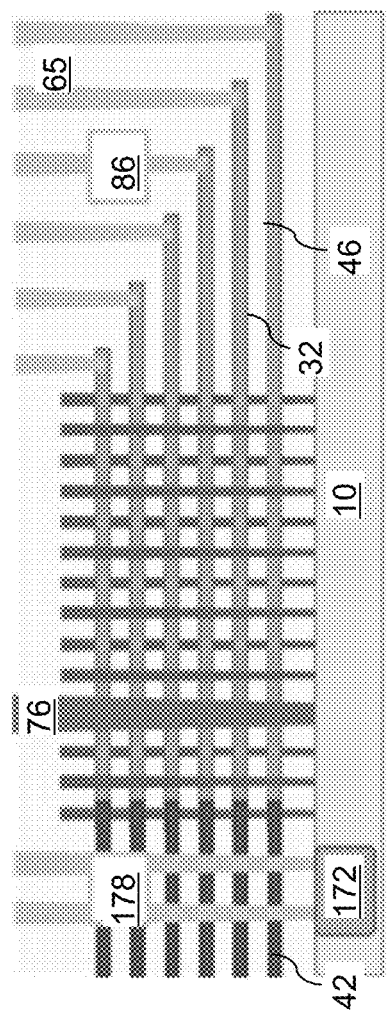

Referring to FIGS. 39A and 39B, the processing steps of FIGS. 13A and 13B can be performed to form word line contact via structures 86 in the word line contact vias 85. The edge seal trench fill structures 178 are formed in the edge seal trenches 179 during the same deposition step as the word line contact via structures 86. Therefore, the word line contact via structures 86 and the edge seal trench fill structures 178 may comprise the same material or materials, such as a metal nitride barrier (e.g., TiN) and tungsten fill.

Figure 40B:
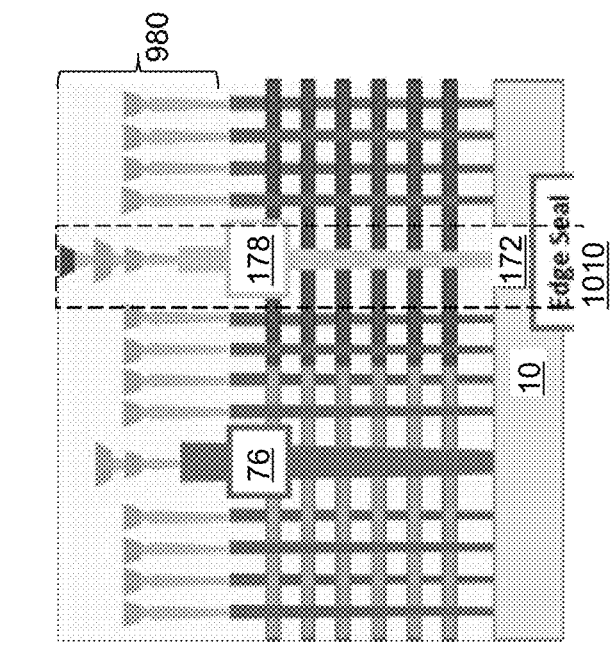
Figure 40A:
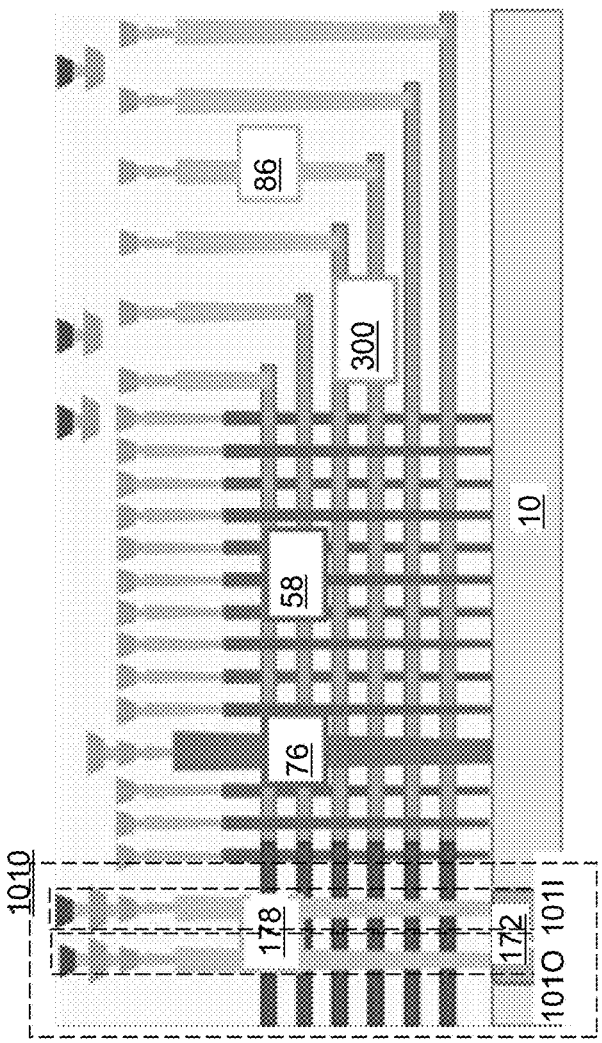

Referring to FIGS. 40A-40B, the processing steps of FIGS. 14A-14D can be performed to form interconnect-level dielectric layers 960 and metal interconnect structures 980 over the contact-level dielectric layer 73. The interconnect-level dielectric layers can include multiple levels of dielectric material layers. The metal interconnect structures 980 can include bit lines, metal via structures, metal line structures, and metallic bonding pads. The logic die 1300 can then be bonded to the memory die 1000.

Similar to the fifth embodiment, the edge seal trench fill structures 178 may be formed at the same time as the word line contact via structures 86, rather than at the same time as the backside contact via structures 76 in the alternative processes of the second and third embodiments. In these alternative processes, the word line contact vias 85 and the edge seal trenches 179 are formed during the same etching step, followed by filling them during the same deposition step with the respective word line contact via structures 86 and edge seal trench fill structures 178.

Figure 41A:
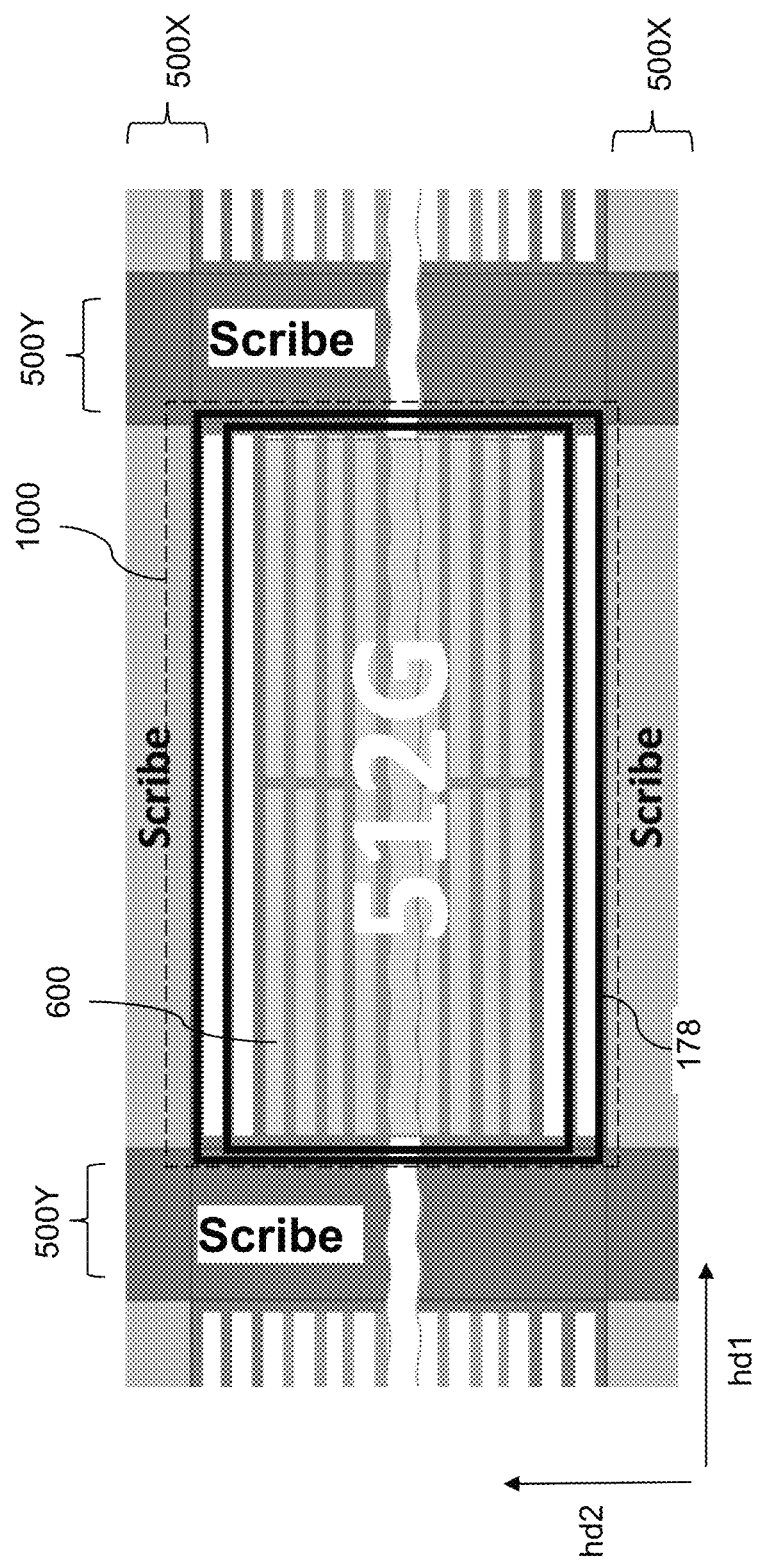
FIG. 41A is a top-down view of a semiconductor die in case the memory capacity of the semiconductor die is selected to be 512 gigabytes.
Figure 41B:
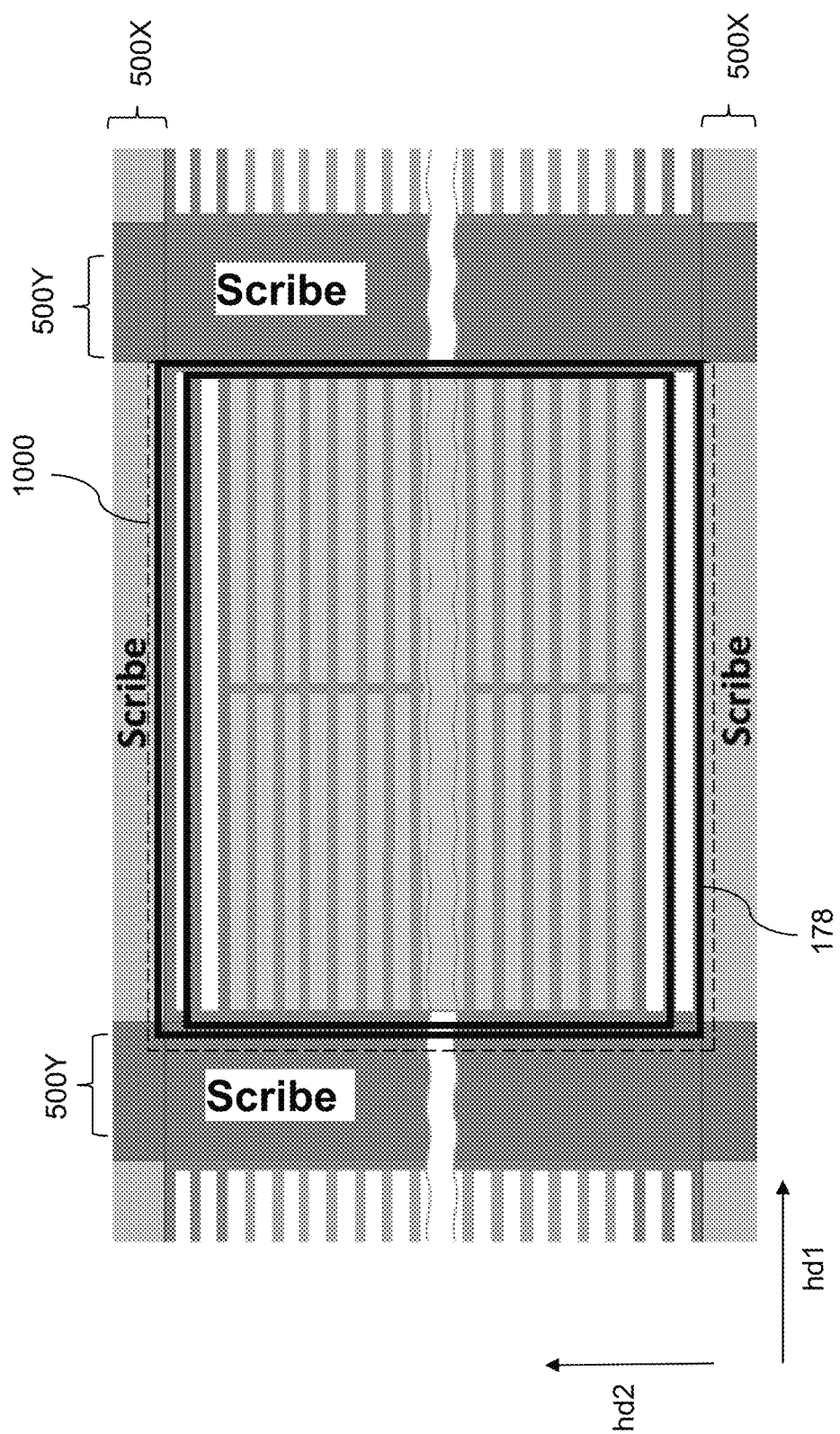
FIG. 41B is a top-down view of a semiconductor die in case the memory capacity of the semiconductor die is selected to be 1 terabytes.

As discussed above, the size and the memory capacity of each semiconductor die 1000 can be selected at any point in time prior to selection of a lithographic mask for patterning the backside trenches 79 and/or the edge seal trenches 179 at the processing steps of FIGS. 7A-7G. FIGS. 41A and 41B illustrate two exemplary configurations of a semiconductor die 1000. FIG. 41A corresponds to a case in which the semiconductor die 1000 is a memory die configured to store 512 GB of data. FIG. 41B corresponds to a case in which the semiconductor die 1000 is a memory die configured to store 1 TB of data. The semiconductor die 1000 illustrated in FIG. 41B can include twice as many number of memory blocks 600 as the semiconductor die 1000 illustrated in FIG. 41A. Likewise, the size and configuration of the logic die 1300 may be selected based on the desired size and memory capacity of the memory die 1000. Thus, once the size and memory capacity of the logic die is selected, a corresponding logic die 1300 is selected for bonding with the memory die 1000.

Figure 42A:
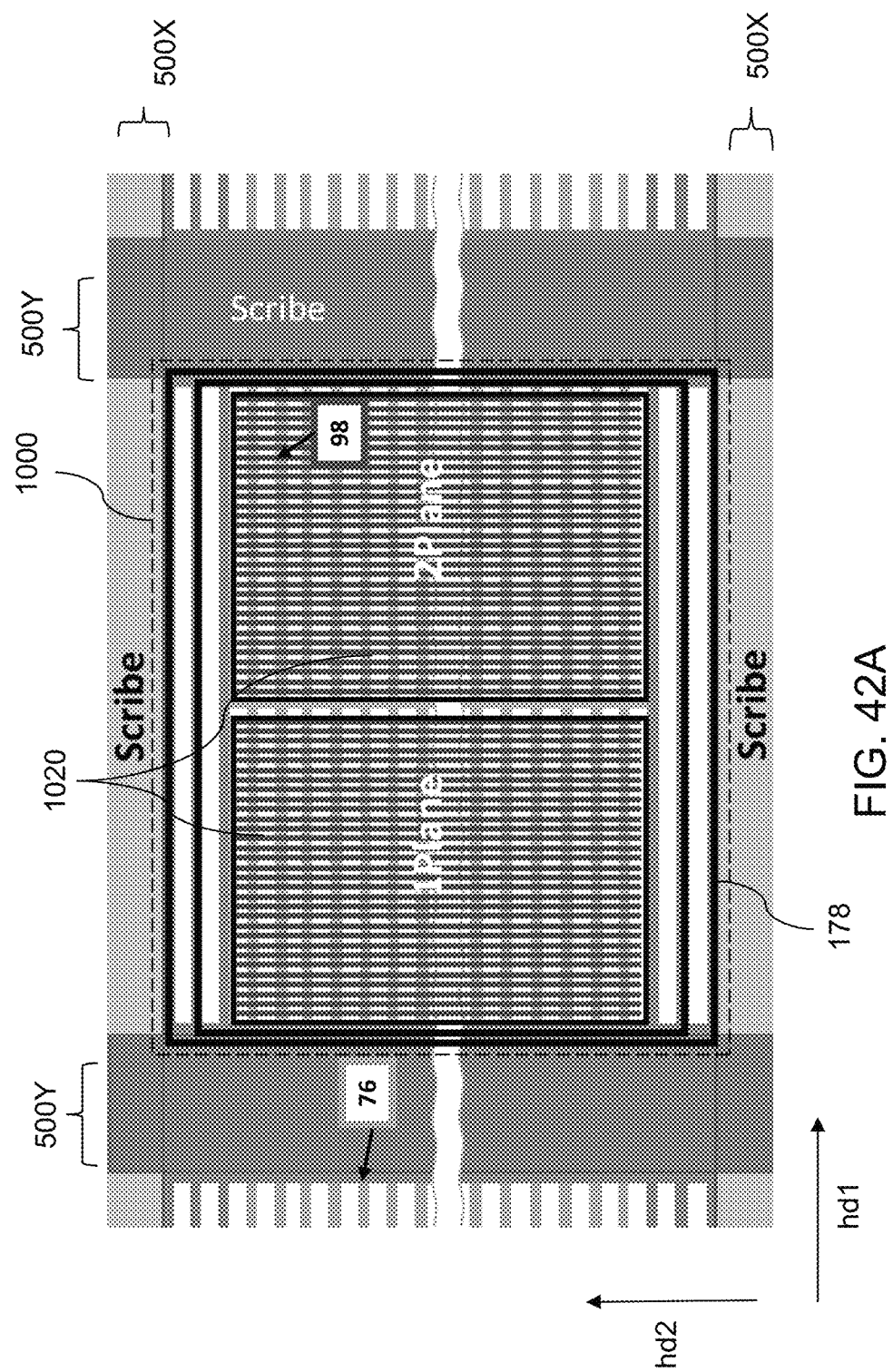
FIG. 42A is a top-down view of a semiconductor die in case the memory die is configured to include two planes.
Figure 42B:
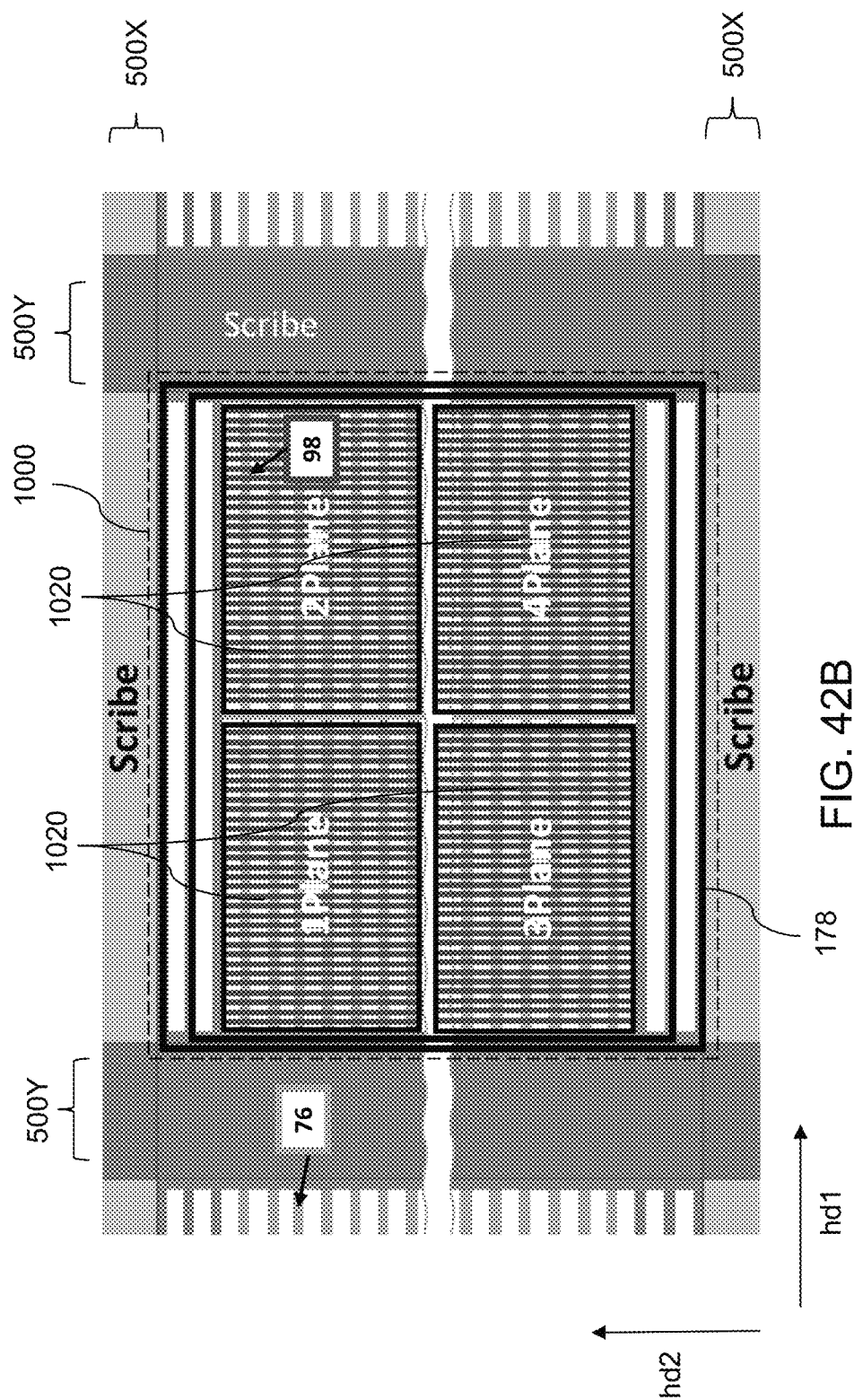
FIG. 42B is a top-down view of a semiconductor die in case the memory die is configured to include four planes.

In one embodiment, the number of memory planes 1020 in each memory die 1000 can be selected at any point in time prior to selection of a lithographic mask for patterning the backside trenches 79 and/or the edge seal trenches 179 at the processing steps of FIGS. 7A-7G. FIGS. 42A and 42B illustrate two exemplary configurations of a memory die 1000. FIG. 42A corresponds to a case in which the memory die 1000 includes two memory planes 1020, and the bit lines 98 extend the entire width of the memory die 1000 in the second horizontal direction hd2. FIG. 42B corresponds to a case in which the memory die 1000 includes four memory planes 1020. In this embodiment, each bit lines 98 extend only part of the width of the memory die 1000 in the second horizontal direction hd2. In other words, the bit lines 98 extend only in each respective memory plane 1020 and do not extend into adjacent memory planes 1020. The memory die 1000 illustrated in FIG. 42B can include twice as many memory planes 1020 as the memory die 1000 illustrated in FIG. 42A, and may include twice as many memory blocks 600 as the memory die 1000 illustrated in FIG. 41A.

Referring to all drawings and according to various embodiments of the present disclosure, a semiconductor die is provided, which comprises: a plurality of alternating stacks of insulating layers 32 and electrically conductive layers 46 that are laterally separated from each other by first backside trenches 79 that laterally extend along a first horizontal direction hd1, an array of memory stack structures 55 vertically extending through each of the plurality of alternating sacks (32, 46), an inner edge seal structure 101I that continuously laterally surrounds the plurality of alternating stacks (32, 46), an outer edge seal structure 101O that continuously laterally surrounds the inner edge seal structure 101I, and additional alternating stacks of insulating layers 32 and electrically conductive layers 46 (which can be located in a dummy memory block 610 and/or 630) located between the inner edge seal structure 101I and the outer edge seal structure 101O.

In the first through fourth embodiments, first backside trench fill structures (74, 76) can be located within a respective one of the first backside trenches 79, and each of the first backside trench fill structures (74, 76), the inner edge seal structure 101I, and the outer edge seal structure 101O comprises a same set of at least one trench fill material. In one embodiment, the at least one trench fill material comprises: an insulating spacer material located at a peripheral region of each of the first backside trench fill structures (74, 76), the inner edge seal structure 101I, and the outer edge seal structure 101O (which is the material of the backside insulating spacers 74 and the edge seal trench insulating spacers 174), and a conductive fill material (which can be the material of the backside contact via structures 76 and the edge seal contact via structures 176) embedded within the insulating spacer material and contacting a top surface of the substrate (9, 10).

In the fifth embodiment, word line contact via structures 86 contact the electrically conductive layers 46 in a staircase region 300, wherein each of the word line contact via structures 86, the inner edge seal structure 101I, and the outer edge seal structure 101O comprises a same set of at least one electrically conductive material.

In one embodiment, additional arrays of memory stack structures 55 vertically extend through the additional alternating stacks of insulating layers 32 and electrically conductive layers 46. The additional arrays of memory stack structures 55 can be electrically inactive.

In one embodiment, each memory stack structure 55 located within the arrays of memory stack structures 55 extending through the plurality of alternating stacks (32, 46) and within the additional arrays of memory stack structures 55 comprises a vertical semiconductor channel 60, and a memory film 50. The memory film 50 comprises a tunneling dielectric 56 contacting the vertical semiconductor channel 60, and a charge storage layer 54 contacting the tunneling dielectric 56.

In one embodiment, a combination of each alternating stack (32, 46) and the memory stack structures 55 extending through each alternating stack comprises a memory block 600, and a combination of each of the additional alternating stack (32, 46) and the memory stack structures 55 extending through each additional alternating stack comprises a dummy memory block (610, 630). In one embodiment, scribe area memory block 620 includes a dicing area alternating stack (32, 46) and memory stack structures 55 which are located in a scribe area 500X through which the semiconductor die 1000 is diced.

In one embodiment, each of the inner edge seal structure 101I and the outer edge seal structure 101O comprises a respective vertical stack of metal interconnect structures 980 that continuously extends from a top surface of the substrate (9, 10) to a topmost surface of interconnect-level dielectric material layers 960 (which may be within a horizontal plane including a surface of metallic bonding pads). In one embodiment, the respective vertical stack of metal interconnect structures 980 comprises at least two metallic via structures and at least two metallic line structures. Each of the at least two metallic via structures and at least two metallic line structures continuously extends around an entire area of the plurality of alternating stacks (32, 46). In another embodiment, the semiconductor die 1000 is bonded to a logic die 1300 containing driver circuit devices 1302, such as transistors in a CMOS configuration.

In one embodiment, the inner edge seal structure 101I comprises pair of first inner edge seal segments that are parallel to the first horizontal direction hd1 and a pair of second inner edge seal segments that are perpendicular to the first horizontal direction hd1. The outer edge seal structure 101O comprises a pair of first outer edge seal segments that are parallel to the first horizontal direction and a pair of second outer edge seal segments that are perpendicular to the first horizontal direction. The additional alternating stacks of insulating layers and electrically conductive layers are located between a neighboring pair of a respective one of the first inner edge seal segments and a respective one of the first outer edge seal segments, and each of the additional alternating stacks of insulating layers and electrically conductive layers contacts sidewalls of a neighboring pair of a respective one of the first inner edge seal segments and the respective one of the second inner edge seal segments.

In one embodiment, second backside trenches 79 may laterally extend along a second horizontal direction hd2 that is perpendicular to the first horizontal direction hd1, and may be laterally offset inward from the second inner edge seal segments toward a geometrical center of the semiconductor die 100, and may contact a respective subset of the plurality of alternating stacks (32, 46). A retro-stepped dielectric material portions 65 may overlie stepped surfaces of a respective subset of the plurality of alternating stacks (32, 46). The second inner edge seal segments may contact a sidewall of a respective one of the retro-stepped dielectric material portions 65.

The inner and outer edge seal structures (101I, 101O) may extend through the alternating stacks (32, 46), as in the first and fifth embodiments, or may be located adjacent to staircase regions 300 of the alternating stacks in which word line contact via structures 86 contact the electrically conductive layers 46, as in the second embodiment, or may be located adjacent to a dummy staircase regions 300D of the alternating stacks (32, 46) as in the third embodiment.

The various embodiments of the present disclosure may provide faster manufacture of semiconductor dies 1000. For example, the semiconductor dies 1000 may be manufactured up to the processing steps of FIGS. 6A-6D prior to confirmation of an order for semiconductor dies 1000 with a specific memory capacity requirement. Once the requirement for the memory capacity for semiconductor dies 1000 is known, the rest of the processing steps can be performed to complete manufacture of the semiconductor dies 1000 by changing the mask layout for the edge seal structures 1010, thereby effectively reducing the turnaround time for manufacture of semiconductor dies 1000.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor die comprising:
   a plurality of alternating stacks of insulating layers and electrically conductive layers that are laterally separated from each other by first backside trenches that laterally extend along a first horizontal direction;
   an array of memory stack structures vertically extending through each of the plurality of alternating stacks;
   an inner edge seal structure that continuously laterally surrounds the plurality of alternating stacks;
   an outer edge seal structure that continuously laterally surrounds the inner edge seal structure; and
   additional alternating stacks of insulating layers and electrically conductive layers located between the inner edge seal structure and the outer edge seal structure.

2. The semiconductor die of claim 1, further comprising first backside trench fill structures located within a respective one of the first backside trenches, wherein each of the first backside trench fill structures, the inner edge seal structure, and the outer edge seal structure comprises a same set of at least one trench fill material.

3. The semiconductor die of claim 2, wherein the at least one trench fill material comprises:
   an insulating spacer material located at a peripheral region of each of the first backside trench fill structures, the inner edge seal structure, and the outer edge seal structure; and
   a conductive fill material embedded within the insulating spacer material and contacting a top surface of a substrate.

4. The semiconductor die of claim 1, further comprising word line contact via structures contacting the electrically conductive layers in a staircase region, wherein each of the word line contact via structures, the inner edge seal structure, and the outer edge seal structure comprises a same set of at least one electrically conductive material.

5. The semiconductor die of claim 1, wherein additional arrays of memory stack structures vertically extend through the additional alternating stacks of insulating layers and electrically conductive layers.

6. The semiconductor die of claim 5, wherein each memory stack structure that is located within the arrays of memory stack structures and within the additional arrays of memory stack structures comprises a vertical semiconductor channel and a memory film.

7. The semiconductor die of claim 6, wherein the memory film comprises a tunneling dielectric contacting the vertical semiconductor channel, and charge storage layer contacting the tunneling dielectric.

8. The semiconductor die of claim 1, wherein:
   a combination of each alternating stack and the memory stack structures extending through each alternating stack comprises a memory block; and
   a combination of each of the additional alternating stack and the memory stack structures extending through each additional alternating stack comprises a dummy memory block.

9. The semiconductor die of claim 8, further comprising a scribe area memory block comprising a dicing area alternating stack and memory stack structures which are located in a scribe area through which the semiconductor die is diced.

10. The semiconductor die of claim 1, wherein:
    each of the inner edge seal structure and the outer edge seal structure comprises a respective vertical stack of metal interconnect structures that continuously extends from a top surface of a substrate to a topmost surface of interconnect-level dielectric material layers; and
    the respective vertical stack of metal interconnect structures comprises a bonding pad, at least two metallic via structures and at least two metallic line structures, wherein each of the at least two metallic via structures and at least two metallic line structures continuously extends around an entire area of the plurality of alternating stacks.

11. The semiconductor die of claim 10, wherein the semiconductor die is bonded to a logic die containing driver circuit devices.

12. The semiconductor die of claim 1, wherein:
    the inner edge seal structure comprises pair of first inner edge seal segments that are parallel to the first horizontal direction and a pair of second inner edge seal segments that are perpendicular to the first horizontal direction;
    the outer edge seal structure comprises a pair of first outer edge seal segments that are parallel to the first horizontal direction and a pair of second outer edge seal segments that are perpendicular to the first horizontal direction;
    the additional alternating stacks of insulating layers and electrically conductive layers are located between a neighboring pair of a respective one of the first inner edge seal segments and a respective one of the first outer edge seal segments; and
    each of the additional alternating stacks of insulating layers and electrically conductive layers contacts sidewalls of a neighboring pair of a respective one of the first inner edge seal segments and the respective one of the second inner edge seal segments.

13. The semiconductor die of claim 12, further comprising:
    second backside trenches that laterally extend along a second horizontal direction that is perpendicular to the first horizontal direction, are laterally offset inward from the second inner edge seal segments toward a geometrical center of the semiconductor die, and contact a respective subset of the plurality of alternating stacks; and retro-stepped dielectric material portions that overlie stepped surfaces of a respective subset of the plurality of alternating stacks, wherein the second inner edge seal segments contacts a sidewall of a respective one of the retro-stepped dielectric material portions.

14. The semiconductor die of claim 1, wherein the inner and outer edge seal structures extend through the alternating stacks, are located adjacent to staircase regions of the alternating stacks in which word line contact via structures contact the electrically conductive layers, or are located adjacent to a dummy staircase regions of the alternating stacks.

15. A method of forming a semiconductor structure, comprising:
    providing a plurality of alternating stacks of insulating layers and electrically conductive layers that contain respective staircase regions, and an array of memory stack structures vertically extending through each of the plurality of alternating stacks;
    forming an insulating material over the staircase region;
    etching word line contact vias through the insulating material and etching an inner edge seal trench and an outer edge seal trench around the alternating stacks during a same etch step; and
    depositing at least one fill material in the word line contact vias, the inner edge seal trench and the outer edge seal trench during a same deposition step, to form respective word line contact via structures contacting the electrically conductive layers in the staircase region, an inner edge seal structure that continuously laterally surrounds the plurality of alternating stacks, and an outer edge seal structure that continuously laterally surrounds both the inner edge seal structure and additional alternating stacks of insulating layers and electrically conductive layers located between the inner edge seal structure and the outer edge seal structure.

\* \* \* \* \*